(12) United States Patent
Dupenloup

(10) Patent No.: US 6,289,498 B1
(45) Date of Patent: Sep. 11, 2001

(54) VDHL/VERILOG EXPERTISE AND GATE SYNTHESIS AUTOMATION SYSTEM

(75) Inventor: Guy Dupenloup, Marly-le-Roi (FR)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/027,422

(22) Filed: Feb. 20, 1998

(51) Int. Cl.[7] .................................................. G06F 17/50
(52) U.S. Cl. .............................................................. 716/18
(58) Field of Search .................. 395/500.02, 500.19, 395/500.04; 716/1, 3, 18

(56) References Cited

U.S. PATENT DOCUMENTS

| | | |
|---|---|---|
| 5,210,700 | 5/1993 | Tom . |
| 5,493,508 | 2/1996 | Dangelo et al. . |
| 5,526,277 * | 6/1996 | Dangelo et al. ............... 364/482 |
| 5,544,066 | 8/1996 | Rostoker et al. . |
| 5,544,067 | 8/1996 | Rostoker et al. . |
| 5,557,531 | 9/1996 | Rostoker et al. . |
| 5,572,437 | 11/1996 | Rostoker et al. . |
| 5,740,347 | 4/1998 | Avidan . |
| 5,790,435 | 8/1998 | Lewis et al. . |
| 5,801,958 | 9/1998 | Dangelo et al. . |
| 5,812,416 * | 9/1998 | Gupte et al. ..................... 364/490 |
| 5,854,752 | 12/1998 | Agarwal . |
| 5,867,395 | 2/1999 | Watkins . |
| 5,870,308 | 2/1999 | Dangelo . |
| 5,880,971 | 3/1999 | Dangelo et al. . |
| 5,903,475 | 5/1999 | Gupte et al. . |
| 5,956,256 | 9/1999 | Rezek et al. . |

* cited by examiner

Primary Examiner—Matthew Smith
Assistant Examiner—Leigh Marie Garbowski
(74) Attorney, Agent, or Firm—Mitchell, Silberberg & Knupp LLP

(57) ABSTRACT

A method of fabricating an integrated circuit chip (IC), said method comprising the steps of defining the IC at the RTL code level, translating said RTL code into a generic netlist description, generating logic synthesis tool scripts based on said generic netlist description, and executing said logic synthesis tool scripts to synthesize the RTL code. The step of generating logic synthesis tool scripts comprises the substeps of identifying hardware elements and structure of the IC design, determining interrelationships between said identified hardware elements and structures, and generating logic synthesis tool scripts to synthesize said identified hardware elements to netlists as a function of said hardware elements and said interrelationships.

12 Claims, 38 Drawing Sheets

Microfiche Appendix Included
(2 Microfiche, 150 Pages)

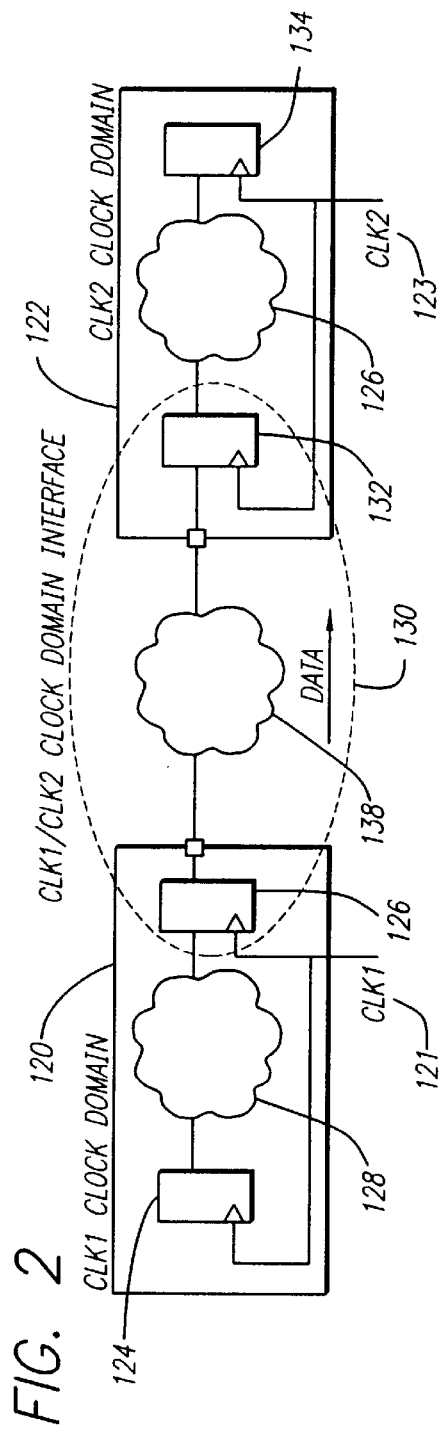
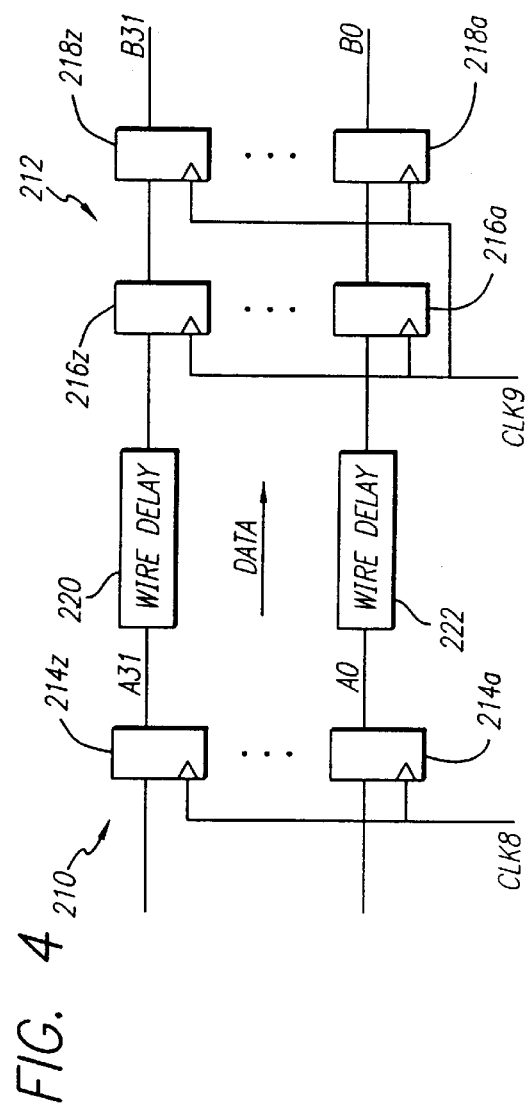
FIG. 2
FIG. 4

ASYNCHRONOUS CLOCK DOMAINS

RELATED CLOCK DOMAINS WITH COINCIDENT CLOCK EDGES

RELATED CLOCK DOMAINS WITH SEQUENCED CLOCK EDGES

FIG. 5
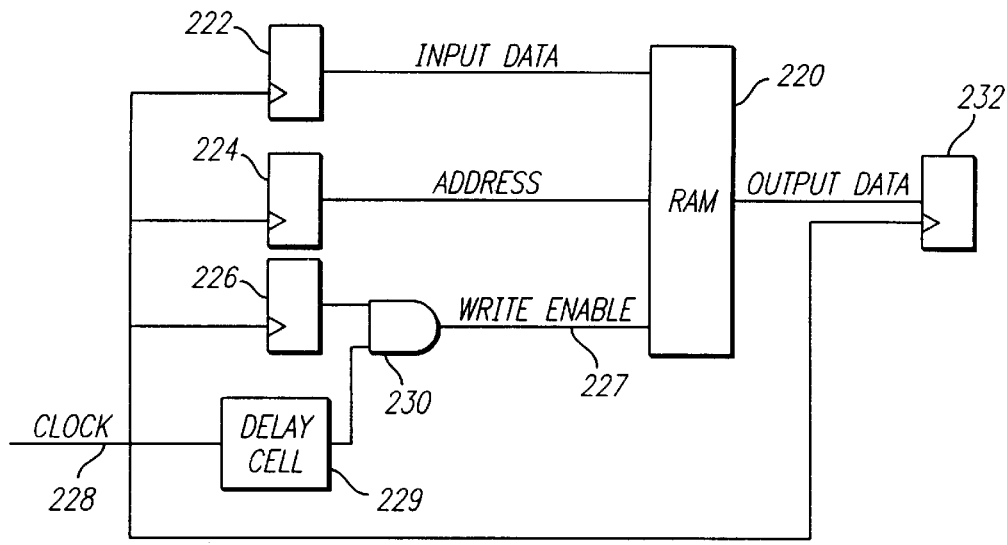
FIG. 6
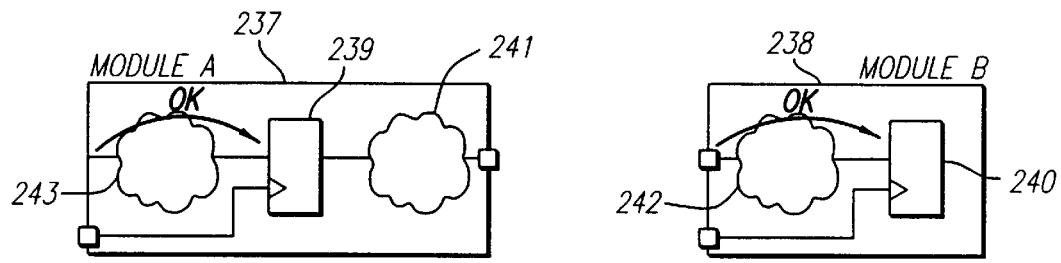
1. EXPLORATORY SYNTHESIS ON INDIVIDUAL MODULES MEETS CLOCK CONSTRAINTS.
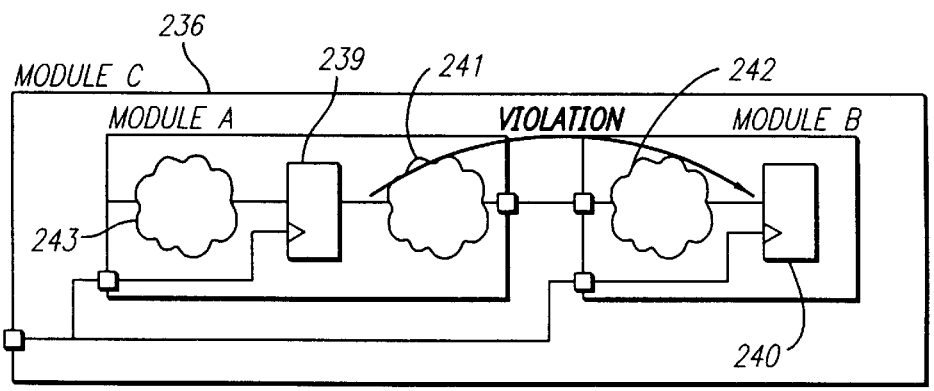
2. VIOLATING PATHS SHOW UP WHEN MODULES ARE PUT TOGETHER.

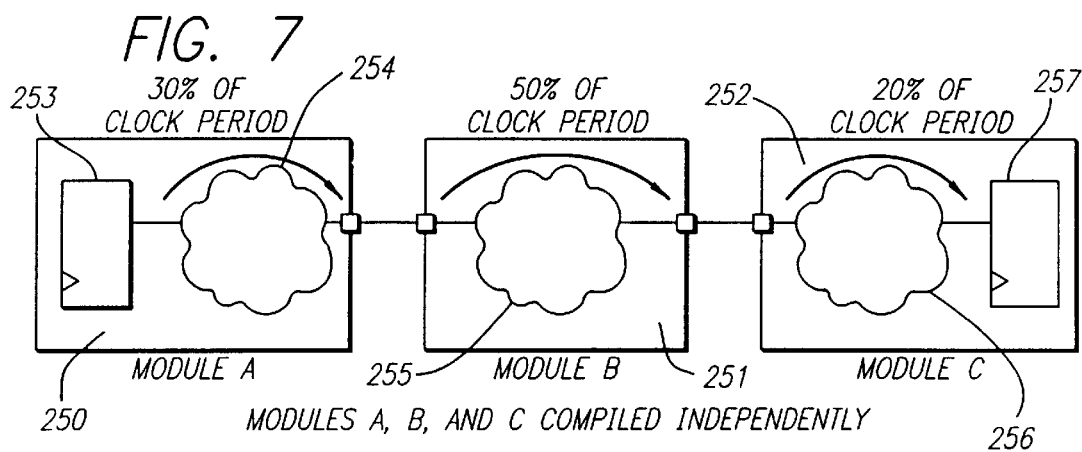
FIG. 7 — MODULES A, B, AND C COMPILED INDEPENDENTLY
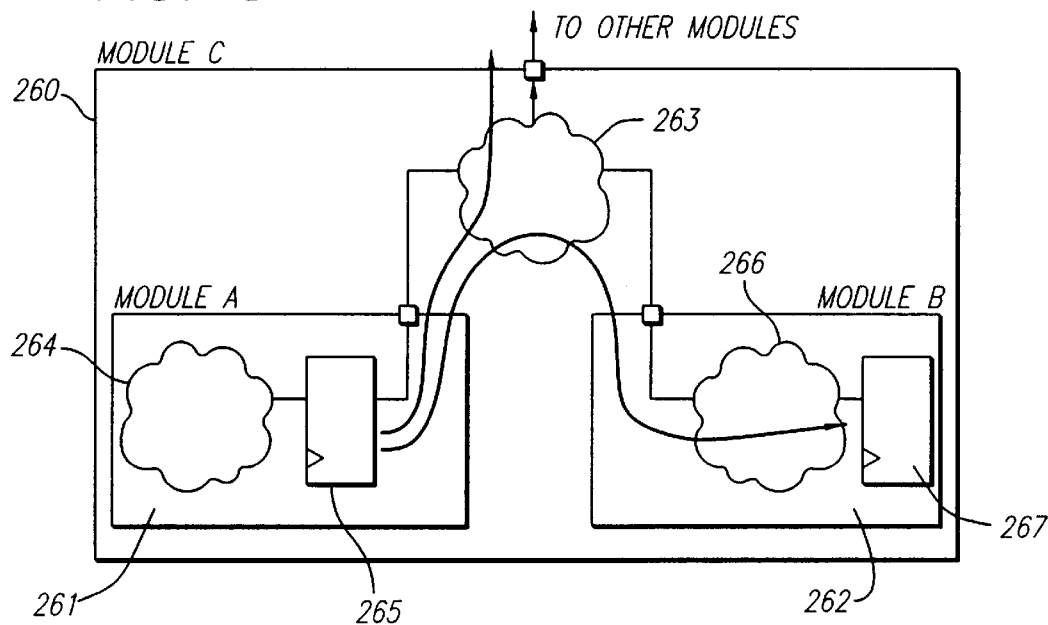
FIG. 8
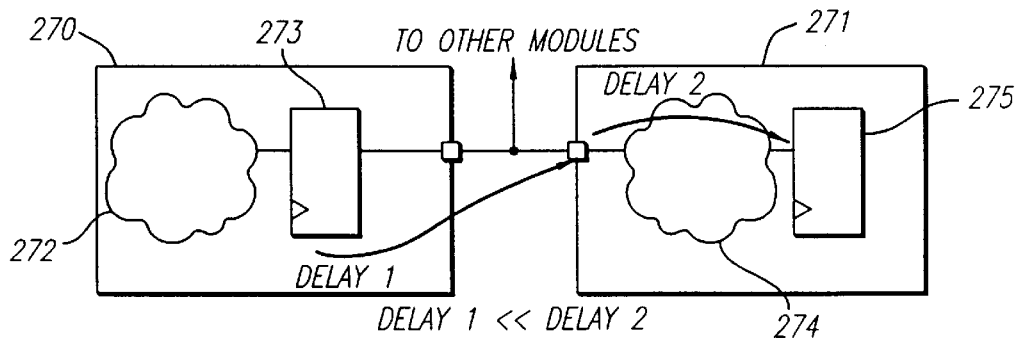
FIG. 9 — DELAY 1 << DELAY 2

WITH NO COMBINATIONAL LOGIC IN RAM'S SHADOW

SPECIFIC LOGIC ADDED TO ISOLATE RAM IN SCAN MODE
WITH COMBINATIONAL LOGIC IN RAM'S SHADOW

BOTTOM-UP SYNTHESIS

STEP #1: LEAF MODULES A, B, AND C ARE SYNTHESIZED.

STEP #2: MODULE D IS SYNTHESIZED WITH MODULES A AND B MADE NON-MODIFIABLE (DONT-TOUCH ATTRIBUTES).

STEP #3: MODULE TOP IS SYNTHESIZED WITH MODULES C AND D MADE NON-MODIFIABLE.

CHARACTERIZATION

DEFAULT CONSTRAINTS USED
FOR INITIAL MAPPING

FIG. 16
TOP-DOWN CHARACTERIZATION
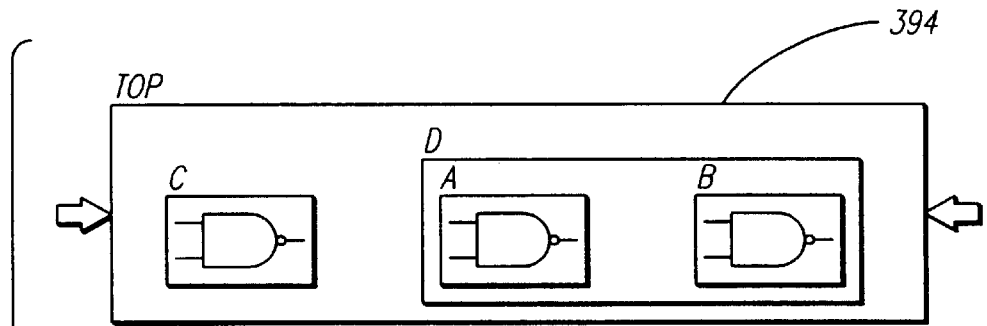
STEP #1: CONSTRAINTS ARE SET ON TOP-LEVEL MODULE (OPERATING CONDITIONS, CLOCK DEFINITIONS, ECT).
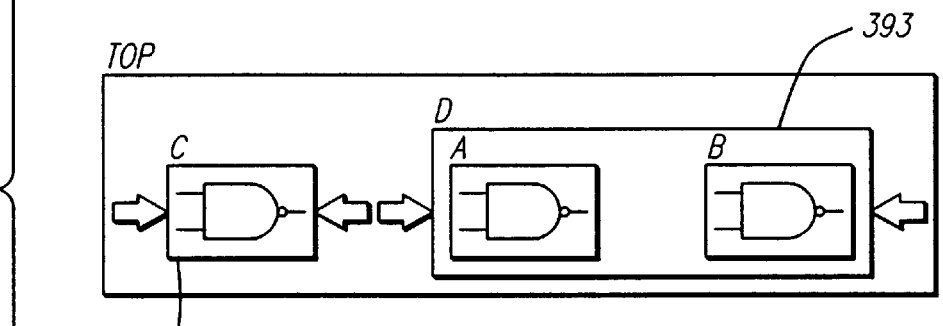
STEP #2: CONSTRAINTS ARE DERIVED ON MODULES C AND D.
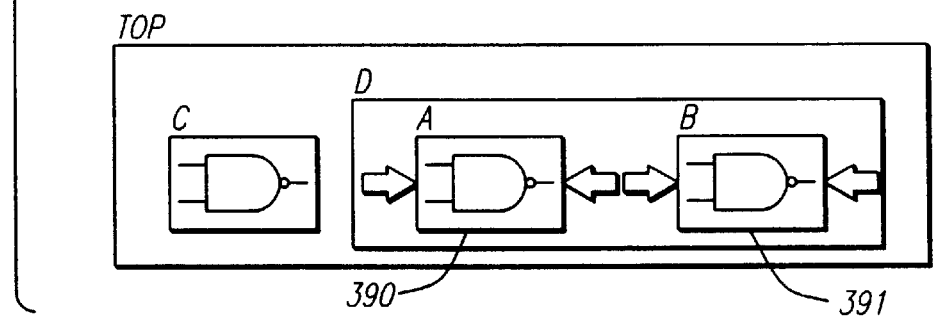
STEP #3: CONSTRAINTS ARE DERIVED ON LEAF MODULES A AND B.

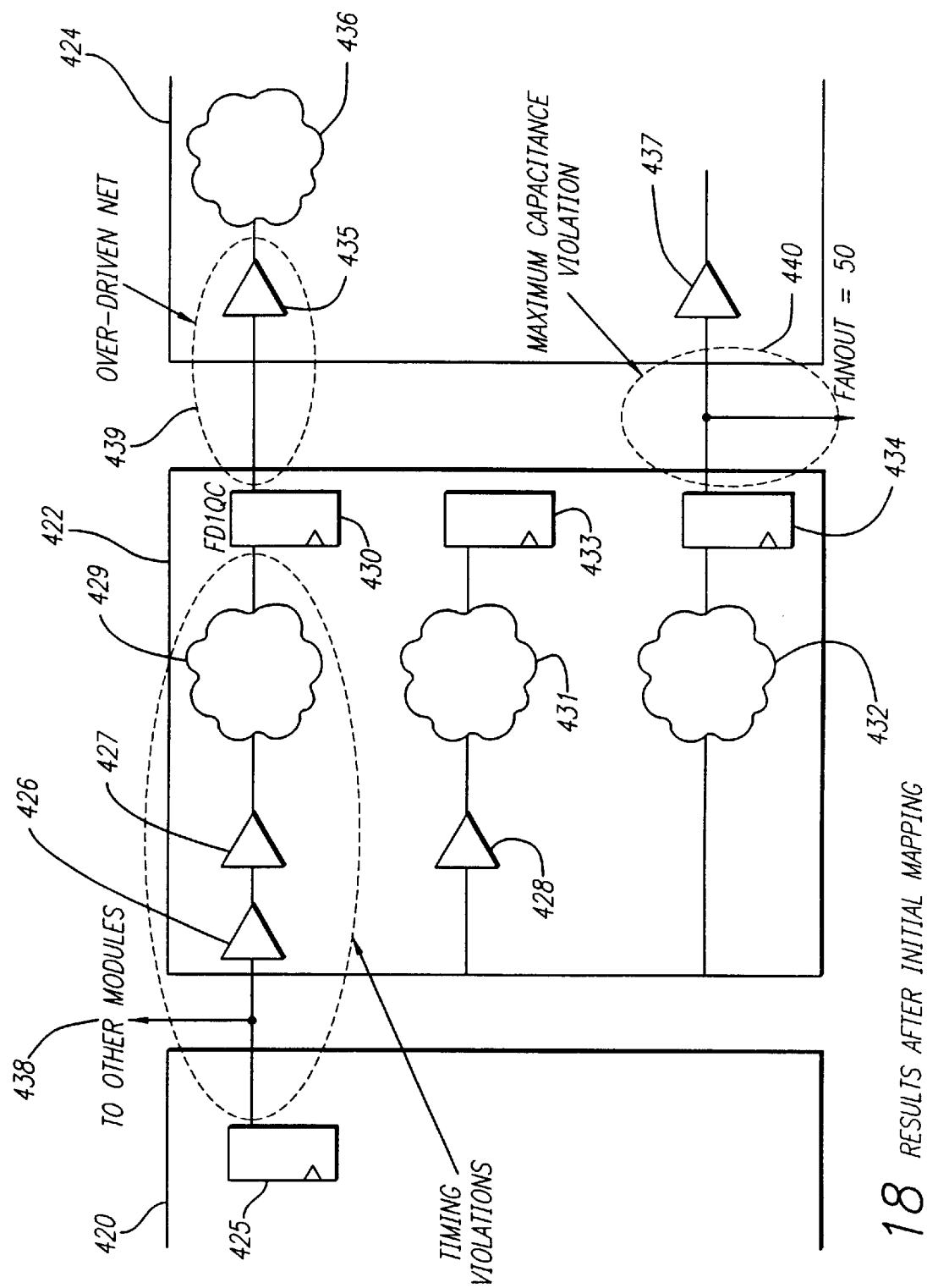
FIG. 18 RESULTS AFTER INITIAL MAPPING

SYNTHESIS PROCESS

MODULES A, B, AND C SYNTHESIZED INDEPENDENTLY FROM EACH OTHER

IN THE ABSENCE OF BROKEN TIMING PATHS

DELAY 1 << DELAY 2

TIME BUDGETS

MODULES A, B, AND C SYNTHESIZED INDEPENDENTLY FROM EACH OTHER

AUTOMATIC SCRIPT GENERATION

FIG. 22
HIERARCHY UNGROUPING
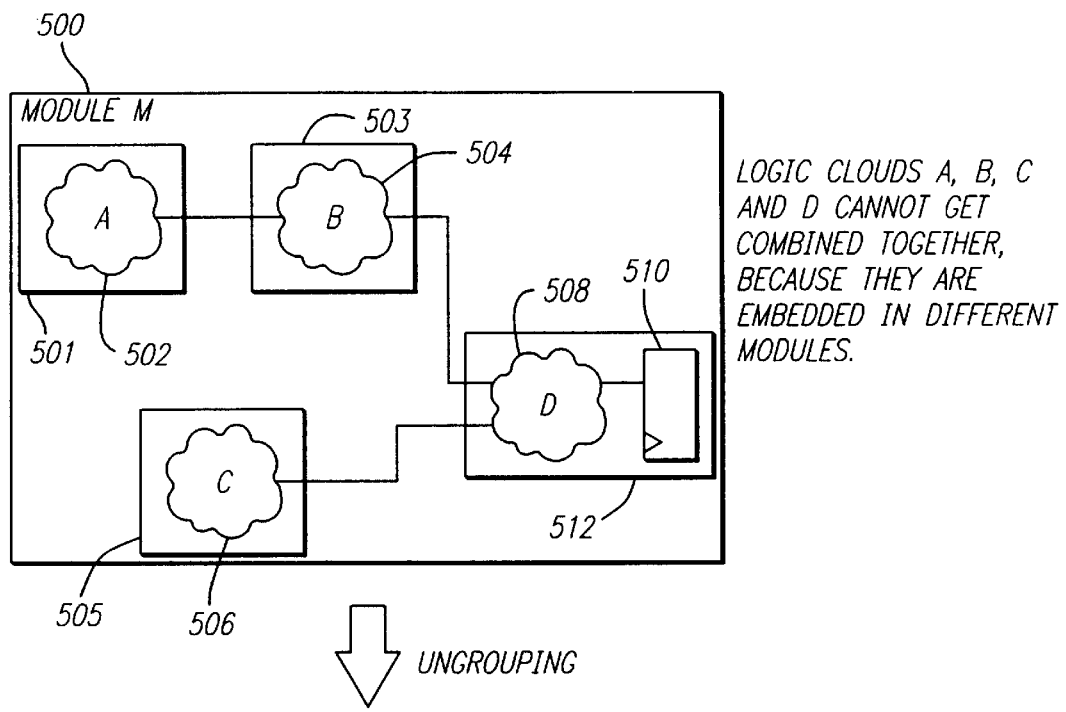
LOGIC CLOUDS A, B, C AND D CANNOT GET COMBINED TOGETHER, BECAUSE THEY ARE EMBEDDED IN DIFFERENT MODULES.
UNGROUPING
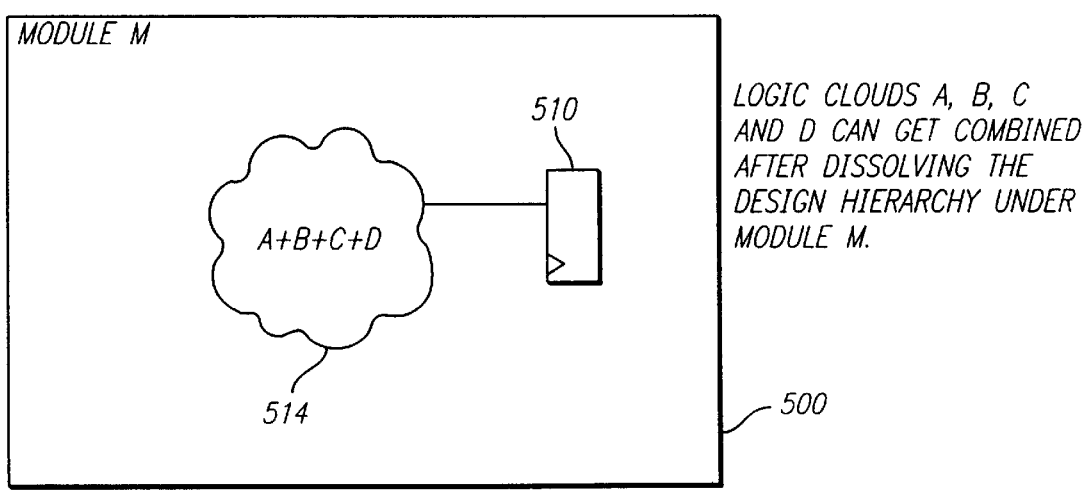
LOGIC CLOUDS A, B, C AND D CAN GET COMBINED AFTER DISSOLVING THE DESIGN HIERARCHY UNDER MODULE M.

SUPPORT FOR DESIGN
HIERARCHY RE-ARRANGEMENT

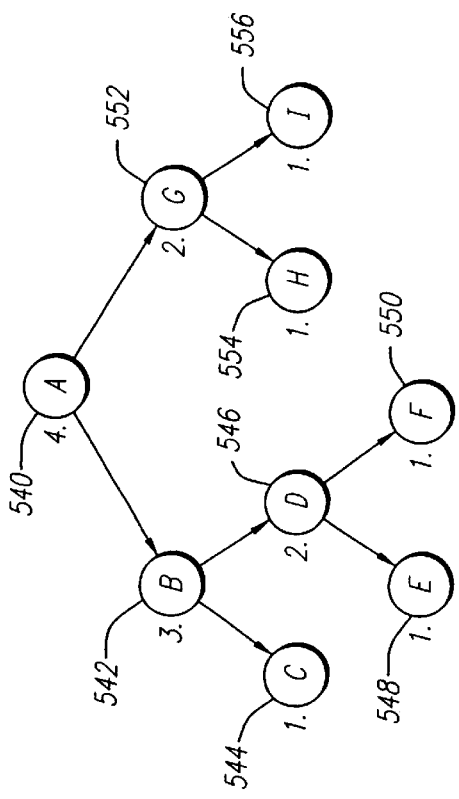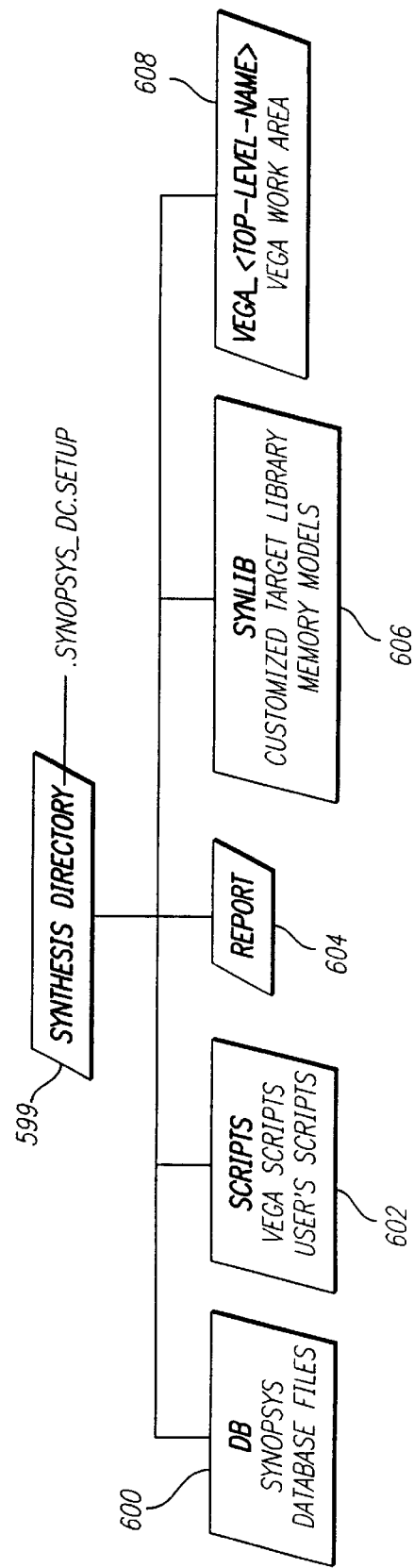

SCRIPT FLOW IMPLEMENTED BY VEGA

EXAMPLE OF RTL CODE AND EQUIVALENT HARDWARE VIEW FOR RTL ANALYSIS.

LOGIC SYNTHESIS PROCESS

```
PROCESS (REST_N, CLK)
BEGIN
  IF (RESET_N = '0' ) THEN
    Q1 <= '0' ;
  ELSIF CLK' EVENT AND (CLK = '1') THEN
    Q1 <= D1;
    Q2 <= D2;
  ENDIF;
END PROCESS;
```

VHDL CODE FOR A 2-BIT REGISTER WITH PARTIAL ASYNCHRONOUS RESET

IMPLEMENTATION CREATED BY
SYNOPSYS DESIGN COMPILER

IMPLEMENTATION CREATED BY
AMIBIT BUILDGATES

RTL CODE

SYNOPSYS DESIGN COMPILER VIEW OF THE RTL CODE

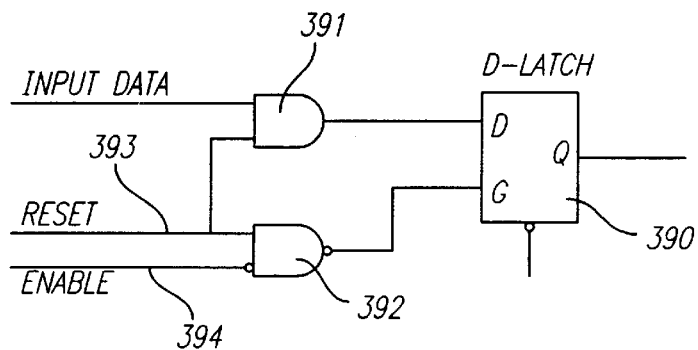
FIG. 37 FAILING IMPLEMENTATION OF A LATCH WITH CLEAR
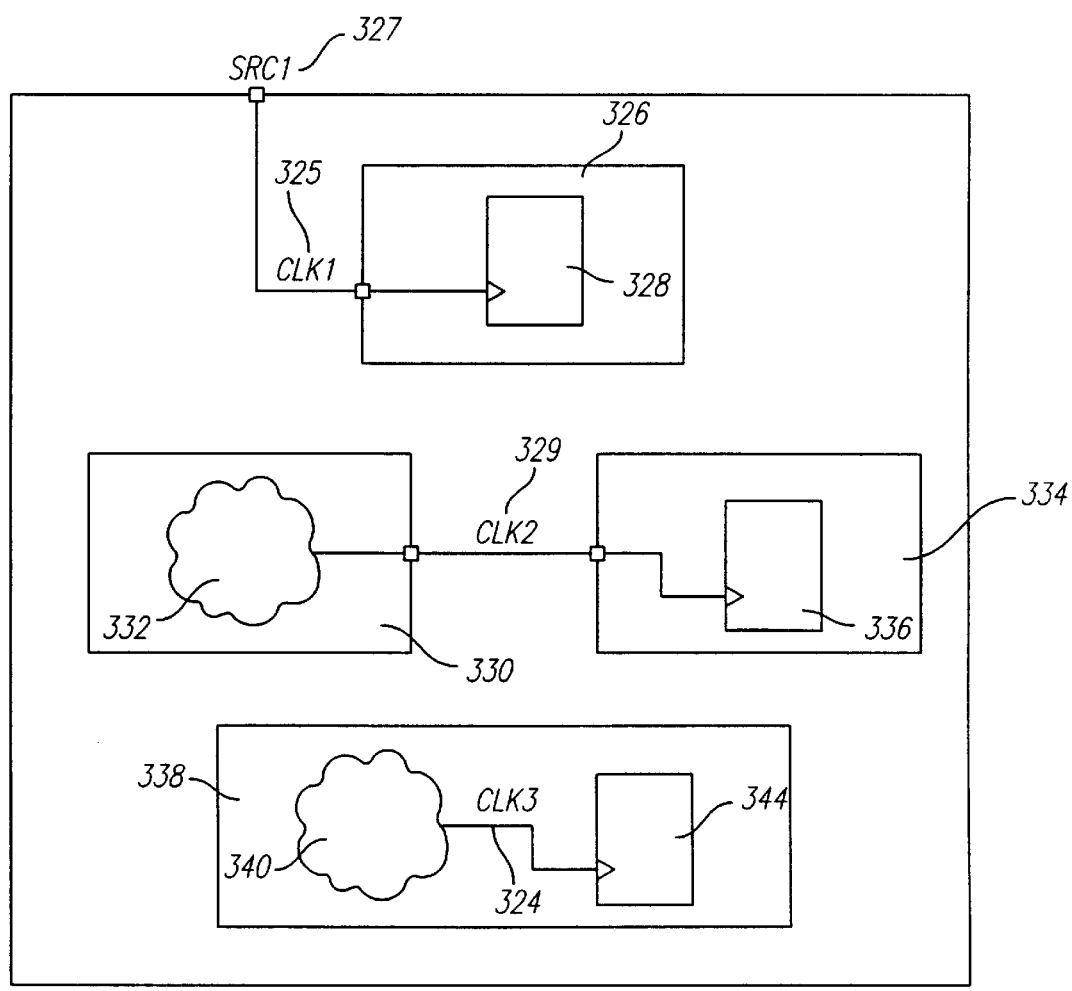
FIG. 39 EXTERNAL AND INTERNAL CLOCKS

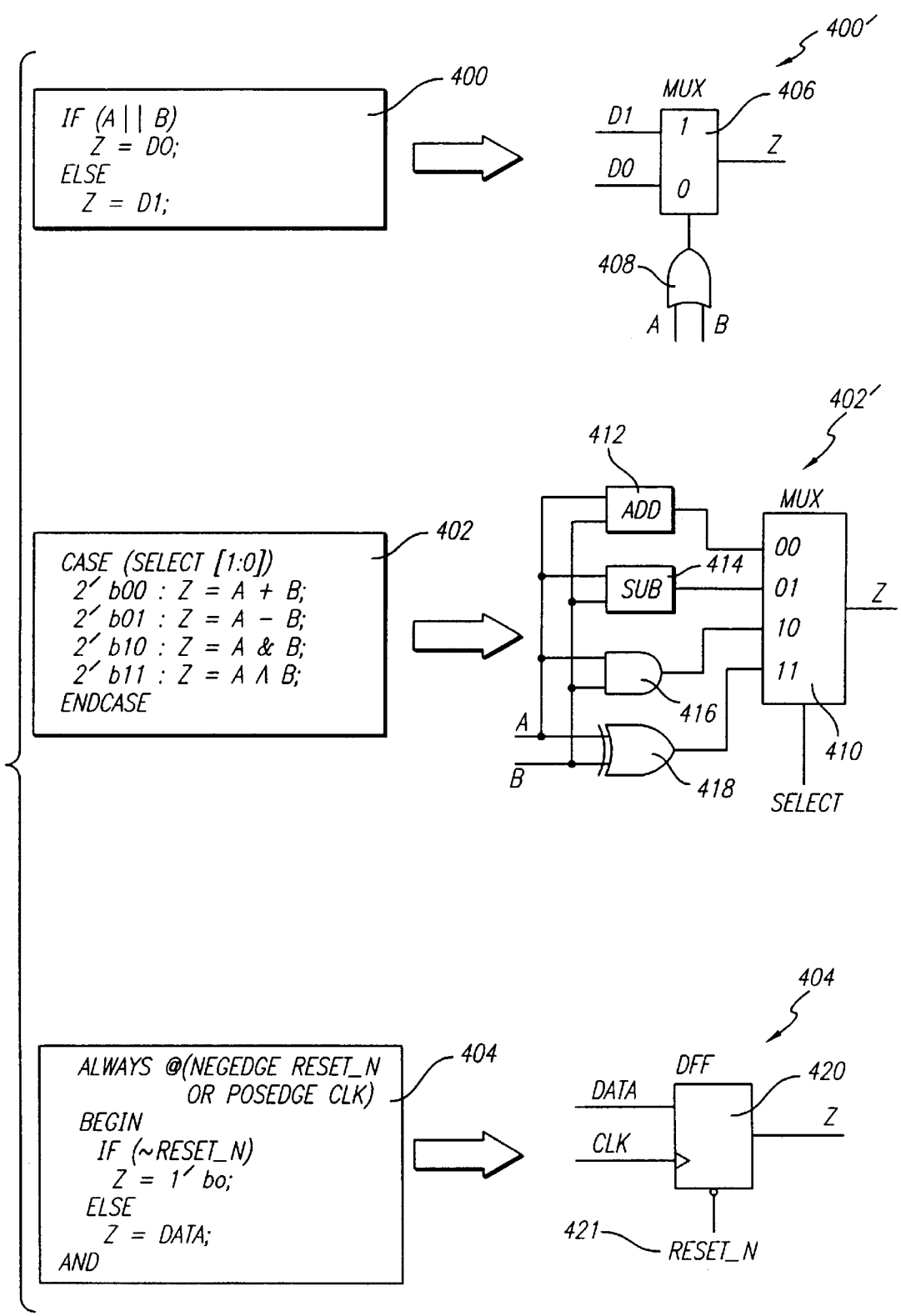
FIG. 38  EXAMPLES OF TRANSFORMS USED FOR RTL CODE TRANSLATION

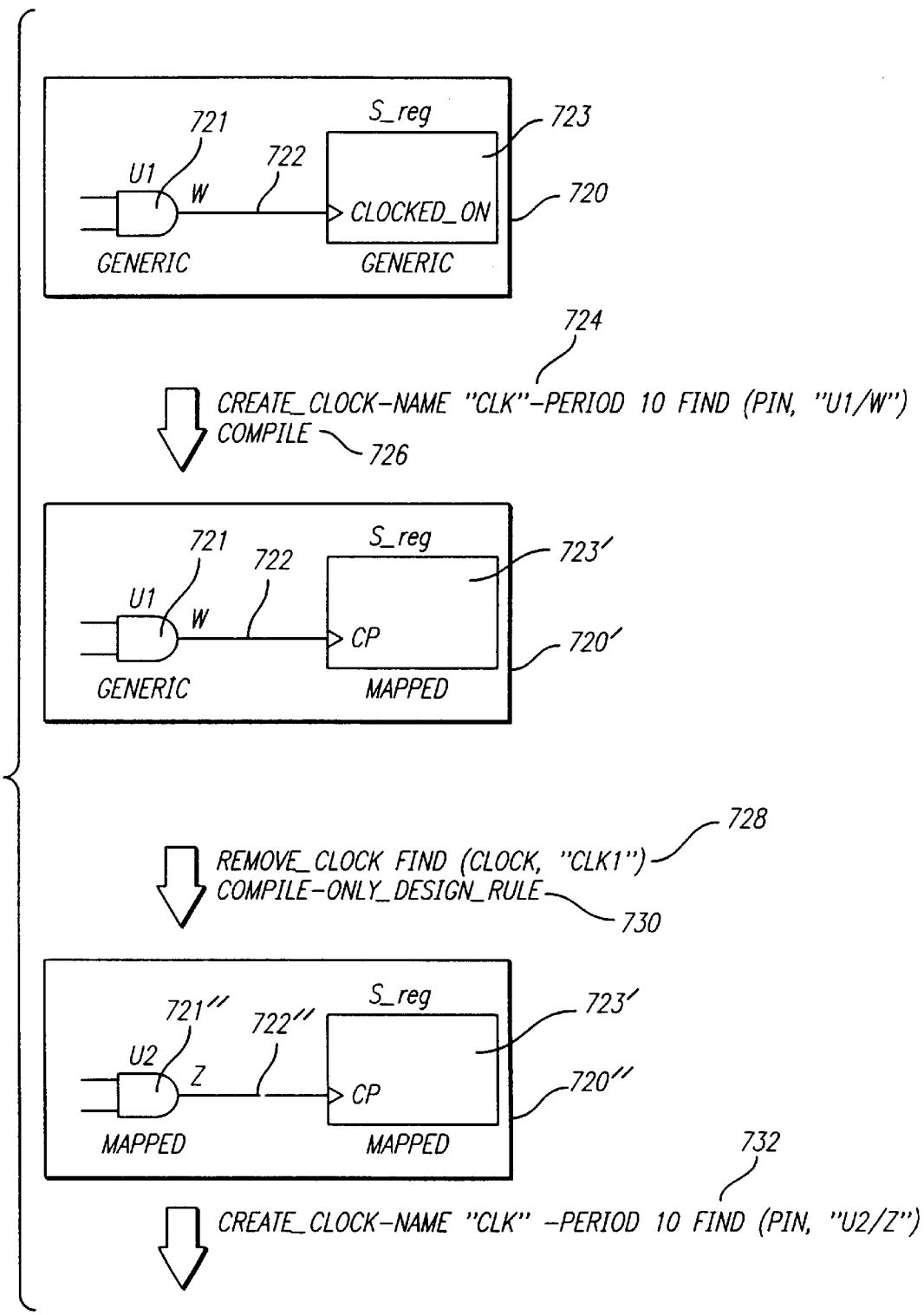
FIG. 40 PROCESS USED TO MAP CELLS THAT CREATE INTERNAL CLOCKS.

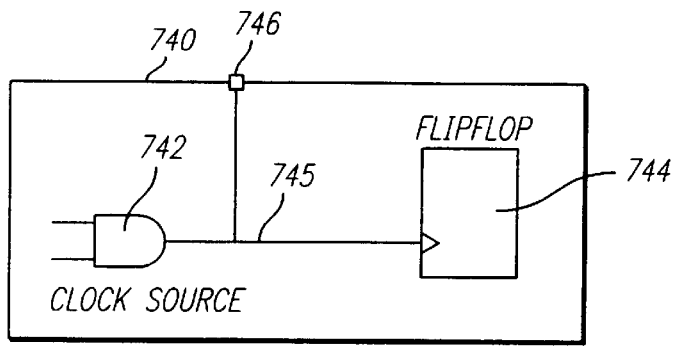
FIG. 41A  CLOCK SOURCE RETRIEVED THROUGH USING A CONNECTED PORT
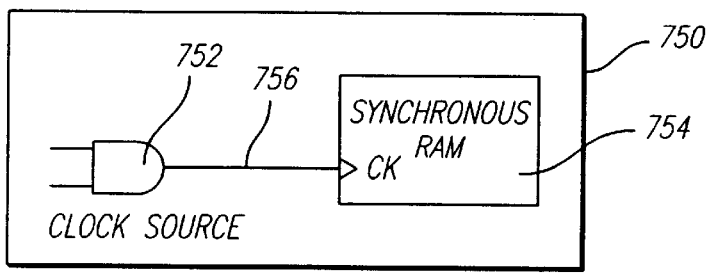
FIG. 41B  CLOCK RETRIEVED THROUGH USING A CONNECTED CLOCK INPUT PIN ON A RAM
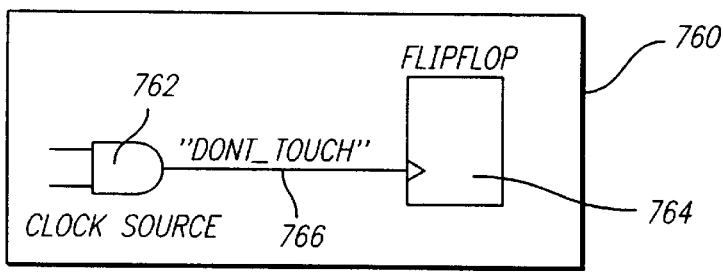
FIG. 41C  CLOCK SOURCE RETREIVED THROUGH USING THE CONNECTED NET. RETRIEVING NAMES OF NEW SOURCE PINS.

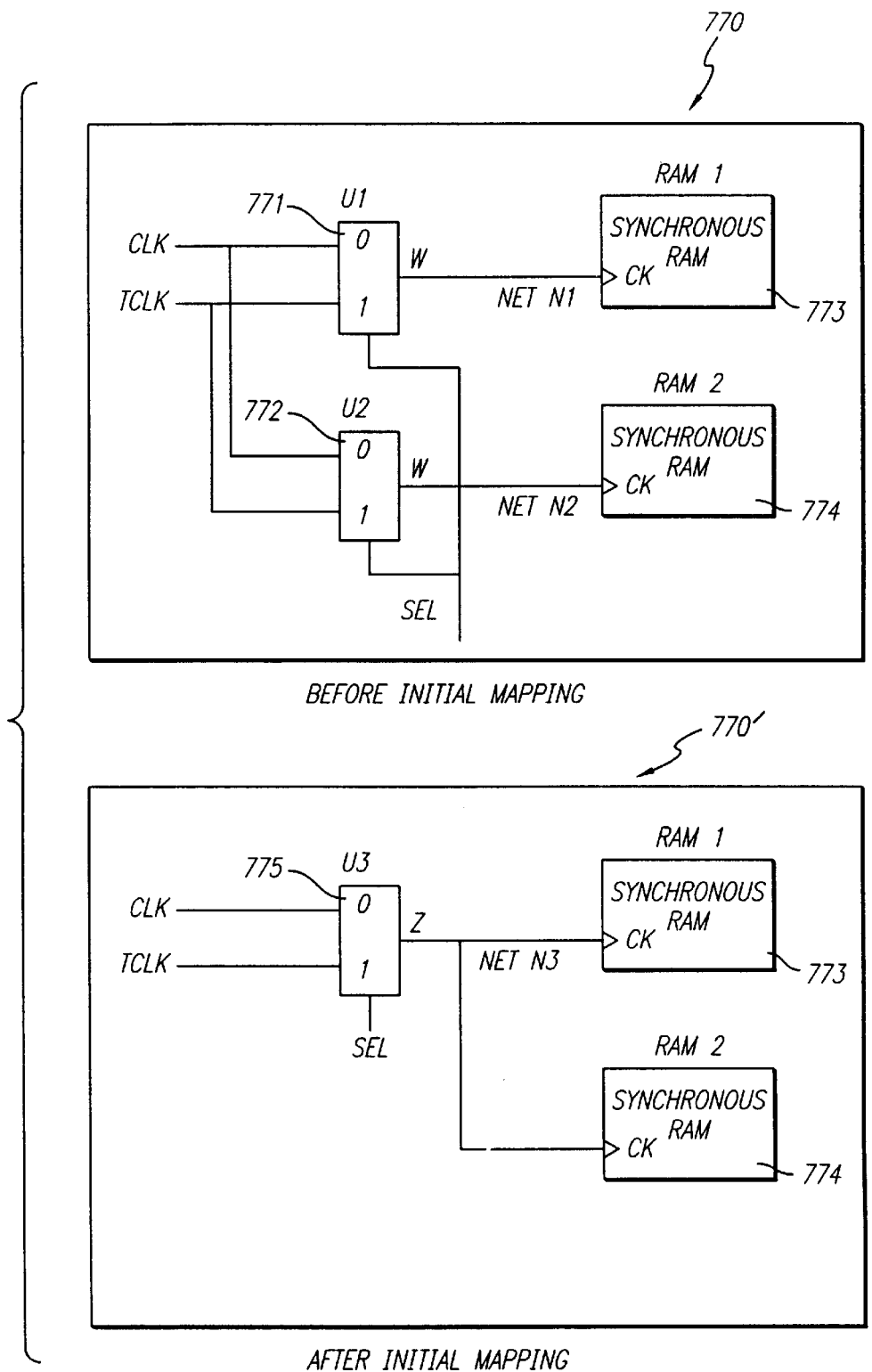
FIG. 42 EXAMPLE OF INTERNAL CLOCKS ALTERED THROUGH INITIAL MAPPING.

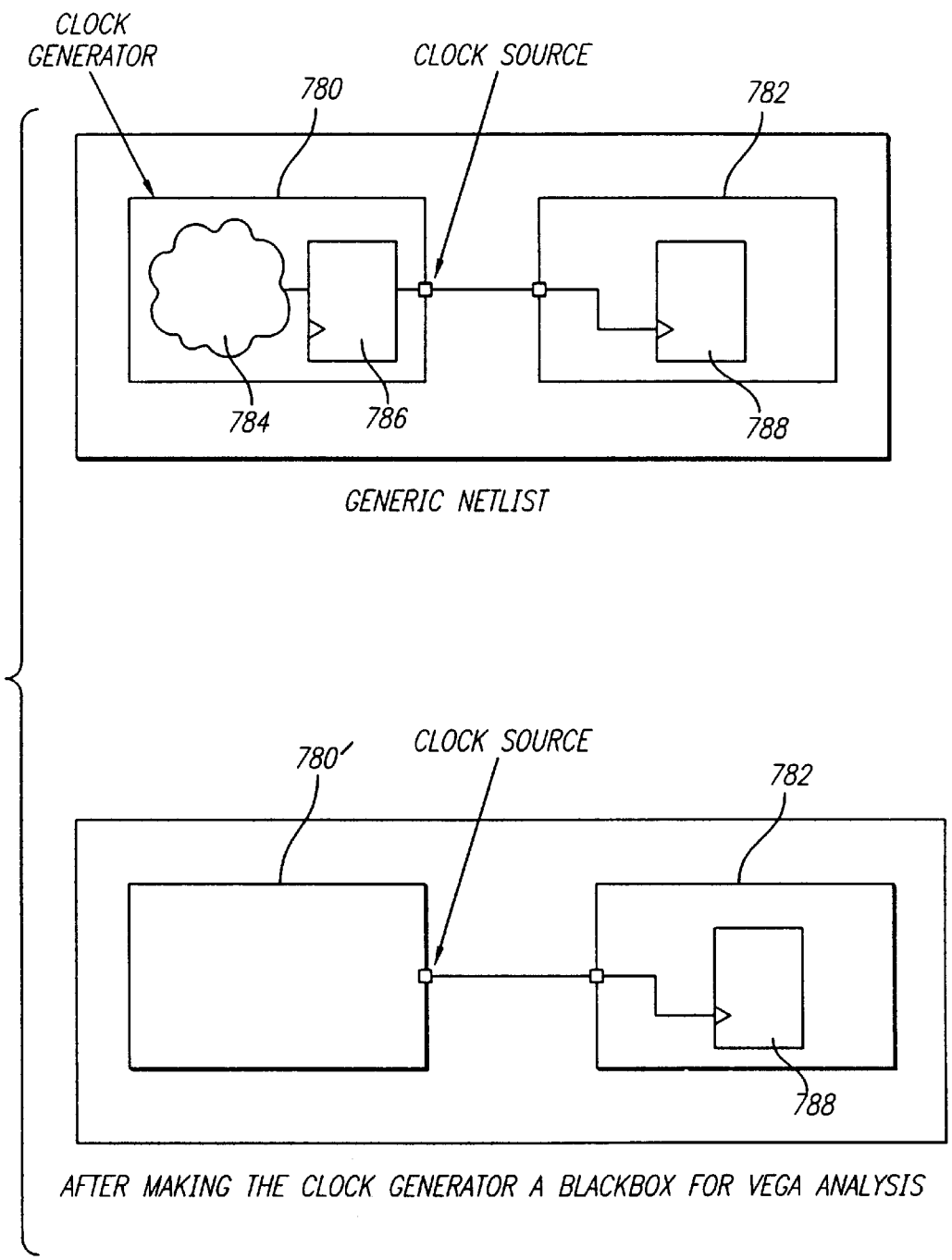
FIG. 43  HANDLING CLOCK GENERATORS WITH A "BACKBOX_DESIGN" DIRECTIVE.

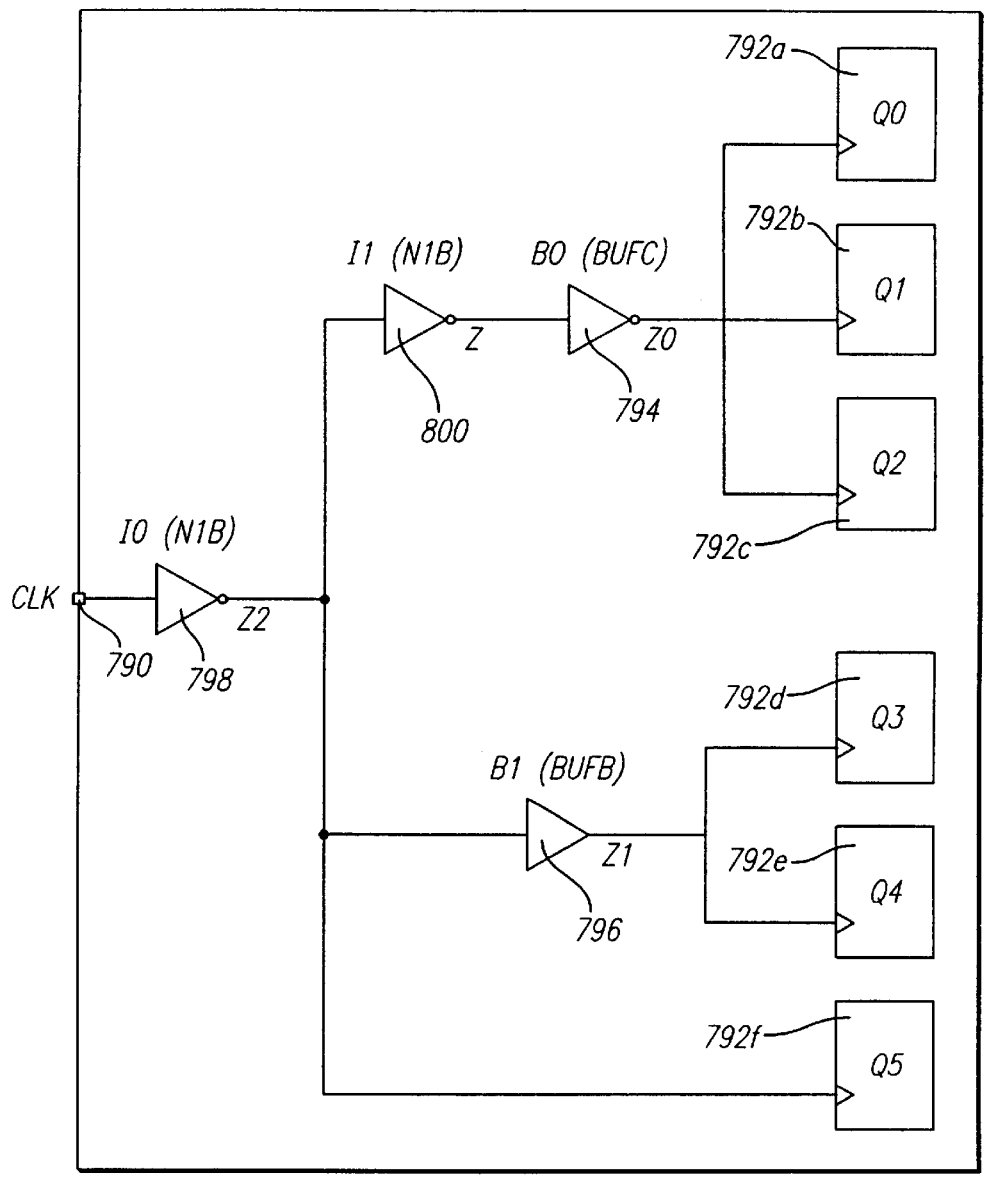
FIG. 44 EXAMPLE OF BUFFERING TREE USED FOR CLOCK DISTRIBUTION.

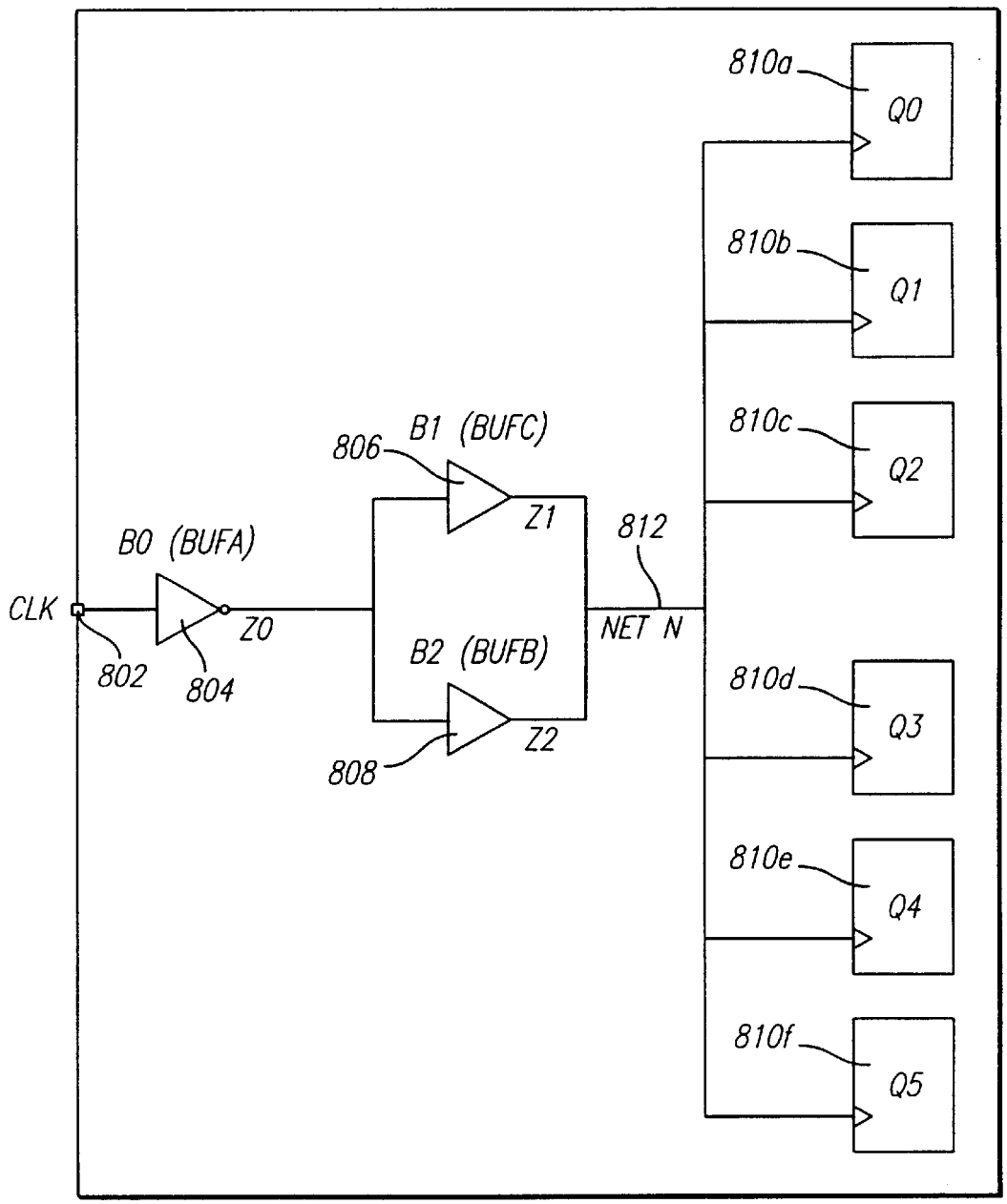
FIG. 45  EXAMPLE OF PARALLEL BUFFERS.

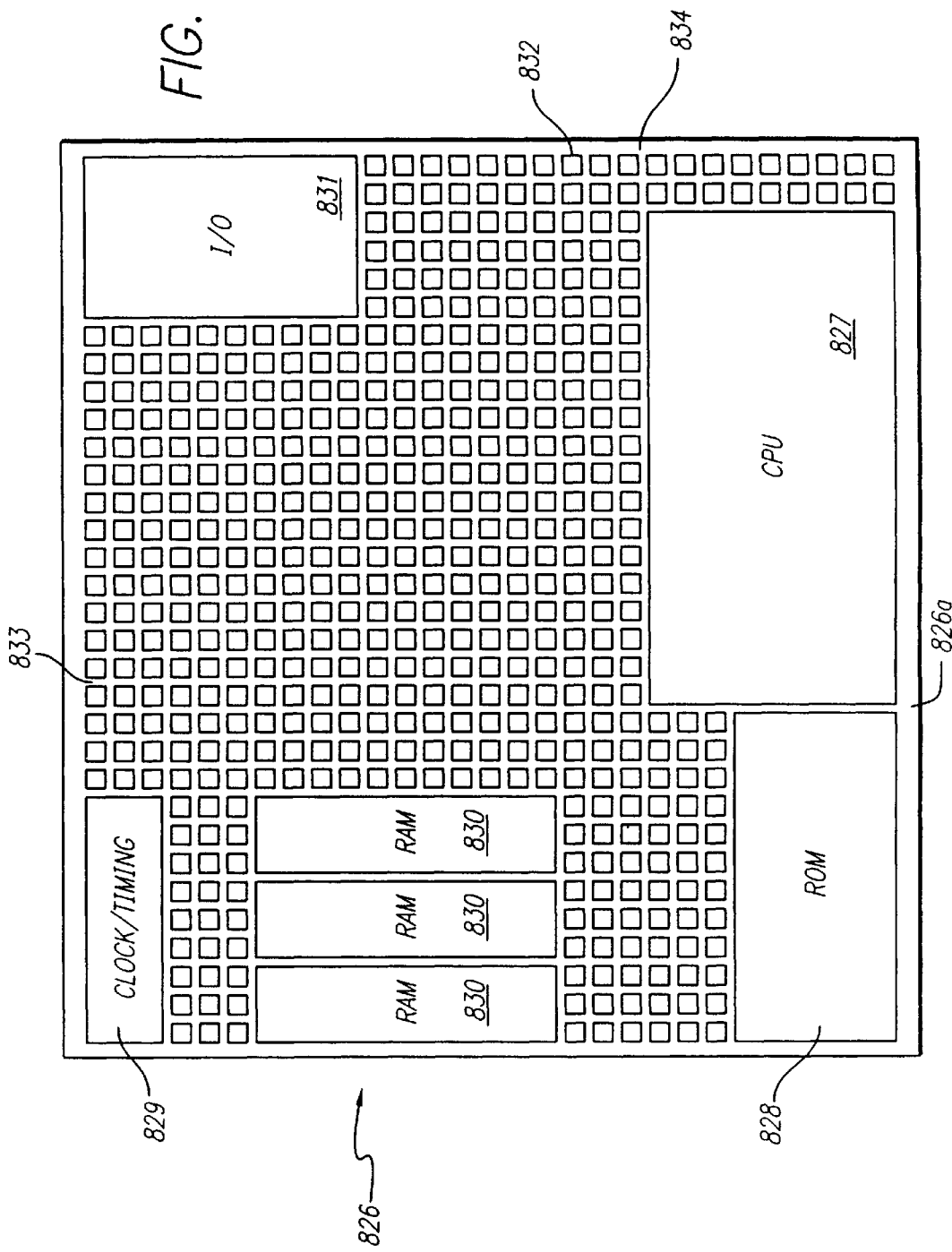

VDHL/VERILOG EXPERTISE AND GATE SYNTHESIS AUTOMATION SYSTEM

This application includes a microfiche appendix that consists of two microfiche for a total of 150 frames. All references herein to the term "Appendix" are intended to refer to this microfiche appendix.

BACKGROUND OF THE INVENTION

1. Field of the Invention

This invention relates to a method of analyzing and optimizing design of integrated circuit (IC) designs. In particular, the present invention relates to a method of analyzing IC circuit designs and automating design synthesis by generating synthesis scripts.

2. Description of the Related Art

Today, the design of most digital integrated circuits (IC's) is a highly structured process based on an HDL (Hardware Description Language) methodology. FIG. 1 illustrates a simplified flowchart representation of an IC design cycle. First, as indicated by the reference number 102, the IC to be designed is specified by a specification document.

Then, the IC design is reduced to an HDL code, as indicated by the reference number 104. This level of design abstraction is referred to as the Registered Transfer Level (RTL), and is typically implemented using a HDL language such as Verilog-HDL ("Verilog") or VHDL. At the RTL level of abstraction, the IC design is specified by describing the operations that are performed on data as it flows between circuit inputs, outputs, and clocked registers. The RTL level description is referred to as the RTL code, which is generally written in Verilog or in VHDL.

The IC design, as expressed by the RTL code, is then synthesized to generate a gate-level description, or a netlist. This is referred to by the reference number 106 of FIG. 1. Synthesis is the step taken to translate the architectural and functional descriptions of the design, represented by RTL code, to a lower level of representation of the design such as a logic-level and gate-level descriptions.

The IC design specification and the RTL code are technology independent. That is, the specification and the RTL code do not specify the exact gates or logic devices to be used to implement the design. However, the gate-level description of the IC design is technology dependent. This is because, during the synthesis process, the synthesis tool uses a given technology library, 108 of FIG. 1, to map the technology independent RTL code into technology dependent gate-level netlists.

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins. Some nets may include hundreds of pins or thousands or tens of thousands to be connected. A netlist is a list of nets including names of connected pins or a list of cells including names of nets that connect to pins of cells.

A netlist may be generic or technology specific. A generic netlist is a netlist created from the RTL code that has not yet been correlated with a technology specific library of cells. A technology specific netlist, or a mapped netlist, is a netlist created after the IC design has been mapped to a particular technology-specific library of cells.

Continuing to refer to FIG. 1, after the synthesis of the design, the gate-level netlist is verified 110, the layout of the circuits is determined 112, and the IC is fabricated 114.

At the RTL level, designers must take all key design decisions such as design hierarchy and partitioning, clocking scheme, reset scheme, and locations of registers. All those decisions are contained and reflected in the RTL code. The RTL code is technology independent, as well as independent from design tools.

As a result, some characteristics of the RTL code can strongly influence further design steps, including logic synthesis, gate-level simulation, static timing analysis, test insertion and layout. Unexpected problems and difficulties with the IC design can be encountered at any of these steps and cause implementation obstacles impacting project schedules and costs.

Some problems, referred to as showstoppers, may render the design not feasible for fabrication. For example, it may be realized during clock distribution that the design uses an unsupported clocking scheme, such as clock signals that are gated "on the fly" whenever needed. A clock signal is gated "on the fly" when a gate, usually an AND gate, is used to turn on a clock signal only when need for a particular sub-circuit but turned off the rest of the time. This is a common technique to reduce power consumption. The problem arises if and when the same clock signal is needed elsewhere. Then, clock distribution cannot be made, and the RTL code needs significant re-work.

Other design problems may present implementation obstacles requiring the engineering efforts to be much higher than expected. For example, it may be realized during logic synthesis that the design is partitioned in a very "synthesis unfriendly" manner. In such a case, the automatic features of the synthesis tools cannot be used, and, in its place, a lot of manual work is required to meet timing and other parameters.

Encountered late in the design cycle, such problems can greatly impact project schedules and design cost. The later the problems are discovered, the more significant the impact and the higher the cost in time and expenditure to correct the error. For example, timing or routability problems encountered during layout can require a new run through logic synthesis, gate-level verification, and test logic insertion. Modifying the RTL code late in the design process is generally the worst case scenario because once the RTL code is modified, all design steps must be re-run, including the RTL functional validation. For many design projects, RTL modification is not even a viable option.

To identify the potential problems with the IC design as early as possible, RTL code can be analyzed, manually or automatically. However, some design issues can be missed if the RTL code itself is used to analyze the design. In addition, some constructs of the languages used for the RTL code, such as Verilog and VHDL, leave room for more than one interpretation when implementing them in hardware. These shortcomings exist because the languages used for the RTL code, Verilog and VHDL, lack formerly-defined synthesis semantics. These languages lack the formerly-defined synthesis semantics because they were developed as simulation languages before logic synthesis tools were available.

SUMMARY OF THE INVENTION

The general purpose of the present invention is to provide the means to analyze IC designs early in the design process in order to allow correction of problems early on. Therefore, an object of the present invention is to extract critical design information from RTL code and identify early in the design process issues that can impact further design steps. The size and complexity of RTL code make "manual" RTL analysis unworkable.

Based on the context described above, another object of the invention is to define tools referred to as "synthesis script generation tools", that automatically extract from RTL code design information that is required for synthesis, including design hierarchy, clock sources and fanouts, hierarchy purity of modules, and types of pins that drive module outputs, and create optimized scripts to synthesize the design in a given target technology, using a given target synthesis tool. Purity of hierarchy refers to whether a particular level includes sub-designs only, logic only (if leaf), or sub-designs mixed with logic. Types of pins that drive module outputs may be registered or unregistered, and driven or not-driven by a flipflop.

It is a further object of this invention to provide a method of accessing the generic netlist from the Synopsys Design Compiler or similar synthesis tools. As discussed above, a generic netlist is a netlist created from the RTL code which has not been correlated with a technology-specific library. For example, RTL code describing a select function between sixteen input signals to a single output signal may be implemented as a multiplexer circuit (a "MUX"). A generic netlist may represent the sample circuit as a 16×1 MUX having a 16 input signals, four input selection signals, and one output signal. In contrast, a technology-specific netlist may represent the sample circuit as a cascade of several 4×1 MUX's.

Another object of the present invention is to extract critical design information from a generic netlist and identify as soon as possible issues that can impact further design steps. Analysis of RTL code may miss some design issues. These potentially problematic issues which can be missed at the RTL code analysis phase can be identified if the IC design is analyzed at the generic netlist level.

Accordingly, it is a further object of this invention to provide a method of accessing the generic netlist from the Synopsys Design Compiler or similar synthesis tools. Before information can be extracted from a generic netlist, one must first have access to the generic netlist.

Another object of the present invention is to effectively analyze mapped designs for buffering trees and determine their structure, their root pins, or active transitions or levels on their leaf pins.

Another object of the present invention is to utilize mapping techniques to maintain the known names of the source pins of the clocks even after the initial mapping process. During initial mapping process, the names of cells and pins are assigned by synthesis tools. Because of the name assignments, the names of the source pins of internal clocks are modified and are no longer available for resynthesis and characterization steps.

Another object of the present invention is to increase the speed in which large designs are synthesized by creative use of dc_shell command to characterize the modules of the design. As discussed herein, synthesis of IC designs involve iterations of the following two steps: bottom-up synthesis of sub-modules, and top-down characterization. The top-down characterization step can be improved by characterizing a list of module instances rather than characterizing one module at a time.

Another object of the present invention is to define a practical technique to synthesize the IC design having DesignWare modules. As discussed herein, DesignWare modules are typically predefined structured logic circuits with predefined characteristics. Because they are predefined to be general logic elements, DesignWare components may include circuits and pins which may be not necessary such as unused I/O ports. The present invention discloses techniques, including ungrouping and resynthesis to improve the performance of the synthesis script.

These and other aspects, features, and advantages of the present invention will be apparent to those persons having ordinary skill in the art to which the present invention relates from the foregoing description and the accompanying drawings.

Accordingly, the present invention is a method of fabricating an integrated circuit chip (IC), said method comprising the steps of defining the IC at the RTL code level, translating said RTL code into a generic netlist description, generating logic synthesis tool scripts based on said generic netlist description, and executing said logic synthesis tool scripts to synthesize the RTL code. The step of generating logic synthesis tool scripts comprises the substeps of identifying hardware elements and structure of the IC design, determining interrelationships between said identified hardware elements and structures, and generating logic synthesis tool scripts to synthesize said identified hardware elements to netlists as a function of said hardware elements and said interrelationships.

BRIEF DESCRIPTION OF THE DRAWINGS

FIG. 2 illustrates a clock domain interface between a first clock domain and a second clock domain.

FIG. 4 illustrates the exchange of a data bus between two asynchronous clock domains.

FIG. 5 illustrates a scheme where delay cells are used to delay signals.

FIG. 6 illustrates that some violations will not be caught when creating modules.

FIG. 7 illustrates one possible time budgeting scheme.

FIG. 8 illustrates that modules that mix logic with sub-modules can create complex paths spanning other several modules that are compiled independently.

FIG. 9 illustrates that modules that are compiled independently must have all their outputs "registered", or driven, by flipflops.

FIG. 16 illustrates the technique where a "snapshot" of the design is obtained, with conditions and constraints on I/O modules, that both reflect the current implementation of the design and synthesis goals.

FIG. 18 shows the result of the initial mapping process.

FIG. 22 illustrates ungrouping of small modules, used to build bigger modules that are more appropriate for synthesis.

FIG. 25 illustrates module processing order for parallel bottom-up synthesis.

FIG. 26 illustrates the database to be used to run VEGA scripts.

FIG. 37 illustrates the failing implementation of a latch with clear.

FIG. 38 shows transforms from templates in the RTL code, that are based on basic statements and constructs of the HDL, are transformed in a straightforward manner to equivalent hardware structures.

FIG. 39 illustrates external and internal clocks.

FIG. 40 illustrates the process used to map cells that create internal clocks.

FIG. 41A illustrates a clock source retrieved through using a connected port.

FIG. 41B illustrates a clock retrieved through using a connected clock input pin on a RAM.

FIG. 41C illustrates a clock source retrieved through using a connected net.

FIG. 42 is a diagram illustrating the altering of internal clocks through initial mapping.

FIG. 43 is a diagram illustrating handling clock generators with a "blackbox_design" direction.

FIG. 44 is an example of a buffering tree used for clock distribution.

FIG. 45 is an example of parallel buffers.

FIG. 47 is an illustration of an integrated circuit chip fabricated in accordance with the design ultimately derived by use of the present invention.

DESCRIPTION OF THE PREFERRED EMBODIMENTS

Figure 1:
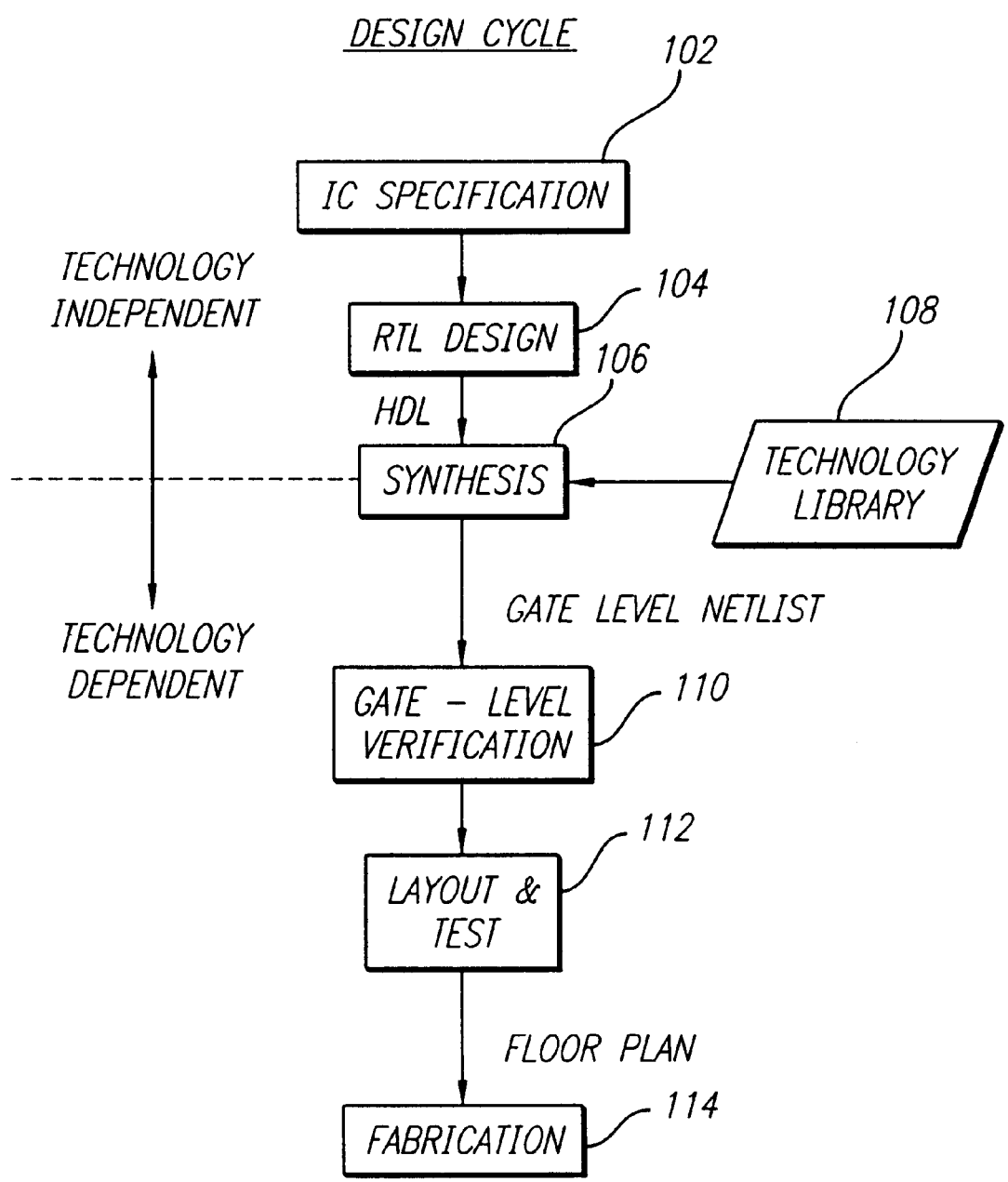
FIG. 1 is a flowchart depicting the design cycle with respect to the early analysis of RTL code.

Presented herein is a system for analyzing a circuit design at the RTL level. The system can be based on the extraction and analysis of information from RTL code. Preferably, however, the system analyzes information extracted from a generic netlist created by a logic synthesis tool.

A. RTL DESIGN ANALYSIS

As discussed above, information for analysis can be extracted directly from RTL code. This section discusses the extraction of information from RTL code and the analysis of such information.

1. Extract Critical Design Information

The first step in utilizing RTL code is to extract the critical design information required for the analysis.
a. Identify Key Hardware Elements And Their Key Pins With Active Edges Or Levels.

RTL code (in Verilog or VHDL) can be parsed in order to identify key hardware elements. Such key hardware elements include flipflops, latches, tristate buffers, bidirectional buffers and memories. With respect to these key hardware elements, key pins with the elements' active edges or levels can also be identified. For example, with regard to a flipflop, the following information can be extracted: The data input pin; the clock pin with an active edge (rising or falling), a clear pin with an active level (low or high); and a preset pin with active level (low or high).

In addition to the key hardware elements, interconnections between hardware elements must be understood.

Finally, the function of the clouds, or sets, of combinational logic needs to be understood to some extent, so that RTL analysis is able to track design issues.

Extracting key hardware elements is referred herein as "inference." Accordingly, for example, "flipflop inference", "latch inference", "tristate logic inference," and "bidirectional logic inference" refer to the inference of flipflops, latches, tristate logic and bidirection logic respectively. Inference involves identifying templates in the RTL code that indicate the presence of those elements.

For example, the following Verilog-HDL construct implies that signal "Q" is driven by a flipflop, that is clocked on the rising edge of net "CLK" and cleared asynchronously on the low level of net "RESET_N". This is the meaning of that code, that is the usual way of describing a flipflop or a register (set of flipflops). RTL designers are quite familiar with this kind of template, that logic synthesis tools also recognize.

```
always @ (negedge RESET_N or posedge CLK)
begin
    if (~RESET_N)
        Q = 1'b0;
    else
        Q = DATA;
end;
```

Flipflops, latches, tristate buffers and bidirectional buffers of a technology library can also be directly instantiated in the RTL code. For example, the following Verilog-HDL instantiation statement implies that signal "Q" is driven by an "FD1A" flipflop of a technology library, that is clocked on the rising edge of "CLK" and cleared asynchronously on the low level of net "RESET_N":

Q_FF FD1A(.D(DATA),.CP(CLK),.CD(RESET_N),.Q(Q));

A library of technology cells can be used to identify cells and their special pins.

Memories used in RTL code and associated key pins can be identified based on naming conventions provided by the chip manufacturer and utilized in the code or through asking the user to declare those cells as being memories. For example, using the naming convention of one semiconductor fabricator, the following VHDL module declaration indicates the presence of a synchronous one-port 256×8 bit RAM:

```
entity RRS1P256x8 is
    port (
        CLK  : in   STDU_LOGIC;
        WE   : in   STDU_LOGIC;
        OEN  : in   STDU_LOGIC;
        DI7  : in   STDU_LOGIC;
        DI6  : in   STDU_LOGIC;
        DI5  : in   STDU_LOGIC;
        DI4  : in   STDU_LOGIC;
        DI3  : in   STDU_LOGIC;
        DI2  : in   STDU_LOGIC;
        DI1  : in   STDU_LOGIC;
        DI0  : in   STDU_LOGIC;
        A7   : in   STDU_LOGIC;
        A6   : in   STDU_LOGIC;
        A5   : in   STDU_LOGIC;
        A4   : in   STDU_LOGIC;
        A3   : in   STDU_LOGIC;
        A2   : in   STDU_LOGIC;
```

-continued

```
        A1   : in   STDU_LOGIC;
        A0   : in   STDU_LOGIC;
        DO7  : out  STDU_LOGIC;
        DO6  : out  STDU_LOGIC;
        DO5  : out  STDU_LOGIC;
        DO4  : out  STDU_LOGIC;
        DO3  : out  STDU_LOGIC;
        DO2  : out  STDU_LOGIC;
        DO1  : out  STDU_LOGIC;
        DO0  : out  STDU_LOGIC) ;
end RRS1P256x8;
```

In the above VHDL module, the clock pin is "CLK" active on the rising edge. The write enable pin, which controls whether data is being written into or read from the RAM, is pin "WE" active on the high level. The RAM also features output enabling, controlled through pin "OEN" active on the low level.

Accordingly, as a first step in the process, a conventional parser searches the RTL code for recognizable patterns and naming conventions implying critical hardware elements, as well as specific pins of those elements and also correlates technology cells instantiated in the code (if any) with a library of technology cells.

b. Determine Critical Design Information.

Following the identification of key hardware elements and associated key pins, critical design information can be extracted from RTL code, including design hierarchy, nets, hierarchy purity of modules, registered/unregistered module outputs, logic surrounding memories, data busses, and high-fanout nets and fanout statistics.

The "design hierarchy" includes hierarchical modules, memories, IP cores and hard macros, and instantiated technology cells. Nets include, for example, multiply-driven nets, clock nets, asynchronous reset nets, synchronous reset nets, and RAM write enable nets.

A "multiply-driven net" is a net that is driven by more than one driver. Possible drivers are cell output pins, input ports on the top-level module, and module output pins that are unconnected. Tristate nets and bidirectional nets fall into this category. A multiply-driven net can be identified in an RTL code through searching for design objects and statements that can assign values to the corresponding RTL signal. Design objects that can assign a value to a signal are connected input and input/output ports on the top-level of the design. Statements that can assign a value to a signal are process statements and concurrent signal assignment statements. If a signal can be assigned a value by more than one top-level port and/or statement, then the corresponding net in the implied hardware structure is multiply-driven.

A "clock net" is a net connected to one or more clock pins of flipflops, enable pins of latches, and clock pins of synchronous RAMs. A clock net can be identified in an RTL code as a signal that controls the assignment of other signals, based on a transition of that signal from one level to another (implies flipflops) or based on setting of that signal to a given level (implies latches). Templates are well know by RTL designers, and are recognized by logic synthesis tools during the "translation" phase. A Verilog-HDL example has been given above, for a flipflop clocked on the rising edge of a signal CLK.

An "asynchronous reset net" is a net connected to one or more asynchronous clear and preset pins of flipflops. An asynchronous reset net can be identified in the RTL code as a signal that controls the loading of constant data into a set of flipflops (resp. latches) regardless of the clock (resp. the enable) that controls those flipflops (resp. latches). Templates are well know by RTL designers, and are recognized by logic synthesis tools during the "translation" phase. A Verilog-HDL example has been given above, for a flipflop cleared on the low level of a signal RESET_N.

A "synchronous reset net" is a net connected to one or more synchronous clear and preset pins of flipflops. If the target technology library does not include flipflops with synchronous reset pins, synchronous reset modes implied by the RTL code are implemented by logic synthesis like any other functional clock-synchronous mode, using the data input pins of flipflops. A synchronous reset net can be identified in the RTL code as a signal that controls the loading of constant data into a set of flipflops synchronously to the clock that controls those flipflops. Templates are well know by RTL designers, and are recognized by logic synthesis tools during the "translation" phase.

A "RAM write enable net" is a net connected to one or more write enable pins of asynchronous or synchronous RAMs. In most cases, recognizing a RAM write enable pin from RTL code is difficult. Modeling uses behavioral code for memories, not RTL code, and numerous templates and constructs can be used. Naming conventions or other indentifying indication from designers is needed.

A "clock domain" is defined as the set of all flipflops and synchronous RAMs that are clocked on the same edge of the same clock net. A "clock domain interface" is the logic that allows data to be transferred from one clock domain to another. Referring to FIG. 2, two clock domains 120 and 122 are illustrated. The first clock domain 120 comprises two flipflops 124 and 126 and a set of combinational logic circuits 128 (represented by a "cloud"). The elements 124, 126, and 128 are driven by a first clock signal CLK1 121. The second clock domain 122 includes flipflops 132 and 134 and a set of circuits 136, and is driven by a second clock signal CLK2 123. FIG. 2 also illustrates a clock domain interface 130 between the first clock domain 120 and the second clock domain 122. The interface 130 may include combinational logic circuits 138. Clock domain extraction can proceed after all clock nets have been extracted, including all memory elements that are connected to each clock net together with active edges and levels. Memory elements include flipflops, latches and synchronous RAMs. A clock domain is defined as the set of memory elements that are controlled by the same clock net on the same edge or level. A given memory element can belong to several clock domains. Clock domain extraction is being implemented in VEGA and will be described in further disclosures.

The "hierarchy purity" of a module is defined as "pure" if the module contains only sub-modules. It is defined as "leaf" if it contains only logic (i.e., no further hierarchy exists below that level). The hierarchy purity of a module is defined as "mixed" if it contains both sub-modules and logic. A module in a RTL code is pure if it only contains statements that instantiate other modules. "A module is a "leaf" it contains no statements that instantiate other modules. Other modules are "mixed".

Busses are groups of nets related together. Modeled as single entities in the RTL code, busses are split into a number of individual nets by logic synthesis. Generally, busses are identified for analysis purposes by recognizing naming conventions. For example, the following VHDL statement declares a 32-bit bus named "DATA" that will be split into 32 individual nets by logic synthesis:

signal data: STD_ULOGIC_VECTOR(31 downto 0)

The "fanout" of a net is defined as the number of input pins connected to the net. If the net is a multiply-driven net, it is defined as the total number of pins connected to the net minus one, as there should be only one pin driving the net at a time. The generic netlist is more suitable here, but only gives an approximate value of fanouts. More accurate values can be obtained through synthesizing the design to a generic library like the Synopsys GTECH library. Actual values will only be obtained after the design is mapped to the target technology. However, it must be noted that the fanout values of some critical nets, in particular clock nets and asynchronous reset nets, is fully accurate when working on the generic netlist, and could also be directly computed from the RTL code.

2. Critical Design Analysis

The design hierarchy is, in general, a piece of information that is used in all design steps. It shows how the design has been partitioned in modules of lower complexity. The number of hierarchy levels, the number of modules and the approximate complexity of each module are key information at all design steps, in particular for logic synthesis and layout.

Once the above-discussed information is extracted from the RTL code, the information is then analyzed and tested in order to determine whether there exist associated potential design problems. The hierarchy is analyzed to figure out how the design has been partitioned into smaller units. If the hierarchy is too detailed, it will have to be dissolved to a large extend for synthesis. Ideally, modules should include a single clock domain, mostly for synthesis efficiency reasons.

a. Multiply-Driven Nets.

The present invention analyzes and tests the design with respect to various issues associated with a tristate net or a bidirectional net. For example, if all drivers are simultaneously put in the high impedance state, then the net can "float" at an undefined voltage value, causing the value of currents to be unpredictable for testing. A device must be connected to the net to pull its voltage up or down when it is not driven (on-chip bus holders, external resistors), or the logic that controls enable pins of drivers must be designed in such a way that the net is always driven. If the net is connected to a pull-up or pull-down device (which can be showed by RTL analysis), it cannot float. Otherwise, simulation has to be used to make sure the net is always driven.

Second, there should never be more than one driver active at the same time. Otherwise, the logic value of the net cannot be predicted, and hot spots are created on the chip. This is referred to as "contention". This condition is detected using simulation.

Finally, in test modes, a net should always be driven if it is not connected to a pull-up or pull-down device, and no contention should occur. The real value of RTL analysis is mostly to point at tristate nets. Once aware of the presence of such nets, the way they are handled can be investigated (may be with help from the designers who wrote the code). Again, simulation is used to detect this problem.

Multiply-driven nets can also be created "by accident", in particular when working with resolved signals in VHDL ("std_logic" and "std_logic_vector" signal types). If a signal is assigned by several process statements or concurrent assignment statements, then the signal has several drivers. This will not be reported by the simulator, and will only be reported as a warning by the synthesis tool. If the chip was fabricated, the logic value of the signal would be unpredictable, and hot spots would be created. Multiply-driven nets created "by accident" can be distinguished from tristate and bidirectional nets through looking at drivers, that are not tristate pins or bidirectional pins.

b. Clock Nets.

In accordance with the present invention, all clock sources and nets are identified. It is generally critical to identify all clock sources, compute the fanout of each clock net, and identify pieces of the design where clock nets are connected to input pins other than clock input pins on flipflops, latches or synchronous RAMs.

For logic synthesis, all clocks must be properly defined, including source pin, period, and waveform. Ideally, all clock sources should be located in specific modules, referred to as "clock generators", that are synthesized apart from the rest of the logic. Clock constraints are then easily defined and the synthesizer is easily directed not to insert buffers on clock nets that will need Balanced Clock Trees (BCTs). Modules that create and use internal clocks require a more complex synthesis approach, in particular if timing constraints associated with those clocks are tight.

Chip manufacturers often use BCTs to distribute clock signals to flipflops and synchronous RAMs with a low and predictable skew. BCTs are implemented during layout. This is a complex operation, that involves significant engineering effort and requires appropriate planning. The total number of BCTs that can be implemented on a chip is limited. Not all clock nets require a BCT for distribution. In particular, clock nets with low fanouts (typically less than 100) can be buffered through synthesis, and laid out as any other net. Some attention needs to be paid to cell placement though, to make sure that the skew is under control.

Clock gating and clock dividing are techniques that are used more and more to save power, that has become a limiting factor in some applications. Clock gating consists in switching the clock off in some portions of the design when they are not active. Clock dividing consists in creating lower frequency clocks from a master clock and distributing them to some sections of the design that operate at lower speed. When used intensively in a design, those power saving techniques require specific clock distribution schemes to make sure that the clock skew is under control. For example, clock gating can be implemented through generating enable signals that control gates directly included in the BCT (Gated BCT). Such clock distribution schemes need to be discussed and anticipated when the RTL code is being developed. The chip manufacturer provides guidelines to model clock signals in RTL, in particular for gated clocks and multiplexed clocks. If those guidelines are not followed, then BCT insertion tools can fail requiring significant RTL code re-work.

c. Clock Domains and Clock Domain Interfaces.

As described above, a clock domain is the set of all flipflops and synchronous RAMs that are clocked on the same edge of the same clock net. Each of the clock domains are identified and analyzed. Clock domains that exchange data need to be interfaced in reliable and predictable ways, depending on relationships between clocks.

Figure 3A:
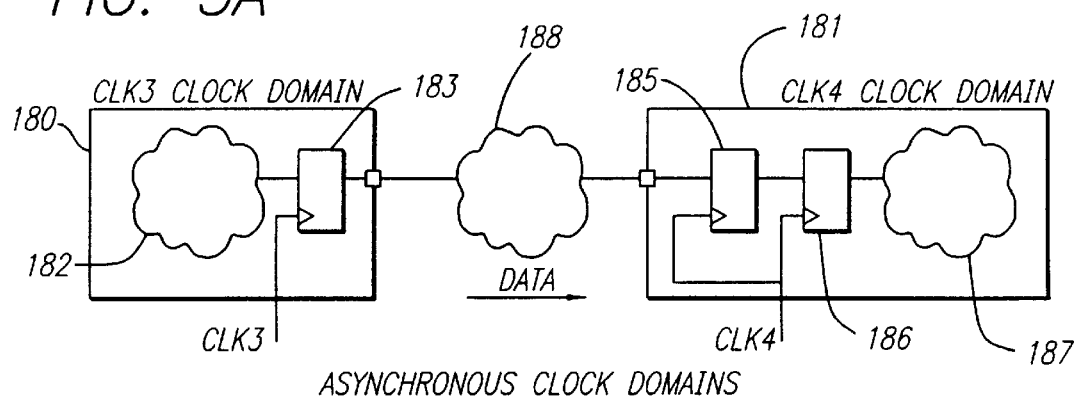
FIG. 3A illustrates asynchronous clock domains.

When the relationship between clocks is unknown and can vary over time, clock domains are referred to as "asynchronous clock domains". Asynchronous clock domains should be interfaced through a double level of flipflops to reduce the probability of meta-stability. Asynchronous clock domains are illustrated by FIG. 3A. Referring to FIG. 3A, two clock domains 180 and 181 are illustrated. The first clock domain 180 comprises a flipflop 183 and combinational logic circuits 182. The second clock domain 181 comprises two flipflops 185 and 186 and combinational logic circuits 187. Other circuits 188 may be in between the clock domains 180 and 181 The user has to indicate to the system that the two clocks are asynchronous (have no known relationship). There is no way for the system to determine this fact.

When the relationship between clocks is known and stable over time, clock domains are referred to as "related clock domains". If active edges are coincident, it is preferable to have combinational logic between related clock domains to minimize the risk of hold time violations. Related clock domains with coincident active edges are illustrated by FIG. 3B.

Figure 3B:
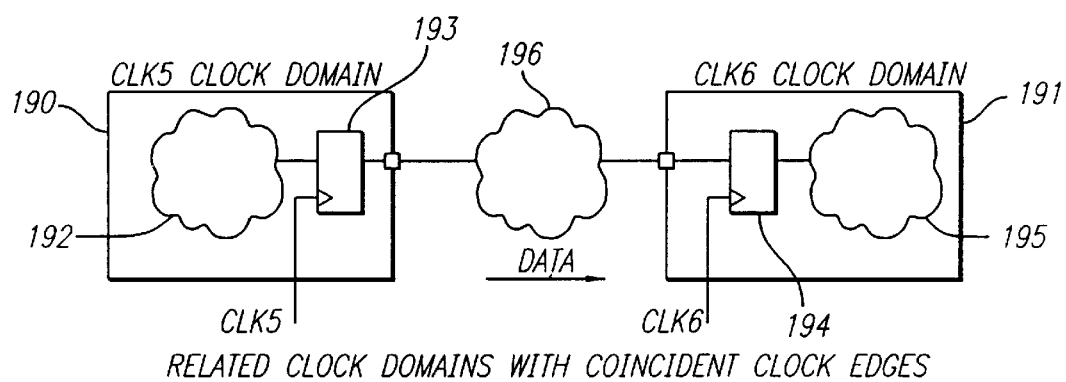
FIG. 3B illustrates related clock domains with coincident active edges.

Referring to FIG. 3B, two clock domains 190 and 191 are illustrated. The clock domains 190 and 191 have combinational or logic 196 in between the domains to minimize the risk of hold time violations. The clock domain 190 includes flipflop 193 and other circuits 192, and clock domain 191 include a flipflop 194 and other circuits 195.

Figure 3C:
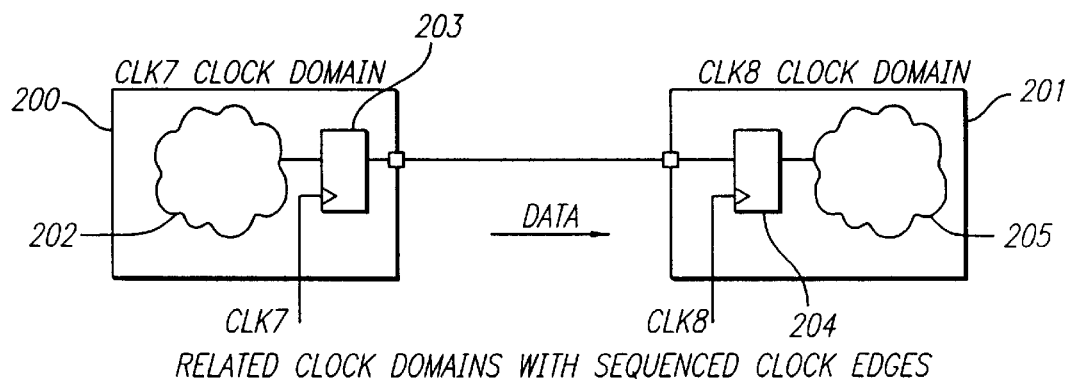
FIG. 3C illustrates related clock domains with sequenced active edges.

If active edges are sequenced, it is preferable not to have any combinational logic that would contribute with clock skew to make timing constraints more difficult to meet. Related clock domains with sequenced active edges are illustrated by FIG. 3C. Referring to FIG. 3C, two clock domains 200 and 201 are illustrated. The first clock domain 200 comprises a flipflop 203 and combinational logic circuits 202. The second clock domain 201 comprises flipflop 204 and combinational logic circuits 205. Note that the clock domains 200 and 201 are connected directly, without having any combinational logic in between them.

There are several motivations for identifying clock domains and clock domain interfaces in the RTL code early in the IC design process. From the chip architecture prospective, clock domains reflect fundamental partitioning decisions. Unclear and interlaced clock domains often indicate partitioning decisions that are inadequate for an integrated circuit implementation. Such problems should obviously be discovered when the RTL code is still in early stages and where the problems can be efficiently corrected.

From the design success prospective, clock domain interfaces must be checked carefully to make sure that no timing hazard can affect the design functionality after layout and fabrication. RTL analysis extracts clock domains and clock domain interface logic. Then, the user has to analyze this data based on clock relationships. A typical example of a potential timing hazard is illustrated by the exchange of a data bus between two asynchronous clock domains of FIG. 4. Referring to FIG. 4, two clock domains 210 and 212 are illustrated. The first clock domain 210 comprises a set of flipflops 214a to 214z which provides outputs A0 to A31 from clock domain 210. Some outputs from clock domain 210 travel through circuits having a first wire delay 220 while other outputs travel through circuits having a second wire delay 222. The data from clock domain 210 having traveled through circuits having wire delays 220 and 222 service as inputs to clock domain 212. Clock domain 212 has flipflops 216a to 216z which drive other flipflops or circuits such as flipflops 218a to 218z. In this example, the wire delay time 220 is different then the wire delay time 222. Because of different delays through wires 220 and 222, there is no guarantee that the same event is captured on each bit of the bus, causing the bus value to be erroneous. Chips can fail after fabrication because of this issue. Possible solutions include using Gray encoding to make sure that only one bit of the bus changes at a time. This can be accomplished during the RTL code stage.

From the RTL simulation prospective, delta-time hazards can be encountered at clock domain interfaces, in particular for related clock domains with coincident edges. The problem is encountered when running RTL simulation. When the problem exists, the design does not simulate as expected.

Typically, data is transferred from one clock domain to another in one clock cycle instead of two clock cycles. Knowing the clock domains and clock domain interfaces, an RTL designer should be able to quickly analyze and fix. Without such knowledge, this is much more difficult. Such issues are usually solved through adding delays to RTL signal assignment statements to mimic the hardware behavior.

From the logic synthesis prospective, each module that contains logic (leaf module) should involve one clock domain only, in particular if the design is timing critical. The ability of logic synthesis tools to meet timing constraints is reduced when several clock domains are simultaneously involved, and run times may increase significantly. When a module is synthesized, it is easy to see, based on clock domain information, whether the module includes one or several clock domains. If several, it can be difficult for the synthesis tool, especially if timing constraints are tight.

From the gate-level simulation prospective, the knowledge of clock domains and clock domain interfaces is needed to ensure that test benches are appropriate and do not cause any setup and hold violations. RTL test benches are generally re-used for gate-level validation. So it should be checked when the RTL code is being developed that test benches will be re-usable at the gate-level.

From the static timing analysis prospective, creating tool setup files is a significant engineering effort that mostly consist in defining clock domains, relationship between clocks, and interaction between clock domains.

Finally, from the scan testing prospective, the knowledge of clock domains is required for defining scan chains. Depending on the number of clock domains and the number of flipflops in each clock domain, a different scan chain can be allocated to each clock domain, or the same scan chain can link together flipflops from different clock domains. In this last case, the RTL code has to make provision for clock multiplexing logic.

d. Asynchronous Reset Nets and Synchronous Reset Nets.

RTL descriptions usually do not deal with the uninitialized simulation state ('U' state) and the unknown simulation state ('X' state). This would be difficult to handle and would reduce the clarity and the level of abstraction of RTL descriptions.

States 'U' and 'X' play a key role for gate-level verification, however. Gate-level simulation starts with all signals in the 'U' state. Reset signals are then activated and, through setting flipflops and latches to known values ('0' and '1' values), should set the design to a known configuration from where it can evolve in a predictable manner. If all flipflops and latches are initialized through asynchronous reset and/or synchronous reset, no 'U' states can propagate and generate 'X' states. If this is not the case, it must be carefully checked that the gate-level simulation will initialize properly and will be able to proceed. For this reason, it is important to identify all flipflops and latches that are not resettable. Flipflops that are not resettable can easily be identified because they are not controlled by a reset signal—asynchronous or synchronous.

Test issues are also associated with reset signals. In test modes, all reset signals must be under control to avoid that the design or some portions of the design reset unexpectedly. For example, when using scan testing, all asynchronous reset signals must be disabled in scan mode to make sure that no elements of scan chains can reset. It may be needed to add specific logic to control reset signals in test modes, like multiplexers and gates controlled through "test enable" signals.

Reset nets often have very high fanout values. For example, a single asynchronous reset net may be connected to all flipflops and latches of a design. Properly buffering and distributing such nets may raise difficult issues, and in some cases BCTs are used. This makes another motivation for identifying all reset nets in a design as soon as possible.

e. RAM Write Enable Nets.

RAM write enable nets need to be identified as soon as possible. Once identified, the RAM write enable nets can be checked to ensure that the RAM write enable logic has been implemented according to supported schemes.

"Pulse generator" logic is required to write data to a RAM in a single clock cycle and as soon as input data and addresses are available. However, "pulse generator" logic creates a pulse on the RAM write enable pin that is contained within the clock period and consistent with setup and hold times. This implementation of pulse generators requires delaying signals. This is generally not allowed, in particular in an ASIC context, because of uncertainty on delay values due to process variations and layout effects (wire delays).

Therefore, it is generally preferable that specific cells, referred to as "delay cells", are used to delay signals, and that RAM write enable logic follows given schemes that have proved to be fully reliable. An example of such a scheme is illustrated by FIG. 5. Referring to FIG. 5, random access memory chip (RAM) 220 is illustrated. Flipflop 222 provides the input data signal to the RAM 220 and flipflop 224 provides the address for the input data. The pulse generator signal is provided by flipflop 226. The signal from the pulse generation circuit 226 creates a pulse on the RAM write enable pin 227. This implementation of pulse generator requires delay signals. The delay signal of the clock 228 is provided by delay cell 229 which, in combination with an AND gate 230, provides synchronized write enable signal on the line 227. For reading operations the output from the RAM 220 is provided to flipflop register 232.

For that reason, RAM write enable nets need to be identified as soon as possible in the design process. The design can then be checked to make certain that RAM write enable logic has been implemented according to supported schemes.

f. Hierarchy Purity of Module and Pins Driving Each Module Output.

The hierarchy purity of modules is key information for logic synthesis, together with the type of pins that drive each module output. For each module output, the RTL object that can assign a value to the output has to be located. It can be an input or an input/output port on the top-level or an assignment statement. If it is an assignment statement that is inside a clock-synchronous section, then the output is registered. Here, a netlist or a similar representation is quite efficient.

Current logic synthesis tools are too limited to synthesize an entire design at once with realistic run times and memory requirements. Depending on available processing resources, the logic synthesis tool and the nature of the logic to be synthesized, modules of sizes that range from 5,000 gates to 50,000 gates can be synthesized. Building larger designs requires that modules of reasonable sizes are first synthesized independently, then put together. When related combinational logic is split between modules, the logic synthesis tool does not work on entire flipflop-to-flipflop timing paths, but on artificially broken segments. Referring to FIG. 6, if the logic synthesis tool cannot work under entire flipflop timing path illustrated by module C 236, then module C is synthesized in portions. First portion, module A 237 is synthesized first. Then, module B 238 is synthesized.

Two types of issues are associated with such a situation. First, exploratory synthesis on individual modules may not reveal all paths that violate clock constraints. For example, on FIG. 6, paths from the output of flipflop 239 to the input of flipflop 240 may violate clock constrains because of the combination of circuits 241 and 242. The violating path from flipflop 239 to flipflop 240 cannot be detected if module A 237 and module B 238 are synthesized separately. However, when module A 237 and module B 238 are synthesized together as module C 236, then the violating path from the flipflop 239 to flipflop 240 can be detected. Some violating paths can still be found when putting modules together. For an RTL design team, it means that some violations will not be caught when creating modules, but only when integrating modules together. These concepts are illustrated by FIG. 6.

Second, allocating "time budgets" to modules may be required to properly constrain synthesis. So far, time budgets had to be set manually, requiring a lot of engineering effort and potentially impacting the turn-around-time of synthesis. FIG. 7 illustrates one possible time budgeting scheme. Referring to FIG. 7, given a predetermined amount of time for a signal to travel from flipflop 253 of module A 250 via module B 251 to flipflop 237 of module C 252, a portion of that predetermined time is allocated to each of the modules 250, 251 and 252. Because of the fact that the signals must travel through combinational logic circuits 254, 255 and 256, the available time, in the example of FIG. 7, has been allocated as follows: 30% to module A 250, 50% to module B 251, and 20% to module C 252.

Artificially breaking flipflop-to-flipflop timing paths should be avoided as much as possible. This is achieved when two guidelines are followed. First, the design hierarchy should be pure down to leaf modules. In other words, modules should either contain sub-modules only, or logic only. If allowed, modules that mix logic with sub-modules can create complex paths spanning other several modules that are compiled independently, as illustrated by FIG. 8, and can also increase synthesis run times and reduce optimization opportunities. Referring to FIG. 8, module C 260, as illustrated, is impure hierarchical mixed logic module. Module C 260 contains module A 261 and module B 262 as well as combinational logical 263. Modules A 261 and B 262 are pure leaf modules because each of them contains only logic circuits. Module A 261 contains combinational logic circuits 264 and flipflop 265, and module B 262 contains combinational logic circuits 266 and flipflop 267.

Second, modules that are compiled independently must have all their outputs "registered", or driven, by flipflops. In this case, the delay consumed in output flipflops can be neglected, and no time budgets are needed. The diagram of FIG. 9 illustrates this concept. Referring to FIG. 9, modules 270 and 271 are illustrated. Module 270 having combinational logic circuits 272 has a flipflop 273 which drives the output of the module 270. Therefore, module 270 has registered outputs. Delay of the flipflop 273 can be ignored in this case. Module 271 also has combinational logic circuits 274 and flipflop 275.

For functional reasons, it is not always possible to register all module outputs. However, timing paths that span over several modules synthesized independently often require manual investigation and time budgets. So it is critical to evaluate how many paths of that type are included in a design to assess the synthesis turn-around-time. The ratio "number of registered outputs/number of combinational outputs" of each module, that is easy to compute, is a valuable criterion for that purpose.

g. Logic Surrounding Memories

Figure 10A:
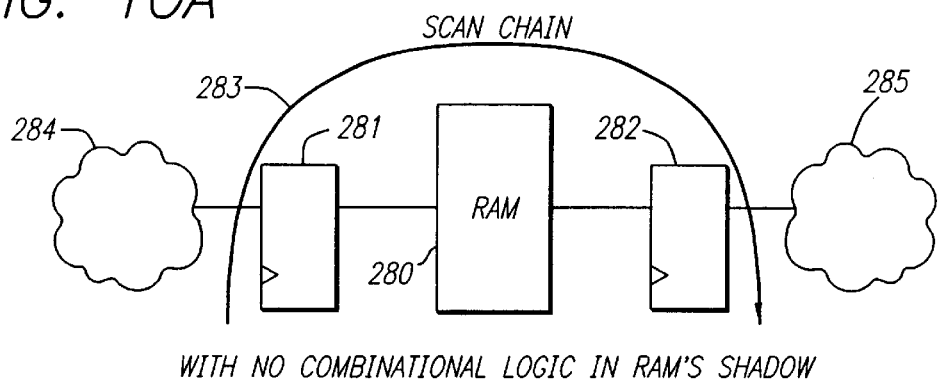
FIG. 10A illustrates that flipflops can then be chained together to isolate the RAM in scan mode.

The logic that surrounds memories, particularly RAM's, are extracted by the present invention. Currently, VEGA extracts only the WE nets. Then, given this pointer, the user has to investigate in the code. Using a TCL interface it is possible to extract the whole WE generation logic. When scan testing is used for a design, possibly in conjunction with "RAM BIST" (Built-In Self Test) for testing RAMs, all RAMs should be surrounded by flipflops. Those flipflops can then be chained together to isolate the RAM in scan mode as illustrated by FIG. 10A. Referring to FIG. 10A, the RAM 280 and the surrounding flipflops 281 and 282 are grouped in the scan chain 283 for scan testing. In this case, because combinational logic circuits 284 and 285 are outside the scan chain 283, the RAM 280 and the flipflop 281 and 282 can be chained together and isolated.

Figure 10B:
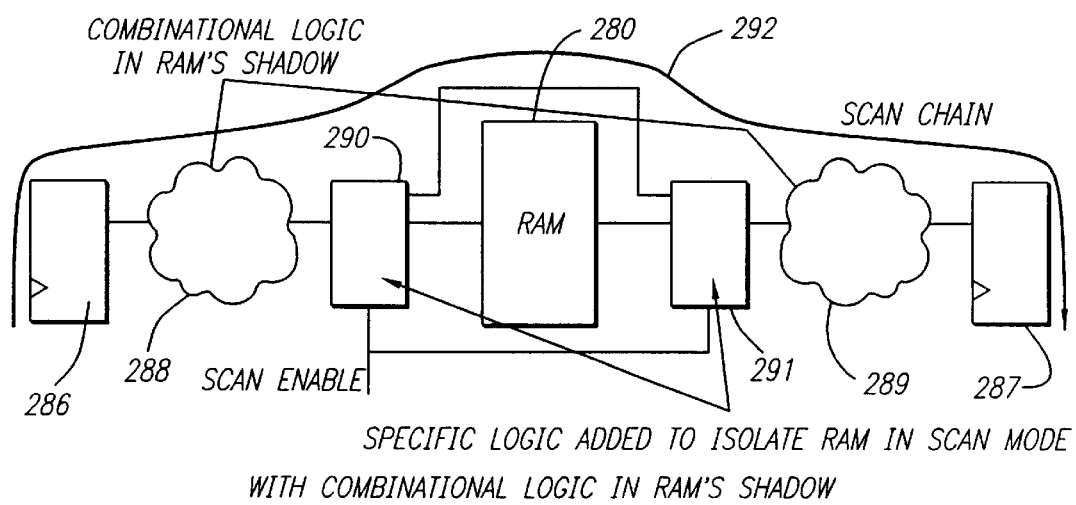
FIG. 10B illustrates that if there is some logic in "RAM's shadow", then specific logic has to be added to isolate the RAM in test mode.

If there is some combinational logic in RAM's shadow, or scan chain, then specific logic has to be added to isolate the RAM in test mode as illustrated by FIG. 10B. Referring to FIG. 10B, combinational logic circuits 288 and 289 are in between the RAM 280 and flipflops 286 and 287. In such a case, the scan chain 292 includes the combinational logic circuits 288 and 289. Then, specific logic circuits 290 and 291 must be added to surround the RAM 280 and separate it from combinational logic circuits 288 and 289 which are in RAMs shadow. This may reduce the efficiency of ATPG tools (Automatic Test Pattern Generation), and require manual writing of some test vectors. The logic that needs to be added also impacts timing, which can be an issue if critical paths go through the RAM.

h. Data Busses

Data bus design information is extracted from the RTL code. Two critical issues are associated with the routing of data busses of significant width, especially if they connect several modules together at the chip top-level. First, the dispersion of wire delay values for the different bits of a bus should be minimized, in such a way that the bus value gets valid on connected terminal pins within a minimum time interval. Also, congestion can occur in some routing areas. The RTL analysis brings busses to the attention of users who are not familiar with the design, like the application engineer in charge of floorplanning. This is key information, that can result in a lot of issues if missed.

Ideally, the routing of busses should be defined when creating the chip floor plan, that consists in placing the input/output cells (bounding diagram), and approximately defining the shapes and positions of modules. Defining bus routing at the floorplan level is referred to as "Bus Planning", and consists in defining routes of nets in terms of used wiring areas (global routing).

With deep sub-micron processes, more focus is being put on early floor planning based on RTL code, which is referred to as "RTL Floorplanning". The design hierarchy is defined in the RTL code, and the sizes of modules that contain logic can be approximated based on the RTL code, for example through a quick logic synthesis pass with simplified constraints.

The extracted bus design information is then passed to Bus Planning and RTL Floorplanning modules in lower level synthesis.

i. High-Fanout Nets and Fanout Statistics.

High fanout nets must be identified because the high fanout nets' buffering and routing requirements analysis is important elements of a successful fabrication. The fanout of each net is computed. A predefined threshold is used to determine whether or not it is a "high-fanout" net. High fanout nets typically include clock nets, reset nets, and scan enable nets.

Figure 11:
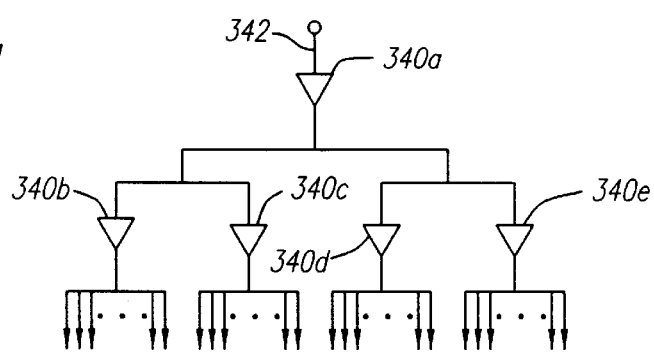
FIG. 11 illustrates the concept of using multiple buffers in a tree structure to provide a signal on line to a plurality of elements.

Clock signals are usually distributed using BCTs, to make sure that the skew is within a given range. Logic synthesis is then directed not to insert any buffer on those nets. BCTs are sometimes used for other high-fanout nets than clock nets, like reset nets and scan enable nets. In general, high-fanout nets are buffered by logic synthesis, that uses "buffering trees" to make the fanout of each cell lower than a given value. FIG. 11 illustrates the concept of using multiple buffers 340a, 340b, . . . 340e, in a tree structure to provide a signal on line 342 to a plurality of elements. The definition of a maximum fanout value depends on routing tools (e.g., 70). Specific constraints, referred to as "design rules", can be used to properly direct logic synthesis.

Statistics can be computed from the fanout value of each net extracted from the RTL code, including: the average number of pins per net; and tables showing the percentage of nets for each fanout value. For a layout engineer, those figures are helpful to develop an early understanding of how "routing friendly" the design is going to be.

3. Verifying Design Rules—RTL Design Rule Checking (DRC)

RTL design rule checking consists in checking basic design rules, including:

Combinational loops;

Unconnected pins;

Pins permanently tied to logic zero or one;

Nets that connect several pins on the same module;

Nets that are not driven;

Nets that drive nothing; and

Input/output pins directly connected together (including "feedthroughs", that directly connect an input pin to an output pin).

It must be noted that some of the rules listed above are showstoppers, such as combinational loops, while some others should be considered warnings, such as unconnected pins. In accordance with the present invention, these design rules are checked with respect to the information extracted from the RTL code.

4. Present the Design Information in Efficient Ways

The information should be presented in such a way that users immediately get "pointers" to pieces of code that involve issues and that design situations can quickly be evaluated. For example, the following information can be highlighted in order to direct the users towards pieces of code that need to be investigated:

Connections of a multiply-driven net to output pins that are not output pins of tristate buffers. This usually indicates multiply-driven nets created through accidentally connecting signals together.

Connections of a clock net to input pins that are not clock pins on flipflops, or enable pins on latches, or clock pins on synchronous RAMs. This usually indicates portions of a design where "clock manipulation" takes place, like clock gating, clock multiplexing, or clock dividing.

Connections of an asynchronous reset net to input pins that are not clear or preset pins on flipflops or latches. This usually indicates portions of a design where "reset signal manipulation" takes place, like gating used to disable reset in scan mode.

Connections of a write enable net to input pins that are write enable pins on a RAM. This usually indicates a non-supported or non-recommended scheme for creating a write enable pulse.

Clock nets that are active on both edges. This can indicate unclear and unseparated clock domains, or may bring the attention to other characteristics like the duty cycle of the clock.

Clock nets that are connected to both flipflops and latches. This usually indicates tricky clocking schemes, that need to be further understood.

Whenever possible, the information should be presented in a synthetic way. For example, the design hierarchy can be reported with synthesis-related key information attached to module names, like their hierarchy purity, and the numbers of registered and combinational outputs.

Summaries of extracted design information should also be created. In particular, for each extracted clock net, the following summary should be provided:

Clock source;

Fanout;

Active level;

List of connections to other input pins than clock pins on flipflops, enable pins on latches, or clock pins on synchronous RAMs;

List of connections to synchronous RAMs; and

List of connections to enable pins on latches.

Statistics on extracted design information should also be provided whenever they can help users develop "global pictures" of a design. For example, the following design hierarchy statistics should be provided:

Number of modules in hierarchy;

Number of different types of modules in hierarchy;

Number of hierarchy levels;

Number of modules that mix hierarchy and logic; and

Average complexity of modules that include logic.

B. EXTRACTING GENERIC NETLIST FROM RTL

After the RTL code has been finalized, the code is read in by logic synthesis tools such as the Synopsys Design Compiler ("Synopsys" or "Design Compiler"). Then, the logic synthesis tool synthesizes the design, as reflected by the RTL code, into the gate-level description of the design. Although the preferred embodiment described herein is discussed in terms of the Synopsys Design Compiler, the present invention is applicable to any synthesis systems.

Logic synthesis tools such as Synopsys Design Compiler provide two commands that are employed successively to read in RTL code. The analyze command causes the compiler to parse the RTL code and store the parsed information as binary files in libraries. The elaborate command causes the compiler to build a generic netlist from the binary files created by the command analyze.

When the elaborate operation is completed, the generic netlist is available in the Synopsys Design Compiler's work space and can be accessed. For example, the generic netlist can be written out as a Verilog-HDL model, using the "write-format verilog" command. It can also be written out as a VHDL model, using the "write-format vhdl" command. Design objects that build the generic netlist can be accessed through "dc_shell", which is the Design Compiler's command shell, or environment.

Once extracted, a generic netlist can be parsed and analyzed in the same manner as discussed above with respect to RTL code. The information derived from the generic netlist parsing and analysis can also be utilized in the same manner as the information derived from parsing and analyzing RTL code.

The "write-format verilog" command is fast, typically taking about 10 minutes on a Sun/Ultra-II workstation for a 350 kGates design. The obtained Verilog-HDL models are generally easy to parse. However, directions of cell pins (input, output, input/output) do not appear in the Verilog-HDL models. In addition, some cells of the generic netlist are represented as concurrent signal assignments with combinational expressions on their right hand side, similar to the following example.

assign n775=(n665|n682|n687);

As a result, the names of cells of the generic netlist that correspond to those signal assignments cannot be found in Verilog-HDL models. In addition, specific, expensive Synopsys license, referred to as "Verilog writer", is required to use the "write-format verilog" command.

As mentioned above, the generic netlist also can be written out as a Verilog-HDL model, using the "write-format vhdl" command. The command "write-format vhdl" is also fast, typically taking about 15 minutes on a Sun/Ultra-II workstation for a 350 kGates design. However, cells are modeled using VHDL generics to parameterize numbers and names of inputs and outputs, and a package is included to handle signal types. As a result, the VHDL models are much more difficult to parse than the Verilog-HDL models.

The Synopsys Design Compiler infers "Designware cells" from arithmetic operators used in the RTL, including '+', '−', '*', '<', etc. Those cells do not appear in the VHDL models, but are modeled through process statements, as in the following example:

```
add_369_plus : process    (UCONV_TIMEOUT_LOP_3_
                          port,UCONV_TIMEOU
                          T_LOP_2_port,UCONV_
                          TIMEOUT_LOP_1_port,
                          UCONV_TIMEOUT_LOP_0_port,
                          i_2_port, i_0_port)
    variable A : SIGNED( 3 downto 0 );
    variable B : SIGNED( 3 downto 0 );
    variable Z : SIGNED( 3 downto 0 );
begin
    A := (UCONV_TIMEOUT_LOP_3_port, UCONV_TIMEOUT_
        LOP_2_port, UCONV_TIMEOUT_LOP_1_port,
        UCONV_TIMEOUT_LOP_0_port );
    B := (i_2_port, i_2_port, i_2_port,
        i_0_port );
    Z := A + B;
    ( ARG2489_3_port, ARG2489_2_port, ARG2489_1_port,
    ARG2489_0_port ) <= Z;
end process;
```

Thus, the names of DesignWare cells that are used in the generic netlist cannot be found in VHDL models. Moreover, a specific Synopsys license, referred to as "VHDL writer", is needed to use the "write-format vhdl" command.

Design Compiler provides a command language named "dc_shell". All objects of the generic netlist created by the elaborate command can be accessed through the following dc_shell commands:

"current design"—to set the context to a given module;

"find"—to search for design objects like cells, pins and nets;

"all_connected"—to search for the net connected to a given pin/port, or for the pins/ports connected to a given net; and "get_attribute"—to access design objects attributes, like direction of pins (input, output, input/output).

From the software development prospective, dc_shell is quite limited because procedures are not supported, all variables are global, recursion is not supported (this is an important issue, because designs consist in trees), and runtime performance is very low. Therefore, dc_shell is not an appropriate language for complex applications like RTL analysis.

Figure 12:
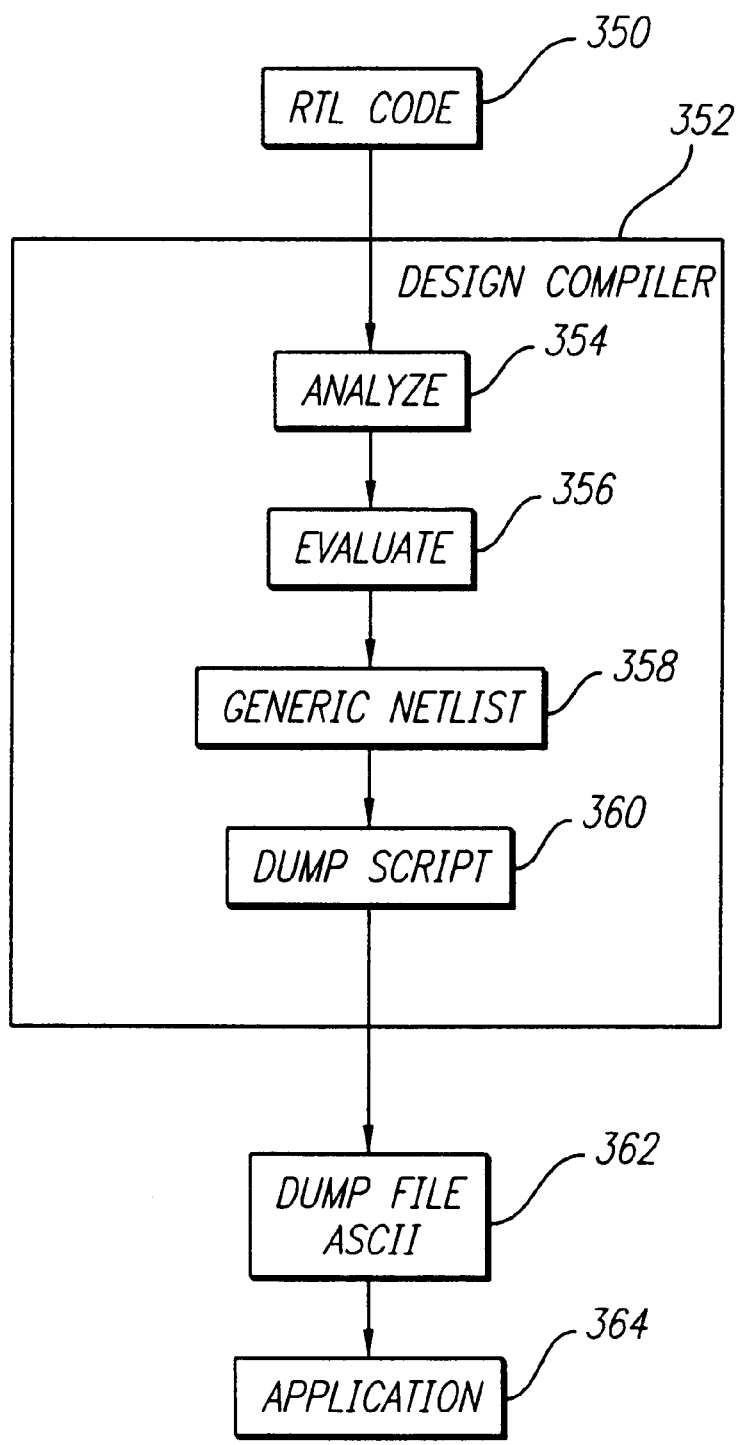
FIG. 12 illustrates a preferred process of translating an RTL code into a generic netlist.

Referring to FIG. 12, a preferred process of translating an RTL code into a generic netlist and extracting the generic netlist is illustrated.

The RTL code 350 is read in by the Design Compiler 352 to be processed. The analyze command 354 causes the Design Compiler to parse the RTL code and to create binary files. The elaborate command 356 causes the Design Compiler to build a generic netlist from the binary files. After the elaborate command, the generic netlist 358 is resident within the workspace of the Design Compiler 352, but not outside of the Design Compiler's workspace.

The generic netlist 358 is then read by the dump script 360 and an ASCII "dump file" 362 is created. The script that creates the ASCII file containing the generic netlist representation of the IC design is referred to as "dump script". The ASCII file 362 itself is referred to as "dump file" because it is a "dump" of the generic netlist that the design compiler produced within its own work space. The results of the execution of the dump script is the dump file 362 which exists outside the Design Compiler's workspace and is available for analysis outside the design compiler 352.

A script is a set of commands understood by the environment in which the commands operate. In this case, a script is a set of commands which is understood and can be executed by a design compiler. In the preferred embodiment, a script is a set of dc_shell commands, and each of the elements of the set is a command for the dc_shell. The script is submitted or presented to the command environment, dc_shell, to be executed.

The following is the outline of the dump script 360 implemented for the Synopsys Design Compiler. It writes out the generic netlist available in the Design Compiler's workspace for the current design, set through using the "current_design" command. A variable named "dump_file" contains the name of the target ASCII file.

Find all input ports of current design
For each input port
    Search for net connected to input port
    Write out port name, port direction and connected net
    end for
Find all output ports of current design
For each output port
    Search for net connected to port
    Write out port name, port direction and connected net
    end for
Find all cells of current design
For each cell
    Search for is_hierarchial attribute of cell
    Search for ref_name attribute of cell
    Find all cell pins
    For each cell pin
        Search for direction of pin
        Search for net connected to pin
        Write out pin name, pin direction and connected net
        end for end for An example of the dump script as implemented for the Synopsys Design Compiler is reproduced as Appendix A1 attached hereto. Also, an example of the ASCII dump file produced by the dump script of Appendix A1 is reproduced as Appendix A2 attached hereto.

The dump script technique used to extract the generic netlist from a Design Compiler has several benefits. First, no additional Synopsys license is required. The dc_shell language is always provided with the basic Design Compiler license. Accordingly, both Verilog-HDL users and VHDL users can run the dump script, without acquiring an additional tool license.

Second, all objects of the generic netlist can be accessed. As described above, the "write-format verilog" and "write-format vhdl" commands both represent some cells as behavioral constructs, making for instance name and pin names non-available for those cells.

Third, directions of pin cells can be accessed. As described above, the "write-format verilog" command does not provide pin directions.

Fourth, other useful information can be accessed. In particular, the boolean attribute "is_hierarchical" is available to indicate whether a cell is hierarchical. A hierarchical cell is defined as an instance of a module that has sub-modules (hierarchy below). This information cannot be obtained with the "write-format verilog" and "write-format vhdl" commands.

Finally, because the dump file is available outside the design compiler, the design can be fully analyzed using complex applications. Inside the Design Compiler, only the dc_shell commands are available to analyze the design. The dc_shell language is used only to access objects of the generic netlist and create the dump file. Outside the Design Compiler, applications may be built using powerful programming languages, like C or C++, to analyze the design as represented by the dump file.

It must be noted that mapped netlists can be loaded using Design Compiler's "read" command, then written out using the dump script. Netlists in formats supported by Synopsys, including Verilog-HDL, VHDL, Edif and NDL (LSI Logic format), can thus be translated to the dump file format.

All types of input design descriptions that are supported by the synthesis tool can be can be mixed for describing the same design. For example, it is possible to handle designs that mix Verilog-HDL code and VHDL code, a need that is sometimes encountered. It is also possible to mix RTL modules described in Verilog-HDL or/and VHDL with gate-level modules that use any type of netlist description, like Verilog-HDL, VHDL, Edif, and NDL (LSI Logic format).

Synopsys binary files, referred to as "DB files" can be loaded using Design Compiler's "read" command, then written out using the dump script. Those DB files can contain unmapped designs, or mapped designs, or a mix of unmapped and mapped designs.

In addition to the script reproduced above, two additional scripts have been created. First, the "dump-all script" dumps all the designs that have been loaded in the design compiler's workspace. This script uses the command "find(design, "*")" to obtain a list of all loaded designs. This is the command provided by dc_shell to obtain a list of all the designs that are present in the work space. Each design on the list is then dumped, using a loop.

Second, the "dump-tree script" dumps all the designs within the tree under a given top-level. This script uses the command "find(design-hierarchy, <top-level>)" to obtain a list of all designs that are under design <top-level>. This is the command provided by dc_shell to obtain a list of all the designs that are present in the work space in the design tree under a given module. Each design on the list is then dumped, using a loop.

Both the dump-all script and dump-tree script call the basic dump script, that writes out the generic netlist for the current design.

1. Faster Dump Script

For large designs, writing Design Compiler's database into an ASCII file using the dump script can be CPU intensive. Typically, it will take 4 to 5 hours on a Sun/Ultra-II workstation for a 350 kGates design.

To decrease the time required to dump the file, two techniques are utilized to modify the dump script as outlined above for a faster dump script file. The first approach is applicable when working with lists. When attributes are needed for some design objects, the "get_attribute" dc_shell command can be applied to a list of objects, instead of being applied sequentially to each object. The command then returns a list of attributes that match the list of objects one-to-one, and that is written out with a single "echo" command. This process is faster than loops that use the "get_attribute" command on a single object at a time. This technique can be applied to:

Direction attributes for a list of ports that belongs to the current design;

Direction attributes for a list of pins that belongs to a given cell;

Hierarchical/not-hierarchical attributes for a list of cells; and reference name attributes for a list of cells (names of instantiated modules).

Second, the "all_connected" command, which returns the net connected to a given pin/port or the list of pins/ports connected to a given net, consumes significant amounts of CPU time. The number of calls to that command can be reduced through describing nets explicitly in the dump file as lists of connected pins/ports, instead of searching for nets connected to each pin/port. A "fast dump script" has been designed to take advantage of this fact. These two approaches have been used to improve run times. The following is an outline of another embodiment of the dump script 360 of FIG. 12:

Find all input ports of current design
Search for direction attributes of port list
write out port list
write out direction list
Find all cells of current design
Search for is_hierarchial attributes of cell list
Search for ref_name attributes of cell list
write out cell list
write out is_hierarchial list
write out ref_name list
For each cell pin
   Find all cell pins
   Search for direction attributes of pin list end for
Find all nets of current design
For each net
   Search for list of connected pins/ports
   Write out net name
   Write out list of connected pins end for An example of the fast dump script as implemented for the Synopsys Design Compiler is reproduced as Appendix A3 attached hereto. Also, an example of the ASCII dump file produced by the dump script of Appendix A3 is reproduced as Appendix A4 attached hereto.

A disadvantage of the fast dump script is that it creates dump files that are not fully human readable, because they contain lists of objects and associated attributes that have to be matched one-to-one. Parsing remains trivial though. An example of dump file created by the fast dump script is given in Appendix A4.

2. Using TCL (the exTensible Command Language)

Yet another technique to decrease the time required to create the dump file is to utilize the TCL (the exTensible Command Language) available in the public domain. The basic idea is to store object names in associative arrays that are provided by TCL, in order to avoid calling dc_shell to query the same information several times. When information is needed, associative arrays are searched for the required information. If it is not available, dc_shell is called to obtain it. The information is then saved in associative arrays for further re-use, with fast access times. This principle can be applied to the "is_hierarchical" and "ref_name" cell attributes, and to names and directions of cell pins. As the same types of cells are instantiated a large number of times, a significant amount of time can be saved.

The complete listing of a dump script based on TCL, referred to as "TCL dump script", is given in Appendix A5. The obtained dump files are at the same format as files created by the script, and are fully human readable (see Appendix A2 for an example).

The TCL dump script has minor disadvantages:

TCL and a number of extensions have to be installed. All this software is public domain though, and is free of charge.

When a cell is encountered for the first time, its list of pins is stored in associative arrays. For all further occurrences of the same cell, the list of pins is read back from associative arrays. Therefore, although there are no obvious reasons for this to happen, cells with identical names and different pin sets cannot be detected, and can lead to inconsistencies in the dump file.

Results obtained with the various dump scripts for a 350 kGates design are summarized Table 1 below. CPU times are for a Sun/Ultra-II workstation.

TABLE 1

Run times of various dump scripts

| Type of script | CPU time (Hours:Minutes) | Human readable dump file |
|---|---|---|
| Dump script | 5:45 | Yes |
| Fast dump script | 2:19 | No |
| TCL dump script | 0:50 | Yes |

C. VEGA SYSTEM OVERVIEW

Once the dump file, representing the IC design, is created, the information contained in the dump file can be parsed, analyzed, and various useful functions can be performed. Disclosed herein is a system to read and parse the dump file and produce analysis reports and scripts for an efficient synthesis of the IC design. The system extracts design information and creates RTL analysis reports and logic synthesis scripts. Although the present invention is disclosed in terms of the Synopsys Design Compiler, the techniques disclosed herein is applicable to any design compilers, such as AMBIT.

Figure 13:
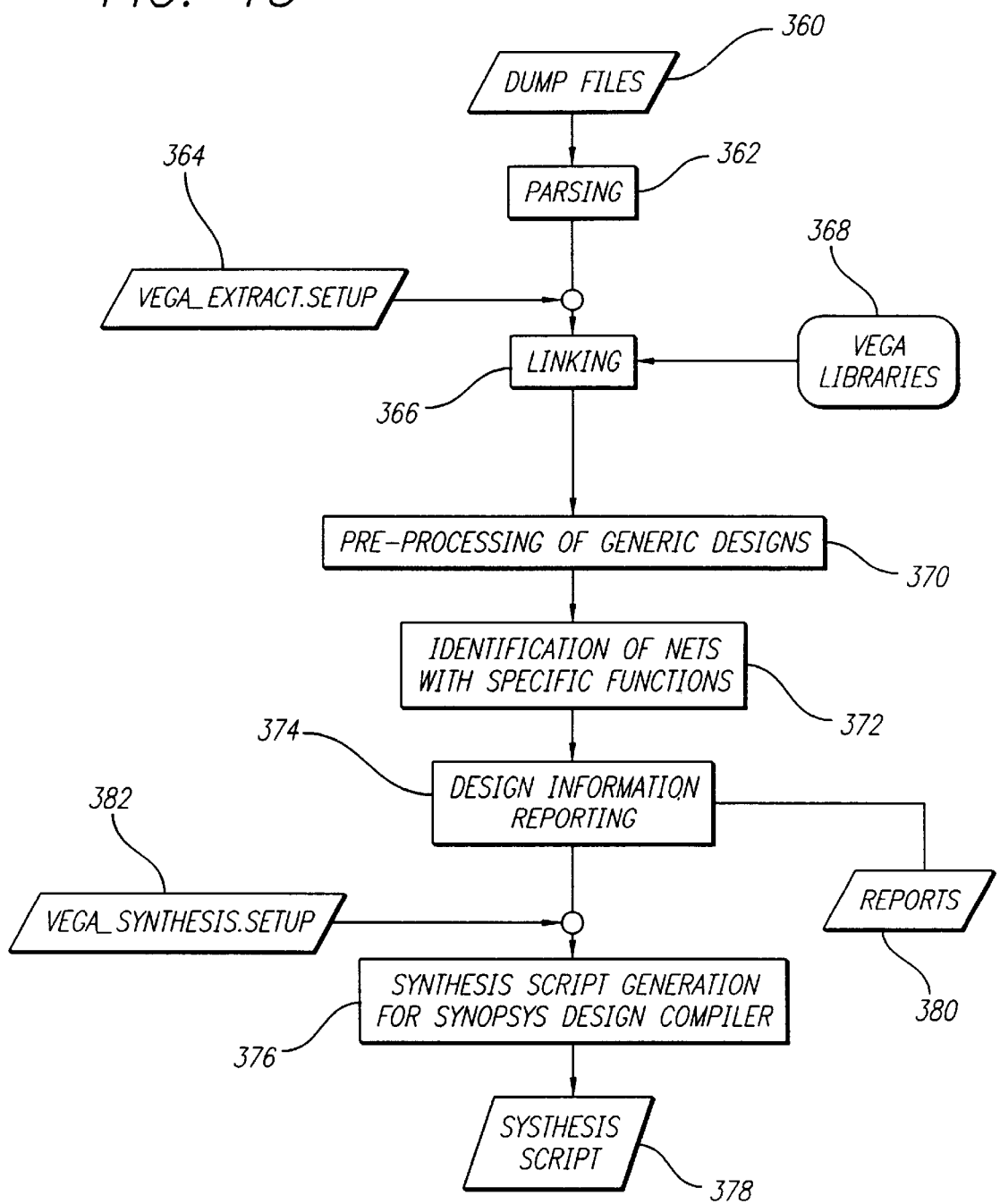
FIG. 13 illustrates an overview of the system.

FIG. 13 illustrates an overview of the VEGA system. A preferred embodiment of the system is implemented based on Synopsys, and has the following properties:

The input dump file 362 may be of any format sufficiently describing the IC design. In the preferred embodiment, the dump file 362 is the ASCII dump file of the generic netlist generated by the dump script from Synopsys as described above; and the synthesis scripts the tool generates are Design Compiler scripts ("dc_shell" scripts).

As described above, it is preferred that RTL analysis uses the generic netlist created by the target logic synthesis tool as its input description, rather than the RTL code itself; however, the use of the generic netlist is a mere preference in the current implementation. In fact, any input format is sufficient if the input format sufficiently describes the underlying IC design. The generic netlist created by "translation" represents the "synthesis view" of the RTL code, and reflects interpretations of the RTL code that may be made by the target synthesis tool.

Input files 162 to VEGA are dump files described herein are created using the dump script described in the same disclosure. Dump files are ASCII files that contain a human-readable description of Design Compiler's generic netlist.

Continuing to refer to FIG. 13, dump files 362 are read in, using a parser 363 that builds a data structure to represent the design information they contain. This data structure is optimized for fast information query.

Then, a setup file 365 named "VEGA_extract.setup", is read in. This file is available for VEGA users to configure and drive design information extraction and reporting. The setup file is discussed in further detail below.

The IC design loaded from dump files 363 are "linked" 366 to VEGA libraries 368. The linking process 366 comprise the steps of matching, or mapping, all cells of the dump files 360 with cells described in a library 368. VEGA libraries 168 contain descriptions of Synopsys Design Compiler cells that are used in generic netlists created by the "elaborate" command, and of LSI Logic technology cells that are used in mapped designs or mapped design pieces. Linking to libraries allows identification of all cells used in dump files, together with their pins that have special functions, like clock pins, clear pins, RAM write enable pins, etc.

The next step in the VEGA process is to pre-process 370 the generic cells. This step applies only to designs that were built from RTL code by Design Compiler's "elaborate" command. It consists in cleaning up designs through removing cells that drive nothing and nets that are either unloaded or undriven, and in extracting the function of sequential cells. Design Compiler represents all generic flipflops and latches as instances of a component named "SEQGEN". Depending on how the pins of a "SEQGEN" cell are used, the cell implements either a flipflop or a latch.

Following the pre-processing 370 of the generic cells, nets with specific functions are identified 372, including multiply-driven nets, clock nets, asynchronous reset nets, and RAM write enable nets.

Design information reports 380 are created 374. Various reports which can be generated are described in detail in the following sections. Finally, synthesis scripts 378 are generated 376.

The "VEGA_extract.setup" file 376 can be used to bypass design information reporting, through inserting an appropriate line of command. In a similar way, the "VEGA_synthesis.setup" 364 file can be used to bypass synthesis scripts generation.

At each of the above described steps, the VEGA system provides status messages to the operator of the VEGA system. These messages can be directed to the console or to a log file. Examples of messages displayed by VEGA when processing a design are given in Appendix B.

D. RTL ANALYSIS USING A GENERIC NETLIST RATHER THAN THE RTL CODE

As discussed above, RTL code in Verilog or VHDL can be parsed in order to identify key hardware elements. Such key hardware elements can include flipflops, latches, tristate buffers, bidirectional buffers and memories. With respect to these key hardware elements, key pins with the elements' active edges or levels can also be identified.

For example, with regard to a flipflop, the following information can be extracted: The data input pin; the clock pin with an active edge (rising or falling), a clear pin with an active level (low or high); and a preset pin with active level (low or high).

In addition to the key hardware elements, interconnections between hardware elements must be understood. Finally, the function of the clouds, or sets, of combinational logic needs to be understood to some extent, so that RTL analysis is able to track design issues.

Figure 33:
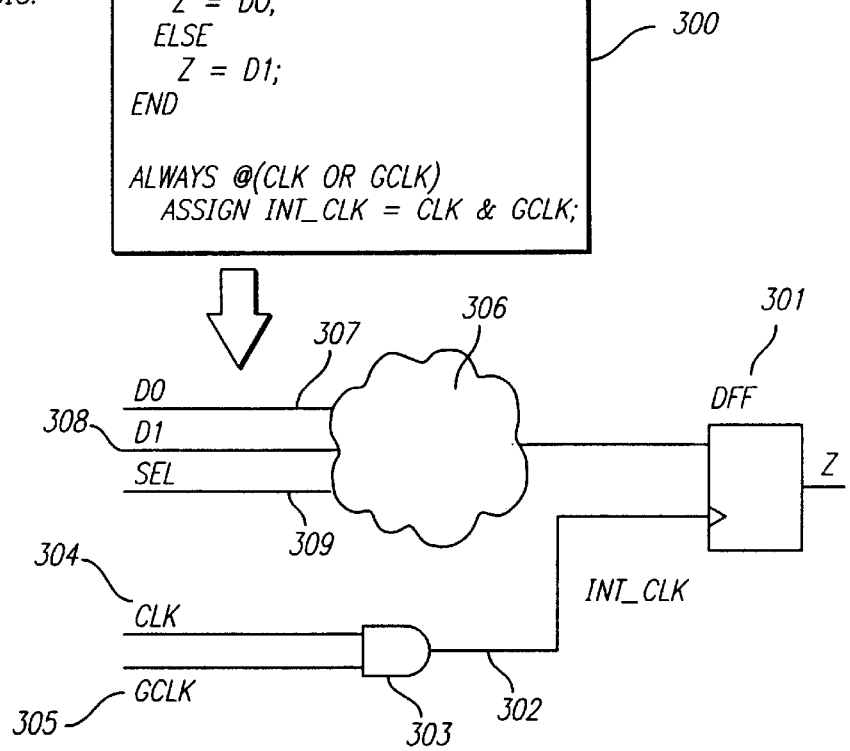
FIG. 33 is an example of RTL code and equivalent hardware view for the RTL analysis.

For example, referring to FIG. 33, the Verilog-HDL code given in box 300 implies that signal "Z" is the output of a flipflop 301, that is clocked on by signal "INT_CLK" 302 created through gating 303 signals "CLK" 304 with "GCLK" 305. This information is critical from the RTL analysis prospective because it indicates a gated clock (this hardware structure is the definition of a gated clock). On the other hand, the exact function of the combinational cloud "C" 306 is not necessarily needed. Knowing that its inputs are "D0" 307, "D1" 308 and "SEL" 309 could be sufficient.

One approach to building the hardware view needed for RTL analysis is to process directly the RTL code and create a specific data structure to represent it. RTL code is technology-independent, and is also supposed to be independent from design tools. So RTL analysis could focus on HDLs, supporting both Verilog-HDL and VHDL, which are the two standard languages currently in use in the industry. However, it may be more advantageous to analyze the IC design further down the design cycle.

However, by utilizing the RTL code directly for design analysis, key design issues can be missed. This is because Verilog-HDL and VHDL were both developed as simulation languages, before logic synthesis tools were made available, and have no formerly-defined synthesis semantics.

Preferably, therefore, instead of processing the RTL code, RTL analysis can process a "generic netlist" created by the target logic synthesis tool through "translation", which is the first step of logic synthesis.

1. Examples of Design Issues That Can Be Missed When Directly Using the RTL Code As mentioned above, some key design issues can be missed if RTL analysis directly extract information from the RTL code. Because the synthesis semantics of Verilog-HDL and VHDL was not formerly defined, logic synthesis tools can sometimes interpret RTL code in multiple ways. Several representative examples are provided in the following paragraphs.

a. Register with Partial Asynchronous Reset

Flipflops that have an asynchronous reset, either clear or preset, have a larger area than flipflops that do not have an asynchronous reset. As the number of flipflops in a design can be high, when die size is a critical issue, designers often optimize the number of flipflops that have an asynchronous reset. The objective is to minimize the number of flipflops with asynchronous reset, while making sure that gate-level simulation can successfully proceed after activating reset signals.

Figures 34A, 34B, 34C:
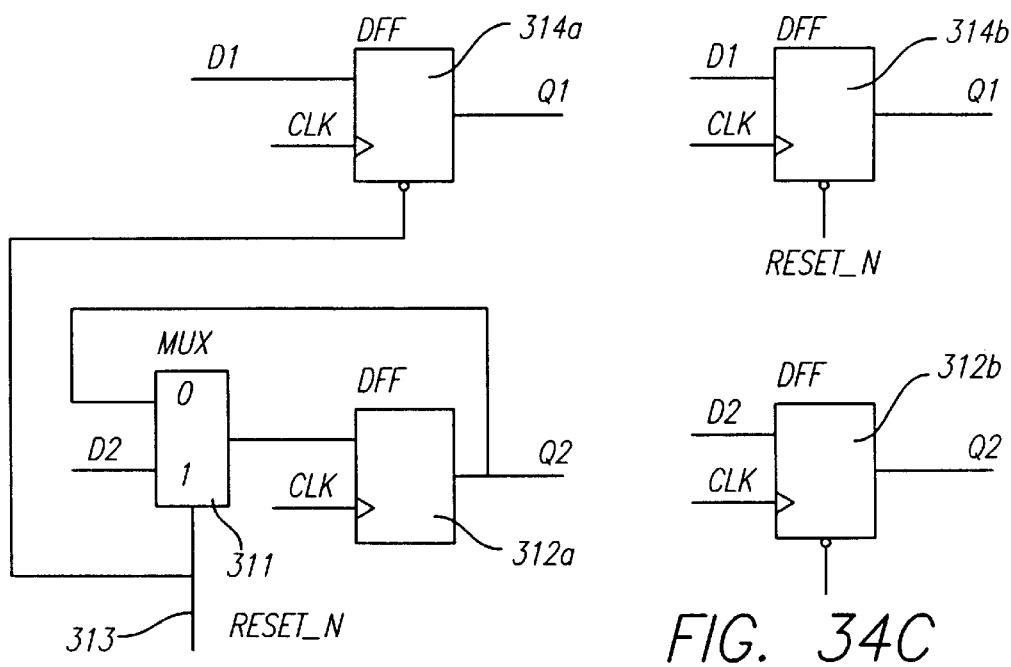
FIG. 34A illustrates the most intuitive PTL model for a register with partial asynchronous reset.
FIG. 34B shows how Synopsys Design Compiler maps the VHDL code of FIG. 4A to a target technology.
FIG. 34C shows how AMBIT BuildGates maps the same piece of VHDL code to a target technology.

Using VHDL, the most intuitive RTL model for a register with partial asynchronous reset is illustrated in FIG. 34A (Verilog-HDL could be used instead of VHDL with the same conclusions). In this example, the register includes two flipflops "Q1" and "Q2". "Q1" can be reset asynchronously, through setting signal "RESET_N" to logic zero. "Q2" cannot be reset. Most designers would model partial asynchronous reset this way, and would expect the logic synthesis tool to use a flipflop with clear for "Q1",and a flipflop with no clear for "Q2".

FIG. 34B shows how Synopsys Design Compiler maps the VHDL code 310 of FIG. 34A to a target technology. A multiplexer 311 is used to hold the value of "Q2"312a when "RESET_N" 313 is low. This configuration obviously has a larger gate count than a flipflop with clear and a flipflop with no clear. It also has a larger gate count than two flipflops with an asynchronous reset, and involves more wires with all associated issues, including routing, delays, etc. Q1 314a is reset by signal RESET_N 313.

FIG. 34C shows how AMBIT BuildGates maps the same piece of VHDL code 310 to a target technology. This time, the hardware has the structure that most designers would expect, that is a flipflop 314b with clear for "Q1" and a flipflop 312b with no clear for "Q2". It should be noted that this issue is not VHDL-specific. A similar RTL model could be written using Verilog-HDL, and the results would be identical.

None of Design Compiler and BuildGates can be declared as being "right" or "wrong" in this situation. First, Design Compiler favors consistency of RTL and gate-level simulation. Strictly looking at the VHDL model 310 of FIG. 34A, "Q2"cannot change value when "RESET_N" is low. This is implemented at the gate-level through using a multiplexer that holds the value of "Q2" when "RESET_N" is low. But this implementation is not the one most designers would expect for such a model.

Second, BuildGates favors the designer prospective. It does create the implementation that most designers would expect. But RTL and gate-level simulations can diverge. If there is a rising edge of "CLK" when "RESET_N" is low, "Q2" cannot change value in the RTL model, but can change value in the gate-level implementation.

This is a typical case in which different logic synthesis tools can interpret the same RTL code in multiple ways. Therefore, decisions made by the target logic synthesis tool cannot necessarily be analyzed with the RTL code by itself.

b. Unconnected Pins on Module Instances

Both Verilog-HDL and VHDL do not require that input pins of instantiated modules are connected to any net. As a result, some module input pins can be left unconnected when modules get instantiated.

Figure 35A:
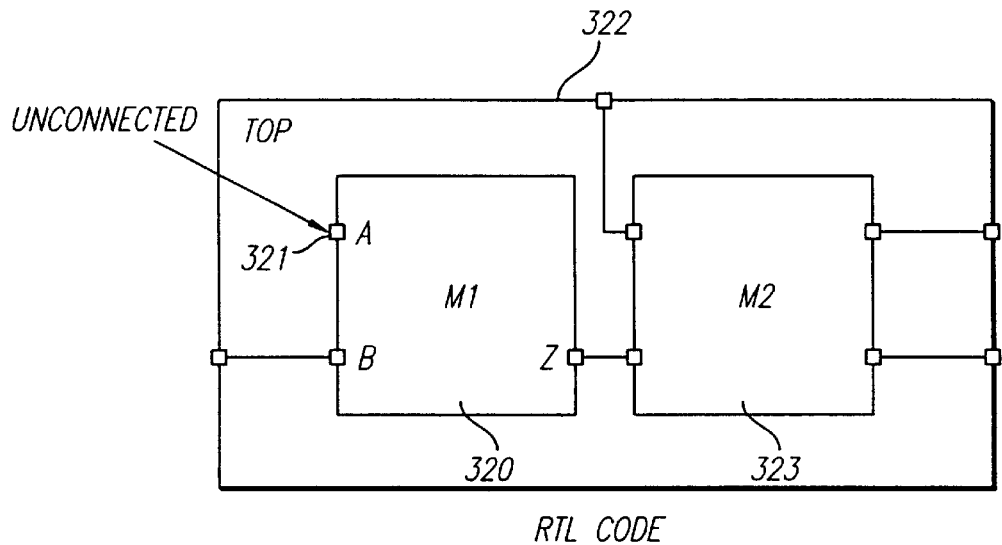
FIG. 35A shows an example of module with unconnected input pins.

FIG. 35A shows an example of module 320 with unconnected input pins 321. Module "M1" 320 instantiated in module "TOP" 322 has its input pin "A" 321 left unconnected in the context of module "TOP" 322. Module M2 323 does not have any unconnected pins.

Figure 35B:
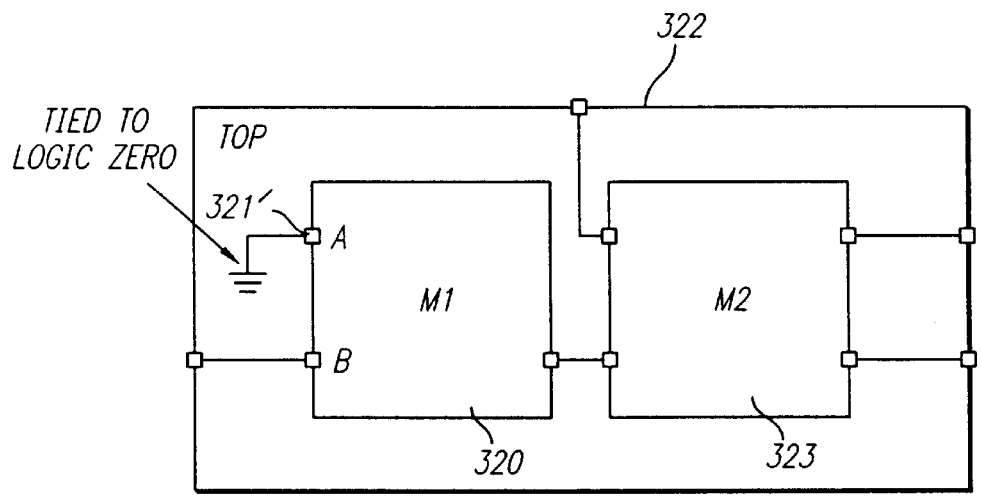
FIG. 35B shows how Synopsys Design Compiler ties unconnected module input pins to logic zero.

Synopsys Design Compiler ties unconnected module input pins to logic zero (FIG. 35B). During synthesis, the logic is simplified based on this assumption. Only a warning is issued to tell users that unconnected input pins have been tied to zero. Referring to FIG. 35B, the unconnected pin 321 is now connected to ground, a logic zero, in this example.

This is an arbitrary decision that is made by the logic synthesis tool and that is not present in the RTL code. Different logic synthesis tools can make different choices, like for example leaving pins unconnected without simplifying logic during synthesis, or tieing them to logic one. Here again, decisions made the target logic synthesis have to be analyzed instead of the RTL code itself.

c. Enumerated Types in VHDL

VHDL supports "enumerated data types", which are defined as lists of abstract user-defined values. Enumerated types are typically used to model state vectors of state machines. For example, Appendix K shows a state machine with a state vector defined as an enumerated type:

type TYPE_STATE_VECTOR is (IDLE, WAIT_FOR_WINDOW, IN_WINDOW, ERROR_SEEN);

signal STATE_VECTOR : TYPE_STATE_VECTOR;

Enumerated types have no direct hardware representation since they are just lists of abstract values signals can hold. Therefore, logic synthesis tools have to decide on a binary encoding for those values. By default, logic synthesis tools encode enumerated types using a compact code, based on the declaration order of values in the enumeration list. For the example of Appendix K, the following encoding would be used:

IDLE "00"
WAIT_FOR_WINDOW "01"
IN_WINDOW "10"
ERROR_SEEN "11"

Synopsys Design Compiler provides a specific VHDL attribute that can be used to enforce a different encoding style. For the example of Appendix K, the following VHDL declarations could be used:

attribute ENUM_ENCODING : STRING;
type TYPE_STATE_VECTOR is (IDLE, WAIT_FOR_WINDOW, IN_WINDOW, ERROR_SEEN); signal STATE_VECTOR : TYPE_STATE_VECTOR;
attribute ENUM_ENCODING of TYPE_STATE_VECTOR: type is "0001 0010 0100 1000";

This would result in the following encoding for the state vector, that is referred to as "one-hot encoding":

IDLE "0001"
WAIT_FOR_WINDOW "0010"
IN_WINDOW "0100"
ERROR_SEEN "1000"

The "enum_encoding" attribute has no effect on the simulation behavior of VHDL models. It is specific to Synopsys Design Compiler, and considered as a comment by other logic synthesis tools that will ignore it. As a result, the number of flipflops used to represent enumerated types in hardware cannot be predicted in a reliable manner through analyzing the VHDL code. Decisions made by the target logic synthesis tool have to be analyzed instead.

Figure 36:
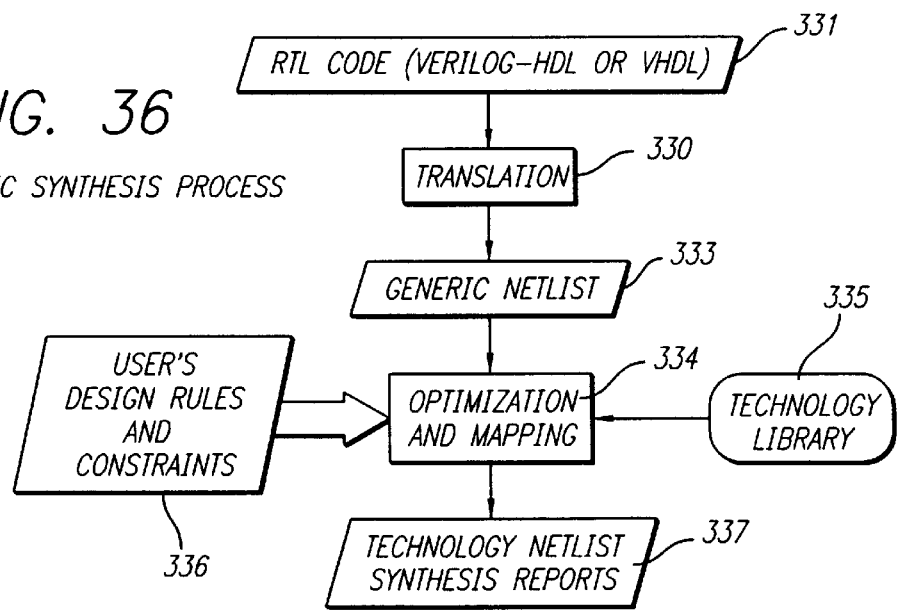
FIG. 36 illustrates the logic synthesis process.

2. RTL Code Translation and Generic Netlists Created by Logic Synthesis Tools The process used by the logic synthesis tools can be modeled as a two-step process as illustrated by FIG. 36. First, the "translation" step 330 transforms the RTL code 331 to a "generic netlist" 333, i.e.,a netlist that instantiates abstract cells that do not belong to any particular technology library referred to as "generic cells". The "optimization and mapping" step 334 then optimizes the generic netlist 333 using boolean and algebraic optimization and then maps it to the target technology library 335 based on constraints and design rules 336 that are specified by the user. The generic cells that are instantiated in generic netlists 333 are similar to cells used in technology netlists 337, for example, basic gates, multiplexers, flipflops, latches, etc.

From the RTL analysis prospective, the key aspect of generic netlists created by translation is that they fully describe the "logic synthesis view" of the RTL code. All choices associated with constructs that do not have uniquely-defined synthesis semantics and all decisions that are made by the target logic synthesis tool are reflected in those netlists.

In particular, generic netlists created by translation reflect the following:

All decisions made to make sure that RTL and gate-level simulations are consistent. This includes "latch inferring", that consists in using latches to store the value of combinational outputs under some input conditions that are not covered in the RTL code (Verilog-HDL and VHDL signals retain their current value until they get modified). This also includes partial asynchronous reset, that has been described above.

All decisions made to map complex abstract types offered by VHDL onto hardware structures. This includes enumerated types that have been described above, and also record types and array-of-array types; and All kinds of arbitrary design decisions made by the logic synthesis tool. This includes unconnected module input pins in RTL code, that get tied to logic zero in logic synthesis.

It must be noted that tracking some specific issues can also require some knowledge about the target technology library. In particular, this is the case for latches that are modeled in the RTL code as having an asynchronous reset, either clear or preset. This information is of course reflected in the generic netlist. But if the target technology library does not include latches with asynchronous reset, most logic synthesis tools will implement them using the enable pins of latches together with some gates. On silicon, such an implementation can only fail, because of signal races due to delays introduced by wires. This is a well known cause for chip failure, and an example of such circuit is illustrated in FIG. 37.

Referring to FIG. 37, a failing implementation of a latch with clear signal is illustrated. The latch 390 receives its data from an AND gate 391. In the example of FIG. 37, a reset signal 393 is implemented using an enable signal 394 with a NAND gate 392. This implementation fails.

3. Correlation of RTL Code and Generic Netlist Objects

Performing RTL analysis based on generic netlists created by the target logic synthesis tool instead of the RTL code raises a correlation issue. Reports created by RTL analysis tools will then be based on objects of the generic netlist and not on constructs of the RTL code. But designers actually need to be able to identify design issues in the RTL code so that they can understand how issues were created and how they could be fixed.

Translation creates generic netlists through mirroring the RTL code. Templates in the RTL code, that are based on basic statements and constructs of the HDL, are transformed in a straightforward manner to equivalent hardware structures. Some examples of such transforms are illustrated FIG. 38.

Referring now to FIG. 38, examples of transforms used for RTL code translation to hardware structures are illustrated. HDL statements and constructs 400, 402 and 404 are transformed to a hardware equivalents 400', 402' and 404'. The hardware structure 400' implements the HDL construct 400 using a multiplexer 406 receiving data inputs D0 and D1 and providing output Z, the selection between D0 and D1 is performed by an OR gate 408 having signals A and B as inputs. The hardware structure 402' utilizes a 4×1 multiplexer 410 used to selecting four possible inputs as the output. The addition, the substraction, the AND functions, and the XOR function are implemented by an ADD circuit 412, a subtractor circuit 414, an AND gate 416, and an XOR gate 418, respectively. The hardware structure of 404' utilizes a flipflop 420 which is reset by negative edge of signal RESET_N 421.

Names of objects in the RTL code are used as much as possible to name objects in generic netlists because:

RTL-code names for modules are always retained;

RTL-code names for module I/O ports are always retained;

RTL-code names for signals, that become nets in generic netlists, are always retained; and Cells of generic netlists, that do not exist in RTL code, are named based on the RTL-code names of signals they generate and on naming rules. For example, Synopsys Design compiler names flipflops and latches through adding an "_reg" suffix to the RTL-code names of signals they generate.

VHDL signals that use abstract data types are mapped to net names using straightforward naming conventions, that can be re-defined by users. Appendix L shows examples of net names created by Synopsys Design Compiler for RTL-code abstract-type signals.

Because of those naming conventions and because the structure of the generic netlist mirrors the structure of the RTL code, design issues that are reported in terms of objects of the generic netlist can be easily correlated with corresponding constructs in the RTL code. The VEGA system uses the generic netlist created by Synopsys Design Compiler.

4. Benefits of the Netlist Analysis

As described above, working from generic netlists created by the target synthesis tool rather than from the RTL code itself better ensures that design issues will not be missed. In addition to fulfilling this requirement, the approach that has been described has additional substantial benefits as listed below:

First, there is no need to develop analyzers for RTL models in Verilog-HDL and VHDL because RTL code analysis is performed by logic synthesis tools. Developing analyzers for Verilog-HDL is a significant task. For VHDL, because of the sophisticated compilation mechanisms and complex data types the language provides, it becomes an ambitious project that requires language and compiler construction expertise.

Second, RTL code that instantiates some components from a target technology, which is quite a frequent situation, is easily handled. RTL analysis always works on netlists, that instantiate either generic or technology cells. The architecture of RTL analysis tools is then simplified, together with required algorithms.

Third, RTL code analysis tools can be used to investigate designs that have been mapped to a generic library, like for example the Synopsys GTECH library. Mapping RTL code to a generic library, that does not involve any timing and design rules, is at least one order of magnitude faster than synthesizing to a technology library. The obtained netlist is closer to a technology implementation than the generic netlist created by translation, because gates are less abstract (in particular multiplexers) and arithmetic operators are built from gates (instead of consisting in high-level cells like N-bit adders and subtractors). An implementation to a generic library is appropriate to obtain better gate-count and fanout estimates, that are more accurate than estimates based on the generic netlist created by translation. It can also be used to track technology-specific issues, like failing implementations of latches with asynchronous reset that have been described above. Correlation with RTL code is more difficult though, due to re-structuring, boolean and algebraic optimizations, name changes, and mapping of arithmetic operators to gates.

Finally, RTL analysis tools can also be used for designs that are fully mapped to a technology library. In this case, the netlist only instantiates technology cells. Analysis tools for mapped designs have a lot of value, in particular to analyze netlists delivered by customers for sign-off.

E. RTL Design Analysis and Reporting

The analysis performed and the reports 380 of FIG. 13 produced by the VEGA system includes the following analysis and reports:

1. Design Checks Analysis and Report

RTL DRC (Design Rule Checking), that consists in checking the design for basic rules as discussed above. Severity of DRC violations ranges from showstoppers to simple warnings.

For each module of the design that is being analyzed, the following checks are performed by VEGA, and reported in a file that is referred to as "design checks report":

Ports that are directly connected together, including "feedthroughs" that are direct connections of an input port to an output port. Ports connected together used to be a problem for some EDA tools. Today, most tools can deal with them, and just issue warnings. In RTL, there is an output port that is assigned to an input port or to another output port. In generic netlist, there is a net connecting ports together. The user needs to modify the code, fix the design.

Bidirectional ports and pins. When developing RTL VHDL models, designers sometimes introduce bidirectional ports to deal with output ports that are both assigned and read in the same module. The "buffer" mode should be used for such ports, not the bidirectional "inout" mode. VEGA's list of all bidirectional ports and pins allows users to quickly check that bidirectional ports are used only when appropriate and make appropriate correction to the design. The direction of ports is explicit if the RTL code, and has to be declared when writing models. If the port mode is INOUT (both Verilog-HDL and VHDL), then the port is bidirectional. A bidirectional pin is a bidirectional port of a module that is instantiated. All this information is also available in the generic netlist.

Unconnected ports and pins. Some RTL coding errors, in particular when instantiating components, can show up as unconnected ports and pins. Most further design tools will issue warnings. In the generic netlist, no net is connected to the port or pin. In RTL code, the value of the port/pin is never read (used) if an input port/pin, and never written (assigned a value) if an output port/pin.

Ports and pins permanently tied to zero or one. Some RTL coding errors can show up as tied ports or tied pins. Testability issues can also be associated with tied ports and pins, and most further design tools will issue warnings. Synopsys Design 10 Compiler ties to zero input pins that have been left unconnected. So undriven input pins show up in VEGA's design checks report as pins that are tied to zero. In the generic netlist, ports and pins are connected to special nets called logic_0 and logic_1, that represent logical states zero and one. In RTL models, they are connected to signal that is assigned a constant value (either '0' or '1') or are directly assigned a constant if output pins/ports.

Nets that connect multiple pins on the same instance. Modules that have several input ports shorted together by external nets will get reported. In this case, the clarity of RTL code would require that multiple input ports shorted together are replaced with a single port. These nets are easily identifiable through examining sets of pins connected by inter-module nets in the generic netlist, or inter-module signals in RTL.

Floating nets that have no driver. A Y-pattern generator (DC current testing) may not handle floating nets, which have to be removed to run the tool successfully. Other design tools can also issue warnings on floating nets. Floating nets are identified in the generic netlist through looking at sets of pins connected to each net. If the net has no driving pin/port, it is floating. Floating nets can be introduced in RTL. For example, if you have a signal that is used but is never assigned a value. But such nets are arbitrarily removed or tied to zero by Synopsys Design Complier when building the generic netlist. In most cases, floating nets are introduced by the logic synthesis tool and are still there in the final netlist. So it really makes more sense to search for floating nets in the generic netlist.

Unloaded nets that drive nothing. Further design tools can issue warnings on unloaded nets. Errors forcing unloaded nets to be removed should not be encountered though. These nets are identified using the same technique used to identify the floating nets.

Appendix D1 gives an example of design checks report. Options are available in the "VEGA_extract.setup" setup file to control the generation of design checks reports, and are described in further sections.

2. Cell Analysis and Report

The "cell report" provides information about the types and numbers of cells that are used in each module.

For modules that consist in generic logic created through RTL code translation by Design Compiler's "elaborate" command, the following information is reported:

Total number of generic cells and total number of cell pins. The total numbers of cells and pins are much more relevant pieces of information, because they give a rough indication of the complexity of the module. VEGA counts the number of generic cells in the generic netlist for each module, and also counts and accumulates the number of pins on each cell. This gives a rough idea of the complexity of a module, which is used by designers to re-arrange the hierarchy and make it more suitable for synthesis. There are other ways to have rough estimates through searching for templates in the RTL and associate a gate-count with them. Designers can compile to the target technology without or with design rules and timing constraints to get better estimates.

List of Designware cells. Those cells contain arithmetic logic that is inferred from operators in the RTL code, like +', −' or *'. The complexity of Designware cells can be quite high, so it is important to provide a complete list of them. Names used by Design Compiler contain all the useful information, including the type of operator (adder, subtractor, multiplier, etc.), the sizes of operands, and the size of result. The Designware cells are easily identified in the generic netlist based on their naming style. For example, ADD_UNS_8_4_8 is an unsigned adder, with 8-bit and 4-bit operands and result on 8bit. VEGA actually uses libraries to identify DesignWare cells with pattern matching. For example, "ADD_UNS*n" is used to respresent unsigned adders. DesignWare cells would also be easy to identify in the RTL code. For example, in most cases, the '+' operator will indicate and adder. The knowledge of DesignWare components is used by designers to have an idea of the complexity of a module. DesignWare components can very significantly increase the gate count. Also, the designer may decide to retain or dissolve the specific modules that are created to encapsulate DesignWare logic.

List of technology cells. It is always important to have a close look at technology cells that have been instantiated by designers in the RTL code. A typical case are delay cells used to generate RAM write enable pulses. Special attention needs to be paid to those cells, both in synthesis and placement. This gives pointers to pieces of code where the RTL designers have done things that are tricky, potentially unsupported or causing problems later on. In particular, delay cells should be used only to build pulse generator for RAM write enables.

For modules that consist in mapped logic, the report provides the complete list of cells of the target technology that have been used.

Appendix D2 provides an examples of cell reports including (a) Hierarchical module, also containing a synchronous RAM;

((b) Generic module. Note the list of Designware cells, and the technology cell "DEL4" that has been instantiated in the RTL code to delay a signal by 4 ns; and ((c) Mapped module.

3. Design Hierarch Analysis and Report

A "design hierarchy report" provides an easy-to-read view of the design hierarchy, together with the following key synthesis-related information:

Module names are indented according to their depth relatively to the top-level of the design.

For each module, the total number of generic cells and the total number of technology cells used in the module are indicated, together with corresponding numbers of cell pins. The number of generic Designware cells is also indicated, and all memories are explicitly listed. This information can be used to obtain a rough indication of module sizes and re-arranging the design hierarchy to make it more suitable for synthesis.

The numbers of registered outputs and non-registered outputs is indicated for each module on the right hand side of the report. A module output is "registered" if it is driven by a flipflop, and is "non-registered" otherwise. When synthesizing a large design, modules with registered outputs can be characterized in a reliable way, and optimized efficiently through successive passes of top-down characterization and bottom-up re-compilation. Modules with non-registered outputs create flipflop-to-flipflop timing paths that span several modules, and are responsible for many synthesis issues.

The "hierarchy purity" of each module is indicated on the right hand side of the report, following numbers of registered and non-registered outputs. Possible values are "P" for pure hierarchy (sub-modules only), "M" for mixed (sub-modules mixed with logic), "L" for leaf module (logic only), and "E" for empty modules (no sub-design, no logic).

The depth of modules relatively to the top-level of the design is indicated on the right hand side of the report. This is the rightmost information. It helps reading reports for designs that have a complex hierarchy. Identifying modules at a given hierarchy depth can be done through searching for occurrences of the depth value. For example, modules located 3 levels below the top-level can be found through searching occurrences of the string d=3'.

A reading key is provided on top of the report to remind users how abbreviations that appear on the right hand side, like P', M', and L', should be interpreted.

Appendix D3a gives an example of hierarchy report for a generic design. Appendix D3b gives an example of design hierarchy report for a mapped design. Appendix D3c is another example of a design hierarchy report.

4. Multiply-driven Net Analysis and Report

As discussed above, multiply-driven nets are defined as nets that have several drivers, and include:

tristate nets;

bidirectional nets; and nets that have several drivers connected together "by accident".

The "multiply-driven net report" provided by VEGA gives the list of all connected ports and pins for each multiply-driven net that was extracted from the design. Nets are given an arbitrary number by VEGA. For each net, the report is organized in sections that correspond to the different modules where the net connects to ports and/or pins. Each section begins with the cell path (based on instance names) and the design path (based on instantiated module names) from top-level that identify the module. The list of all ports and pins that are connected to the net in the module are then given. If multiply-driven nets were accidentally created, then the RTL code must be modified.

Appendix D4a gives an example of multiply-driven net report. Net #1 has several drivers that are identified with a GTS' stamp on the right hand side, that stands for Generic TriState buffer. So the net is a tristate net. This is a normal situation, with all drivers being tristate buffers.

After mapping this design to a target technology, the multiply-driven net report would identify drivers of net #1 with an MTS' stamp, that stands for Mapped TriState buffer.

A reading key is provided on top of the report to remind users how abbreviations that appear on the right hand side, like GTS' and MTS', should be interpreted.

Appendix D4b gives another example of multiply-driven net report. VEGA highlights on the right hand side that the drivers of multiply-driven net #1 are not tristate buffers. The report shows that drivers are "SEQGEN" cells, which are either generic flipflops or latches. This clearly shows that a multiply-driven net has been created "by accident", through connecting two signals together. As described above, such situations can be encountered when using "std_logic" and "std_logic_vector" signal types in VHDL, that are resolved data types.

5. Clock Net Analysis and Report

Clock nets are reported in VEGA's "clock net reports", using the same principle as for multiply-driven nets. For each net, the report is organized in sections that correspond to the different modules where the net connects to ports and/or pins. Each section begins with the cell path and the design path from top-level that identify the module. The list of all ports and pins that are connected to the net in the module are then given. The source of each clock net and its fanout, which are key information for both design analysis and synthesis, are indicated in the header that introduces reporting of the clock net, together with the arbitrary number it was given by VEGA. See Appendix D5 for an example of a Clock Net Report.

On the right hand side of the report, the VEGA system provides information about the type of pin/port connected to the current clock net:

The pin/port that drives the net is indicated, using the NET SOURCE' stamp;

Connections to clock pins of flipflops are indicated, using the GFF' stamp for generic flipflops and the MFF' stamp for mapped flipflops. An additional stamp indicates the active edge of the clock pin, that can be either clk(R)' for the rising edge or clk(F)' for the falling edge.

Connections to enable pins of latches are indicated, using the GLH' stamp for generic latches and the MLH' stamp for mapped latches. An additional stamp indicates the active level of the enable pin, that can be either ena(H)' for the high level or ena(L)' for the low level.

Connections to clock pins of synchronous RAMs are indicated, using the SRAM' stamp. An additional stamp indicates the active edge, that can be either clk(R)' for the rising edge or clk(F)' for the falling edge.

Connections to input ports that are unused in the module they belong to are highlighted, using the  UNCONNECTED ' flag.

Connections to input pins that are not clock pins of flipflops, or clock pins of synchronous RAMs, or enable pins of latches, are highlighted using the  NOT A CLOCK PIN ' flag. Those flags can be searched by VEGA users to identify modules where clock signals get "manipulated", for example to implement gated clocks or multiplexed clocks.

A reading key is provided on top of the clock net report to remind users how stamps and flags that appear on the right hand side should be interpreted.

6. Asynchronous Reset Net Analysis and Report

Asynchronous reset nets are reported in VEGA's "asynchronous reset net report", in a similar way as clock nets. See Appendix D6. Information about the type of pin/port connected to the current asynchronous reset net appears on the right hand side of the report:

The pin/port that drives the net is indicated, using the NET SOURCE' stamp.

Connections to clear or preset pins of flipflops are indicated, using the GFF' stamp for generic flipflops and the MFF' stamp for mapped flipflops. An additional stamp indicates whether flipflops are cleared or preset together with the active level. For example, clear(L)' indicates a connection to a clear pin active on the low level, and preset(H)' indicates a connection to a preset pin active on the high level.

Connections to clear or preset pins of latches are indicated, using the GLH' stamp for generic latches and the MLH' stamp for mapped latches. As for flipflops, an additional stamp indicates whether latches are cleared or preset, and what is the active level.

Connections to input ports that are unused in the module they belong to are highlighted, using the  UNCONNECTED ' flag.

Connections to input pins that are not clear pins of flipflops or latches, or preset pins of flipflops or latches, are highlighted using the  NOT A CLEAR/PRESET PIN ' flag. Those flags can be searched by VEGA users to identify modules where reset signals get "manipulated". An example of application of this information is to make sure that asynchronous reset signals are controllable in scan mode.

A reading key is provided on top of the asynchronous reset net report to remind users how stamps and flags that appear on the right hand side should be interpreted.

7. Ram Write Enable Net Analysis and Report

RAM write enable nets are reported in VEGA's "write enable net report", in a similar way as clock nets and asynchronous reset nets. See Appendix D7. Information about the type of pin/port connected to the current write enable net appears on the right hand side of the report:

The pin/port that drives the net is indicated, using the NET SOURCE' stamp.

Connections to write enable pins of RAMs are indicated, using the RAM' stamp for asynchronous RAMs and the SRAM' stamp for synchronous RAMs. An additional stamp indicates that the pin is a write enable pin, together with the active level. For example, we(H)' indicates a connection to a write enable pin active on high level.

Connections to input ports that are unused in the module they belong to are highlighted, using the  UNCONNECTED ' flag.

Connections to input pins that are not write enable pins of asynchronous or synchronous RAMs are highlighted using the  NOT A WRITE ENABLE PIN ' flag. Those flags can be searched by VEGA users to identify modules where RAM write enable signals are generated. As described above, the logic used to create RAM write enable pulses generally must comply with chip manufacturer's guidelines. A reading key is provided on top of the RAM write enable net report to remind users how stamps and flags that appear on the right hand side should be interpreted.

8. Clock Hierarchy Analysis and Report

The "clock hierarchy report" is based on the design hierarchy, and its framework is similar to the design hierarchy report that has been presented above.

For each module in the design hierarchy, the report provides information about all clock nets that connect to ports of the module and/or are used inside the module, giving for each clock net. The clock nets and their hierarchy are easily identified by passing the RTL code or the generic netlist.

Names of connected ports.

Fanout seen for each connected port.

Number of connected clock pins of flipflops that are active on the rising edge.

Number of connected clock pins of flipflops that are active on the falling edge.

Number of connected enable pins of latches that are active on the high level.

Number of connected enable pins of latches that are active on the low level.

Connections to clock pins of synchronous RAMs, showing instance name, component name, pin name and active edge.

Number of connected input pins that are not clocks pins of flipflops, or clock pins of synchronous RAMs, or enable pins of latches, highlighted between **'strings.

The clock hierarchy report summarizes the clock net information, and gives an easy-to-read view of clock nets throughout the design hierarchy. It immediately shows modules that use multiple clocks, modules where clock nets are connected to input pins that are not clock pins, and modules where some clocks are active on both edges.

Appendix D8a shows an example of clock hierarchy report for a design that has only one clock signal. Appendix D8b gives an example of design with one clock signal created outside of the design, and two clock signals created and used inside the design.

9. Asynchronous Reset Hierarchy Analysis and Report

The "asynchronous reset hierarchy report" is similar to the clock hierarchy report. It is also based on the design hierarchy, using the same framework as the design hierarchy report.

For each module in the design hierarchy, the asynchronous reset hierarchy report provides information about all asynchronous reset nets that connect to ports of the module and/or are used inside the module, giving for each net:

Names of connected ports.

Fanout seen for each connected port.

Number of connected clear or preset pins of flipflops that are active on the low level.

Number of connected clear or preset pins of flipflops that are active on the high level.

Number of connected clear or preset pins of latches that are active on the low level.

Number of connected clear or preset pins of latches that are active on the high level.

Number of connected flipflops that have both clear and preset.

Number of connected latches that have both clear and preset.

Number of connected input pins that are not clear or preset pins of flipflops, or clear or preset pins of latches, highlighted between **' strings.

Appendix D9 shows an example of asynchronous reset hierarchy report.

10. RAM Write Enable Hierarchy Analysis and Report

The "RAM write enable hierarchy report" is similar to the clock hierarchy report and to the asynchronous reset hierarchy report. It is also based on the design hierarchy, using the same framework as the design hierarchy report.

For each module in the design hierarchy, the RAM write enable hierarchy report provides information about all RAM write enable nets that connect to ports of the module and/or are used inside the module, giving for each net:

Names of connected ports.

Fanout seen for each connected port.

Connections to write enable pins of RAMs, showing instance name, component name, pin name and active level.

Number of connected input pins that are not write enable pins of RAMs, highlighted between **' strings.

Report D10 shows an example of RAM write enable hierarchy report.

11. Registered Output Analysis and Report

As described above, registering module outputs whenever possible is key for synthesis. Characterization provides reliable results when module outputs are registered, and strategies that are based on successive passes of top-down characterization and bottom-up re-compilation quickly converge to an optimized implementation of the design.

The "registered output report" identifies the pin that drives each output pin of each module instance in a design, and gives additional useful information. To determine whether a pin is registered or not, the net that is connected to each output of each module instance is examined. If the driver of the net is a flipflop, then the output is registered. Otherwise, the output is not registered. This could be identified directly from RTL, but it is more efficient to use a netlist.

For each output pin of each module instance, it provides:

Name of the "driving pin", that is the pin that drives the output.

Instance name and component name of the "driving cell", that is the cell the driving pin belongs to. If it is a flipflop, the report makes it explicit.

Cell path (based on instance names) from the top-level of the design to the driving cell, followed by the corresponding module path from the top-level (based on module names).

Active clock if the driving cell is a flipflop, based on arbitrary clock net numbers given by VEGA.

Output port that is connected to the driving pin, in the module that contains the driving cell. If the driving cell is a flipflop, then its name is built by Design Compiler's "elaborate" command through adding a suffix to the name of the RTL code signal that the flipflop generates. If the driving cell is a combinational cell, its name may not be based on any RTL code signal name. In this case, the name of the output port that is connected to the driving pin allows quick identification of the relevant RTL code signal.

Flag R' on the right hand side if the output is registered, flag NR' if it is not registered.

The registered output report can be used by designers to quickly identify driving pins for non-registered outputs, and work on registering as many of them as possible.

Appendix D11 gives an example of registered output report.

12. Fanout Analysis and Report

Extracting the fanout of all nets from the RTL code is key information for planning synthesis and layout. Attention needs to be paid to the buffering and routing of nets that have high fanout values, like clock nets, reset nets, and scan enable nets.

The "fanout report" created by VEGA provides both fanout statistics, and detailed information about nets that have high fanout values. A threshold is used to identify nets that are considered high fanout nets. By default, the threshold is set to 70, a value that is dictated by some technology characteristics. The threshold value can be re-defined by a user through an appropriate command line in the "VEGA_extract.setup" file (described further).

Fanout statistics include:

The average number of pins per net.

The number and percentage of nets that have a fanout value equal to or greater than the threshold value.

A table that lists all fanout values in the design, and gives the number and percentage of nets for each fanout value.

All nets with a fanout value that is equal to or greater than the threshold value are listed. If a net was already identified as a clock net, an asynchronous reset net or a multiply-driven net, this information is reminded, based on arbitrary net numbers given by VEGA.

By default, only net sources are reported. Through inserting an appropriate command line in the "VEGA_extraction.setup" file, users can obtain a more detailed report describing connections to each net. Note that for nets that are fully described in other VEGA reports, like clock nets and asynchronous reset nets, only the source pin gets reported anyhow.

Appendix D12a gives an example of fanout statistics. Appendix D13b gives an example of high-fanout net reporting, showing net sources only. Appendix D13c gives an example of detailed high-fanout net reporting.

It must be noted that fanout values obtained through analyzing the generic netlist created by Design Compiler "elaborate" command may not be fully accurate with respect to final values that will obtained after the design is mapped to the target technology.

Better accuracy can be obtained through mapping the design to the GTECH generic library from Synopsys. Synthesis to this library is easily setup and runs fast, because no design rules and no timing constraints are involved. Of course, full accuracy can be obtained through analyzing the mapped netlist obtained after synthesizing the design to the target technology library.

13. Non-resettable Memory Element Analysis and Report

The "non-resettable memory element report" gives a list of all flipflops and latches that have no asynchronous reset. Gate-level simulation issues are associated with non-resettable flipflops and latches.

Appendix 13 gives an example of non-resettable memory element report. Stamps GFF', GLH', MFF' and MLH' are used on the right hand side to respectively identify generic flipflops, generic latches, mapped flipflops, and mapped latches. A reading key is inserted on top of the report to remind users the meaning of those stamps.

For system-level considerations, some designs use synchronous reset rather than asynchronous reset. In order to avoid some synthesis issues, it is recommended that synchronous reset is implemented through using the clear and preset pins of memory elements. In this case, non-resettable memory elements are reported correctly by VEGA. If synchronous reset is implemented through using logic connected to the D-input of flipflops and latches, like any other functional mode, then VEGA reports memory elements that can be reset synchronously as non-resettable memory elements. Extraction of synchronous reset is being implemented in VEGA to overcome this limitation.

14. VEGA Extraction Setup File

The "VEGA_extract.setup" file allows users to give extraction directives to VEGA and control reporting:

Design information reporting can be activated or bypassed.

Design checks (RTC DRC) can be turned on/off individually. This allows users to create design checks reports that focus on particular types of checks, and avoid that reports get cluttered by second-level information. Typically, most designs include a very large number of unconnected pins and ports, that make other types of reporting difficult to locate.

Design information reports can be turned on/off individually.

Suffixes that VEGA adds to the name of the top-level design to create names of report files can be re-defined.

The threshold value used to identify high-fanout nets can be redefined.

Nets that are connected to latch enable pins only can be considered as "ordinary nets", instead of being considered clock nets. This feature can be used for designs that include arrays of latches with individual write enable commands to implement small RAMs. It avoids dealing with thousands of clock nets, in particular when generating synthesis scripts.

Mapped buffers and inverters can be made transparent to identify actual sources and fanouts of clock nets, asynchronous reset nets and RAM write enable nets in mapped designs.

Some modules can be made backboxes. Modules contents are then discarded, and only ports are retained by VEGA. This feature can be used to avoid dealing with modules that are present in VEGA input files but are not relevant for the purpose of analysis. It can also be used to simplify synthesis scripts when clock signals are generated inside a design. After modules that create clock signals are made blackboxes, clock sources get defined as output ports of those blackboxes, instead of being created by synthesized logic.

An example of VEGA extraction setup file is given in Appendix E.

F. VEGA SYNTHESIS SCRIPT GENERATION TOOL

Synthesis scripts generation tools can either directly extract design information from RTL code, or use data extracted by an RTL analysis tool such as a generic netlist. This is only a "tool packaging" issue. Some of the benefits of synthesis scripts generation tools are:

The turn-around-time of synthesis is reduced, and productivity is increased.

The synthesis expertise, including both methodology and tool expertise, is made available to all users. Designers who are not synthesis experts can then achieve excellent synthesis results.

Design rules associated with target technologies and backend tools are always handled properly.

All synthesis guidelines and recommendations are always taken into account.

Complex optimization strategies, that would be difficult to implement "manually", can be used efficiently.

Introduction of new synthesis tools is greatly facilitated, because a lot of tool expertise can be embedded into the script generation tool.

Synthesis scripts always come in a standardized form, which facilitates communication and re-use of existing designs.

Large hierarchical designs far exceed the capacity of state-of-the-art logic synthesis tools. Today, designs that include 300 kGates to 500 kGates are considered typical, and designs with up to 1 Million gates can be fabricated. On the other hand, logic synthesis tools are limited to modules of 5 kGates to 50 kGates, depending on available computing resources, the gate count of the module, the nature of the logic to be synthesized, and the synthesis tool itself. So far, integration capabilities have been growing much faster than logic synthesis capacities.

Therefore, a hierarchical approach must be used for the synthesis of large designs. Modules of reasonable sizes are first synthesized independently from each other and then put together. The most powerful synthesis methodologies that are based on this approach make use of "bottom-up synthesis" and "top-down characterization".

The following discussion presents key concepts, steps and processes that are used in such methodologies, together with issues and limitations that can be encountered. The following topics are covered:

Bottom-up synthesis
Characterization
Top-down characterization
Initial mapping
Results of initial mapping
Overall process
Time budgeting
Ping-pong effects.

1. Bottom-Up Synthesis

Figure 14:
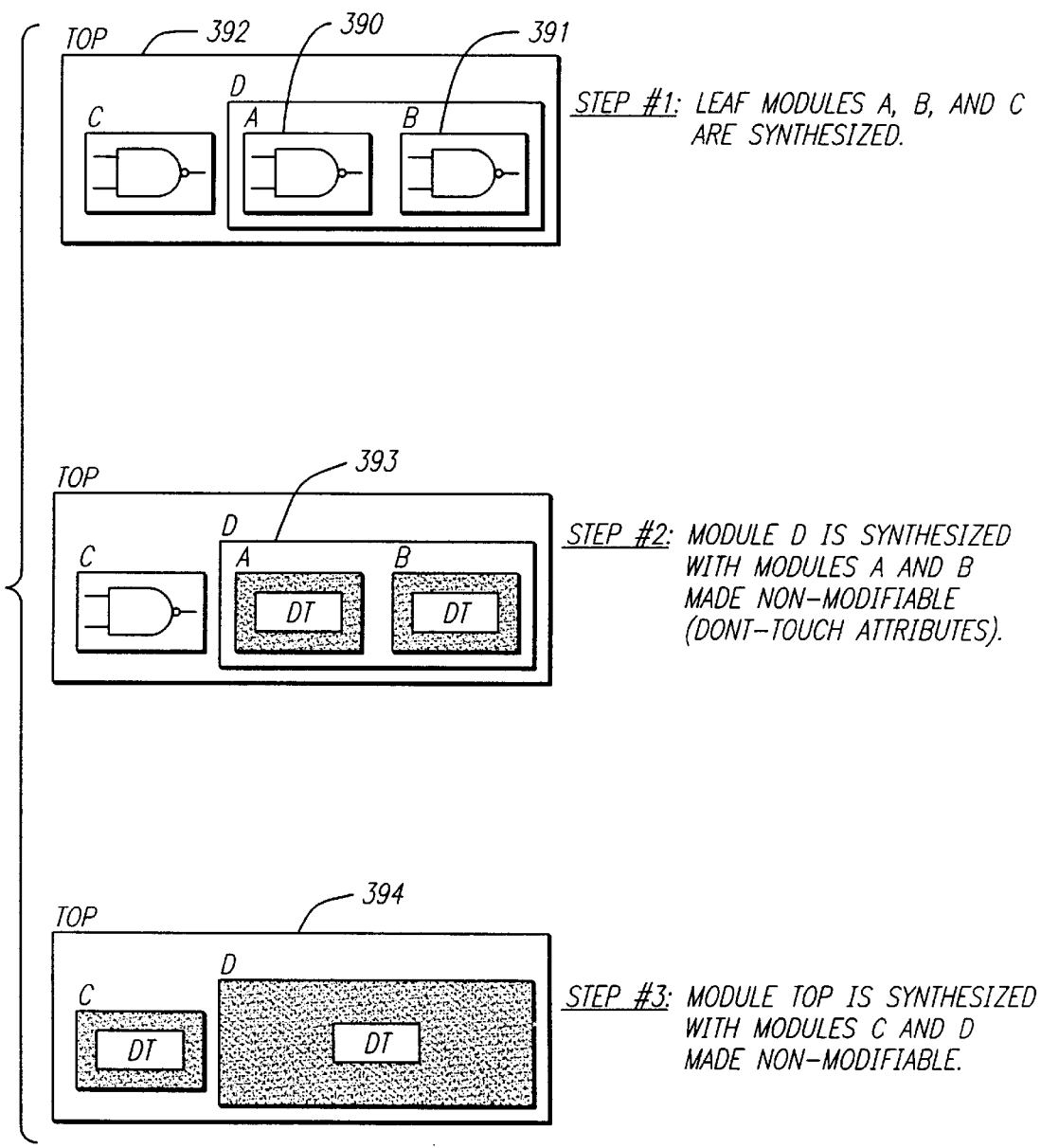
FIG. 14 illustrates that bottom-up synthesis starts from leaf modules in the design hierarchy.

Referring to FIG. 14, bottom-up synthesis starts from leaf modules A 390, B 391, and C 392 in the design hierarchy as illustrated. Those modules are synthesized, and a "donttouch" attribute is set on them. Synthesis then proceeds with modules that are located one level up in the design hierarchy, module D 393, and the process continues until the root module E 394 of the design is reached. Because of "dont touch" attributes, lower level modules are considered as non-modifiable cells and are only integrated into upper levels. This dramatically reduces the complexity of synthesis.

2. Characterization

Figure 15:
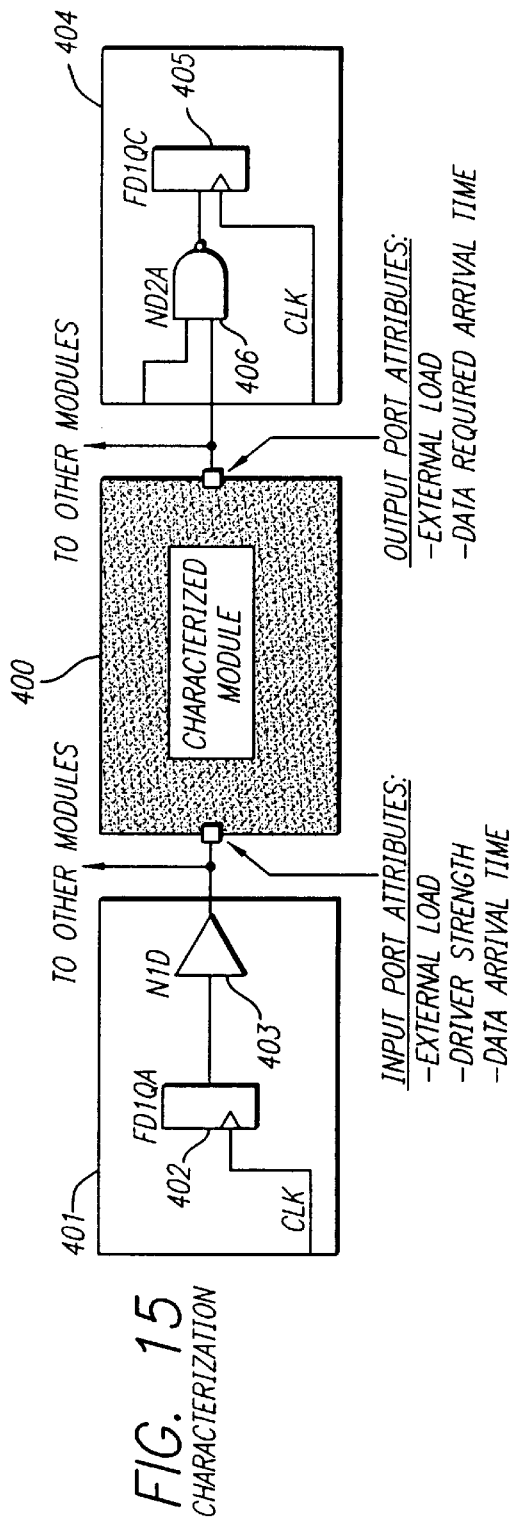
FIG. 15 illustrates the characterization of a synthesized module.

Characterization can be used after a design has been mapped to the target technology. It consists in calculating the I/O conditions of a module based on surrounding modules, including driving strength of pins that are connected to inputs, arrival time of signals on inputs relatively to clocks, loads driven by outputs, time consumed in modules connected to outputs relatively to clocks, etc. FIG. 15 illustrates the characterization of a synthesized module 400. Such calculations can be made because the design is mapped to a target technology, and all the characteristics of cells used to implement it are known and available in the target library. Referring to FIG. 15, characterization of a module is illustrated. The module 400 is characterized independently from its surrounding modules. Module 401 comprises a flipflop 402 and a buffer 403. After the synthesis of module 401, it can be characterized to determine the external lode, driver strength, and data arrival time. Module 404 comprises a flipflop 405 and an NAND gate 406. After the synthesis of the module 404, it too can be characterized to determine external load and the required arrival time.

Characterization results are stored as attributes that are set on the I/O ports of modules. This information can be saved in files, as lists of commands in the language used to control the logic synthesis tool. When re-loading those files, the commands they contain execute, and attributes on I/O ports of modules are set again.

Characterization not only calculates the I/O conditions of a module, but also derives synthesis constraints from surrounding modules. For example, if the module has an input pin connected to a clock net, and if this clock has been already defined as a synthesis constraint in surrounding modules, characterization derives the same clock definition on this input port.

Major synthesis constraints that are propagated by characterization include operating conditions, clock definitions, wire load models, and design rules.

3. Top-Down Characterization

Top-down characterization consists in calculating all I/O conditions and constraints of each of the modules and the sub-modules in a hierarchical design. Constraints are first set on the top-level, then modules that are located one level down in the design hierarchy are characterized. The process continues until leaves of the design are reached. Using this process, constraints that were set on the top level, like operating conditions and clock definitions, are derived down to leaf modules. A "snapshot" of the design is then obtained, with conditions and constraints on I/O modules, that both reflect the current implementation of the design and synthesis goals. Referring to FIG. 16, the technique of obtaining a snapshot of the design using the characterization step is illustrated. Starting at the top, level module 394, the characteristics of the module 394, such as its operating conditions and clock definitions, are determined. Then, one level down, in Step 2, constraints for modules C 392 and D 393, are derived using characterization technique. Finally, continuing down the hierarchial level, constraints are derived for each of the leaf modules A 390 and B 391.

4. Initial Mapping

The first time the RTL code is mapped to the target technology using bottom-up synthesis is referred to as "initial mapping".

Figure 17:
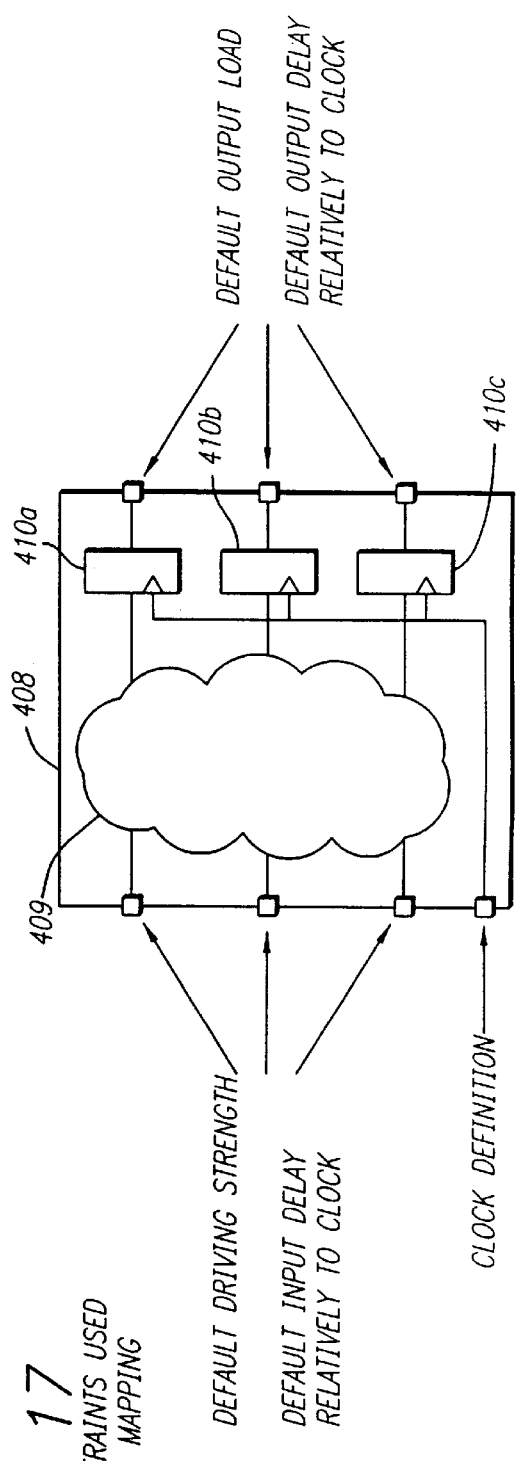
FIG. 17 illustrates default constraints used for initial mapping.

As the actual I/O conditions of modules are still unknown at that stage, default constraints are set on the I/O ports of modules. See FIG. 17. For example, default driving cells are set on inputs to make provision for the driving strength of cells that will connect to them and a default load is assigned to outputs to make provision for loads that will connected to them. Referring to FIG. 17, the use of the default constraints on module 408 for initial mapping of module 408 is illustrated. For the very first mapping process, the required constraints are not available because the characterization step has not been taken for any of the modules. Module 408 may comprise combinational logic circuits 409 and flipflops 410A, 410B and 410C which drive the three outputs. Therefore, default values are used for input delay, output load, output delay and input driving strengths.

Under some circumstances, default constraints cannot properly model the design situation, and "time budgets" have to be used instead.

5. Results of Initial Mapping

Following the initial mapping, as a result of default constraints, many violations are usually found when putting modules together, including:

Design rules violations, like maximum capacitance violations.

Timing constraint violations. On the other hand, many nets will be over-buffered, resulting in a gate-count that is higher than needed.

The result of the initial mapping process is illustrated in FIG. 18. Assume, for the purposes of the present example of FIG. 18, modules 420, 422, and 424 have been initially mapped using default values as discussed above. Module 420 comprises an output flipflop 425. Module 422 comprises buffers 426, 427 and 428, combinational logic circuits 429, 431 and 432, and output flipflops 430, 433 and 434. Module 424 comprises buffers 435 and 437, and combinational logic circuits 436. In this example, it would be possible to have timing violation for the signal from flipflop 425 to flipflop 430, traveling through buffers 426, 427 and combinational logic circuits 429. Another problem illustrated by FIG. 18 is an over-drive of a net 439 in which the output of flipflop 430 overdrives buffer 435 of module 424. Finally, another problem illustrated by the figure is violation of maximum capacitance allowed by the output of flipflop 434 because of the high fanout. This is illustrated by the connection 440 having fanout of 50.

6. Overall Process

In order to fix violations in the netlist created by the initial mapping and optimize it properly, an iterative improvement process can be used:

Top-down characterization is used to capture actual I/O conditions and constraints of modules, based on both the netlist that was created by the initial mapping and synthesis constraints.

Bottom-up re-synthesis I/O conditions and constraints derived by characterization is used to re-optimize the design.

The process is iterated until all violations are solved, and the gate count is stable.

Figure 19:
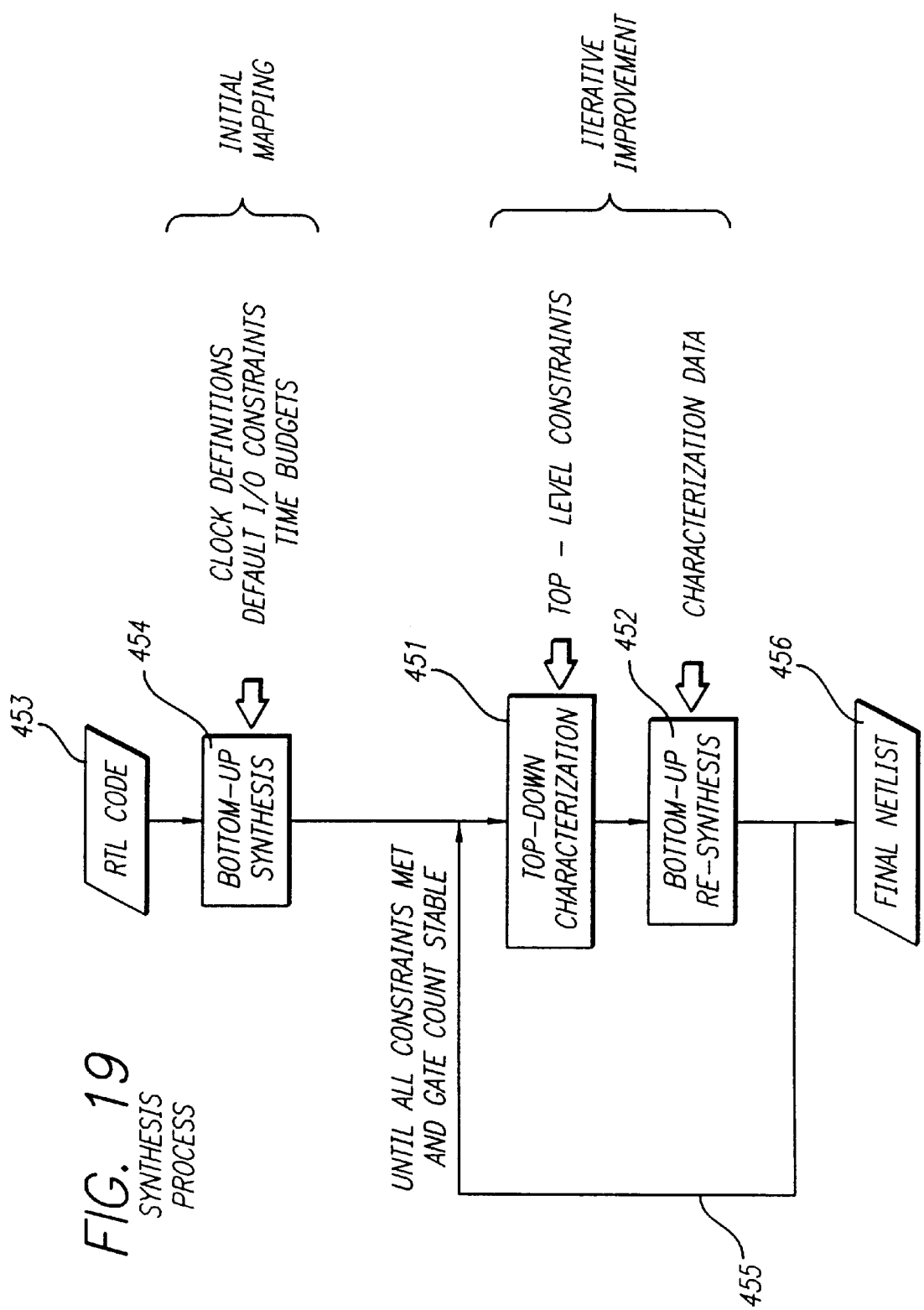
FIG. 19 illustrates the iterative improvement process.

This process implements the most powerful synthesis and optimization methodology that has been available so far for large designs. The interactive improvement process is illustrated in FIG. 19. Referring to FIG. 19, the interactive improvement process begins with initial mapping utilizing bottom-up synthesis technique 450 with each module being assigned default constraints, time budgets, and clock definitions. After the initial mapping is completed, top-down characterization 451 is performed. Top-down characterization provides constraints, time budgets, and other information required to be met by each of the modules. Then, the constraints determined by the characterization step are used to resynthesize each of the modules using bottom-up resynthesis technique 452. The top-down characterization step 451 and bottom-up resynthesis 452 steps are iterated 455 until all constraints are met by each of the modules being synthesized and gate count for each of the modules are stable. Finally, the net list is produced 456.

7. Time Budgeting

Figure 20A:
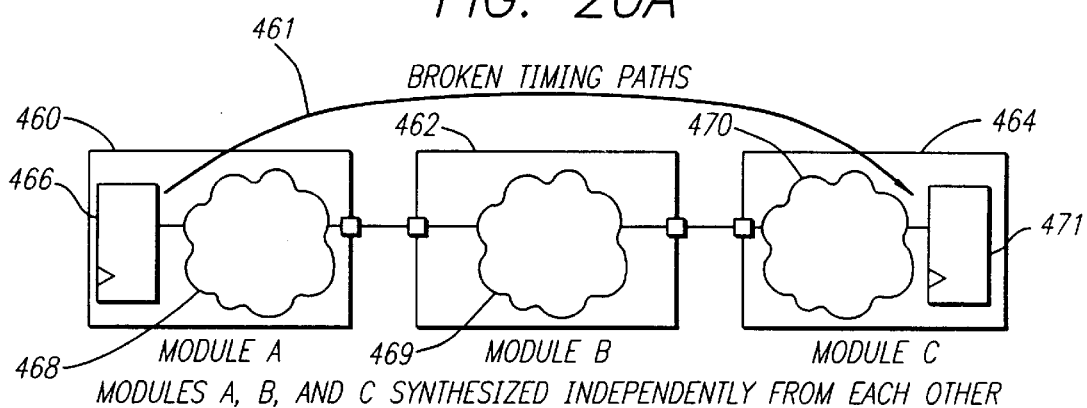
FIG. 20A illustrates "broken timing paths."

When related combinational logic is split between modules, some flipflop-to-flipflop timing paths can run through several modules that are synthesized independently from each other. Such paths are referred to as "broken timing paths" as illustrated in FIG. 20A. Referring to FIG. 20A, Modules A 460, B 462 and C 464 are serially linked with module 460 having a flipflop 466 and combinational logic circuits 468, module B 462 having combinational logic circuits 469, and module C 464 having combinational logic circuits 470 and flipflop 471. When modules A, B and C are synthesized independently from each other, combinational logic circuits 468 of module A 360, 469 of module B 462, and 470 of module C 464, intervene between flipflop 466 of module A 460, and flipflop 471 of module C 464. The timing path between flipflop 466 and flipflop 471, as indicated by timing path 461, is broken.

Figure 20B:
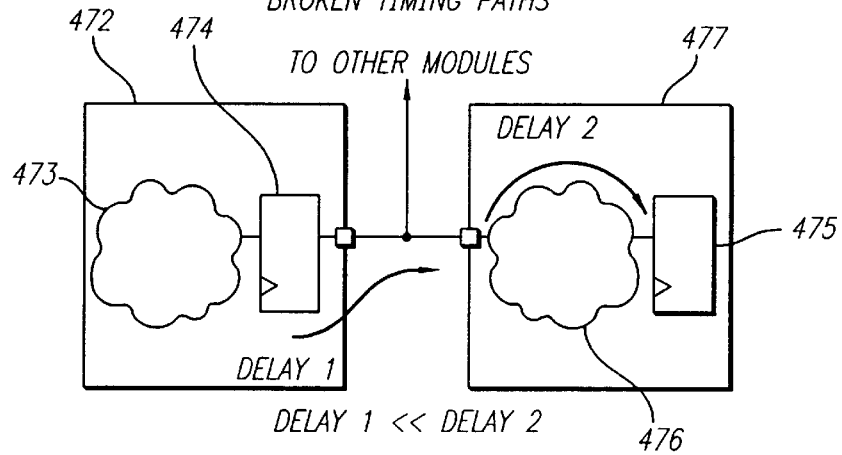
FIG. 20B illustrates that the delay consumed in driving flipflops can easily be approximated.

If the design does not include broken timing paths, default constraints, which are identical for each module, properly model the situation. Each module input is driven by a flipflop. The driving strength on each module input is then perfectly know. The delay consumed in driving flipflops can easily be approximated, and is generally negligible compared to delays consumed in driven logic as illustrated in FIG. 20B. Referring to FIG. 20B, modules 472 and 477 have a timing path which is driven by flipflop 474 into a combinational logic 476 to flipflop 475 which is not broken. This timing path, because it is not broken, can easily be approximated.

Figure 20C:
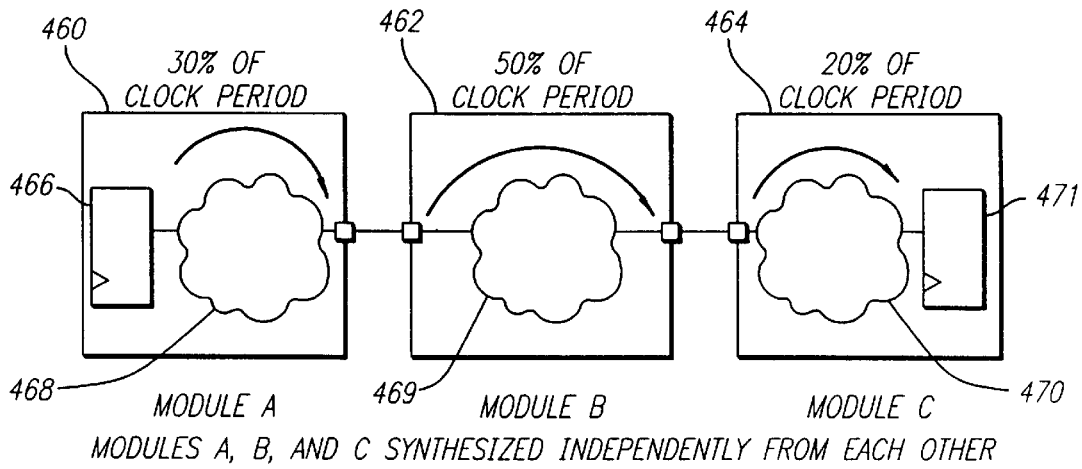
In FIG. 20C illustrates the clock period allocation technique.

In the presence of broken timing paths, default constraints cannot model the situation correctly. For each broken timing path, an appropriate percentage of the clock period should be allocated to each module the path goes through, based on the depth of local logic. In FIG. 20C illustrates the clock period allocation technique. This is referred to as "time budgeting", that consists in setting individual and appropriate delays on I/O of modules. Referring to FIG. 20C, modules A 460, B 462, C 464, is used to illustrate the allocation of the clock period required for a signal to travel from flipflop 466 to flipflop 471 through modules A 460, B 462, and C 464.

Setting time budgets can be a fairly complex process:

All broken timing paths need to be identified.

Some paths can be quite complex, going through several levels of hierarchy. Such paths are sometimes referred to as "snake paths".

Paths often interact. After fixing a violation on a path, another violation shows up on a path that was not identified as critical so far.

In practice, for a design that includes a large number of broken timing paths, time budgeting is a very difficult and time-consuming task if done manually. It requires a deep understanding of the design, and many trial synthesis runs are often needed before all timing violations can be fixed. Time budgeting tools have been made available lately, and should help resolve this issue.

Design guidelines can also be used to avoid creating broken timing paths, like keeping the design hierarchy pure down to leaf modules and registering module outputs whenever possible.

8. Ping-pong Effects

Following the initial mapping, consecutive passes of top-down characterization and bottom-up re-synthesis usually converge quickly to an implementation of the design that both meets timing and minimizes the gate count.

However, under some circumstances, this process may not converge. Designs get successively over-constrained and under-constrained by top-down characterization, but never get constrained properly. This situation is well known to synthesis specialists as "ping-pong effects", and typically results in oscillations between non-met timing constraints and over-sized logic. In some cases, timing constraints cannot be met at all.

Ping-pong effects are encountered when the design includes broken timing paths, that were not properly constrained by the initial mapping. Then the logic is not properly structured, and top-down characterization never derives appropriate constraints on the I/O's of modules.

Ping-pong effects can be avoided through using design guidelines that avoid the creation of broken timing paths. If the design already contains broken timing paths, they can be avoided through appropriate time budgeting.

9. Required Key Features for Synthesis Scripts Generation Tools

Figure 21:
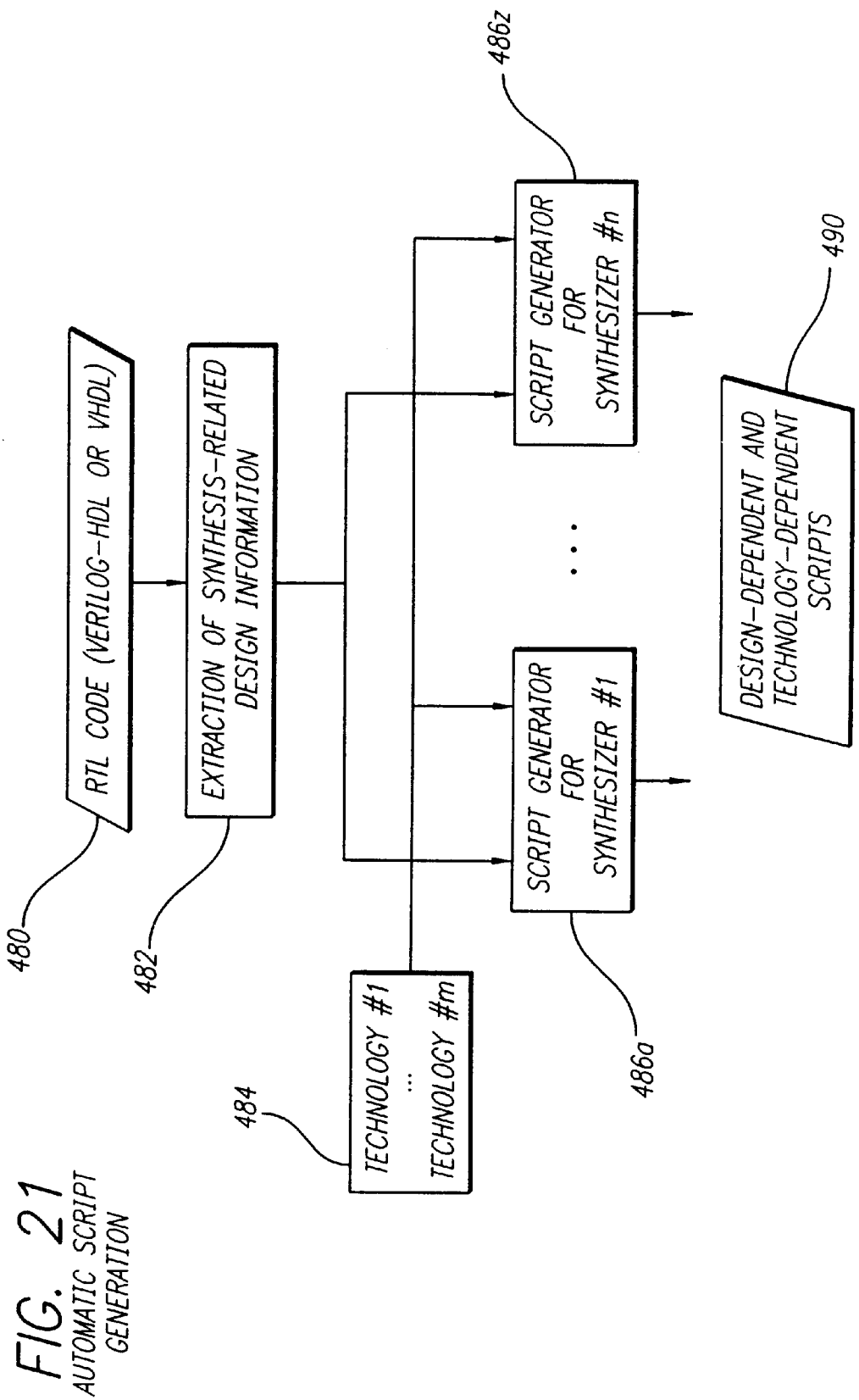
FIG. 21 illustrates that synthesis scripts generation tools have to include three types of elements.

Synthesis scripts depend on the design to be synthesized, the target synthesis tool, and the target technology. Therefore, synthesis scripts generation tools have to include three types of elements illustrated in FIG. 21 and listed below:

Design information, either directly extracted 482 from the RTL code 880 or obtained from an RTL analysis tool.

Technology libraries 484, that contain data for all supported target technologies.

Script generators 486a . . . 486z, that write out scripts for all supported synthesis tools.

Synthesis scripts created for a given design, a given target technology and a given synthesis tool should:

Be optimized for the design to be synthesized, based on design information extracted from RTL code. In particular, scripts should use and take advantage of information like the design hierarchy, the hierarchy purity of modules, and the types of pins that drive module outputs.

Be optimized for the target synthesis tool. For example, some synthesis tools can synthesize modules of 50 kgates at once with reasonable run times, while some others are generally limited to 10 kGates to 20 kGates. Scripts should reflect this characteristic of synthesis tools, and work on modules of appropriate sizes.

Properly set design rules associated with the target technology and backend tools.

Properly set timing constraints, based on information extracted from RTL code and information provided by the user. In particular, clock sources can be extracted from RTL code. So the scripts should include all clock creation commands, automatically inserted when appropriate by the scripts generation tool. Those definitions can use variables that have to be set by the user to define values of clock periods.

Make all synthesis steps fully explicit to facilitate understanding and customization of scripts by users. Names of design objects like modules and clock sources should be apparent, and no loops should be used for repetitive operations justified further).

Implement most efficient optimization strategies, that are based on an initial mapping and consecutive passes of top-down characterization and bottom-up re-synthesis, as described above.

Be designed for running in parallel on several workstations, or one several processors of the same workstation (described further).

Automatically manage all data files that are created and used by the synthesis tools (described further).

Support for efficient design hierarchy re-arrangement is another key feature for synthesis scripts generation tools. For a large majority of designs, the hierarchy as described in RTL code is not appropriate for synthesis. For example, some modules are too small to allow efficient optimization and need to be merged together. Some others mix design hierarchy with large clouds of logic, and those clouds need to be encapsulated in new modules, etc. Hierarchy re-arrangement is a key synthesis step, that conditions run times and quality of results. It is further described in following sections, together with the type of support scripts generation tools have to provide.

10. Design-dependent Explicit Scripts

In August 1992, Synopsys published a methodology note entitled "dc_shell scripts for synthesis", which describes a set of sophisticated scripts for the synthesis and optimization of large designs. As opposed to the approach described above, those scripts are "generic" in that sense that they can be used for any design. Variables are used to store names of design objects, attributes can be set on objects to control the optimization process, and loop statements are used for iteration on all objects that need to be processed.

From the user prospective, major issues are associated with this generic approach:

The synthesis flow is not apparent to a non-expert user. Processing is not explicitly done on design objects, but on string variables that contain names of objects being processed. The flow can also be altered by attributes set on some design objects.

Customization for a given design is limited in essence, and difficult to use for a non-expert user. Attributes can be set on design objects to control the optimization process to some extend, but this is of course limited to the set of attributes defined and handled by the scripts. Variables and loop statements used to process all elements make customization for a particular element difficult or impossible.

From the implementation prospective, there are also some major issues:

About 30 to 100 pages of code are required to implement generic scripts, and complex control statements have to be used, like if-then-else statements and loop statements. The command languages of logic synthesis tools are rather limited for such complex applications. For example, the "dc_shell" language available to control Synopsys Design Compiler does not support routines, limited-scope variables and recursion.

Command languages of logic synthesis tools are interpreted languages. As a result, debugging of complex applications is more difficult, and the IP contained in scripts cannot be protected because the source code is needed for interpretation (as opposed to compiled languages that use unreadable binary files).

The syntax of command languages is proprietary, and can change over time. Scripts may need to be re-worked when a new release of the synthesis tool comes in.

In the design-dependent approach described herein, names of design objects like module names and clock net names are fully apparent and explicit. No loops are used for repetitive processing, so that the processing of each element is fully modifiable. This approach has key advantages over the generic approach:

The synthesis flow is easily understood by a non-expert user. Names of design objects and operations that are applied to them are fully explicit.

Scripts are easily customized by a non-expert user. Again, names of design objects and operations that are applied to them are fully explicit. All loops are unrolled, so the processing of a particular element can be easily modified, enhanced and made specific.

No complex control is needed for script implementation, because design objects are not contained in variables and processing of each object is duplicated. Only basic synthesis commands are used. Scripts are then more readable and stable over synthesis tool releases.

11. Design Hierarchy Re-arrangement

For a large majority of designs, the hierarchy as described in RTL models is not appropriate for synthesis, and needs to be re-arranged.

By default, logic synthesis tools retain the RTL code design hierarchy, and do not move logic across module boundaries. If the design includes a lot of low-complexity modules, which is a very frequent situation, then logic synthesis can be impacted in two ways:

Pieces of logic that are embedded in different modules cannot be combined together to reduce the overall amount of logic. In particular, common terms in boolean equations for pieces of logic located in different modules cannot be shared.

Synthesis run times can be significantly increased, due to the large number of modules that need to be synthesized in bottom-up order, and characterized in top-down order.

In some other cases, the design hierarchy needs to be modified to eliminate broken timing paths, and avoid running into associated issues that have been already described:

Default constraints used for initial mapping do not make a good job on broken timing paths. Appropriate time budgets are needed instead.

Ping-pong effects can cause oscillations between non-met timing constraints and over-sized logic, or cause timing constraints not to be met at all. For those reasons, it is critical to eliminate broken timing paths whenever possible.

Logic synthesis tools provide two types of directives to re-arrange the design hierarchy:

Ungrouping, that can be used to dissolve a particular level of hierarchy, or the entire hierarchy below a given module.

Grouping, that can be used to combine several modules into a new module, or to create a new module to embed logic mixed with design hierarchy.

FIG. 22 illustrates ungrouping of small modules, used to build bigger modules that are more appropriate for synthesis. Logic clouds A 502, B 504, C 506 and D 508 cannot be combined together because they are embedded in different modules. Combinational logic A 502 belongs to module 501, combinational logic cloud B 504 belongs to module 503, combinational logic cloud 506 belongs to module 505, and combinational logic cloud 508, along with flipflop 510, belongs to logic could 512. The modules 501, 503, 505, and 512 belong to the higher level module M 500. Modules 501, 503, 505, and 512 can be dissolved under the higher level module M 500, and the logic clouds A 502, B 504, C 506, and D 508 can be combined to form of a larger combinational logic cloud 514. This process is called ungrouping, or hierarchy ungrouping, of modules.

Figure 23:
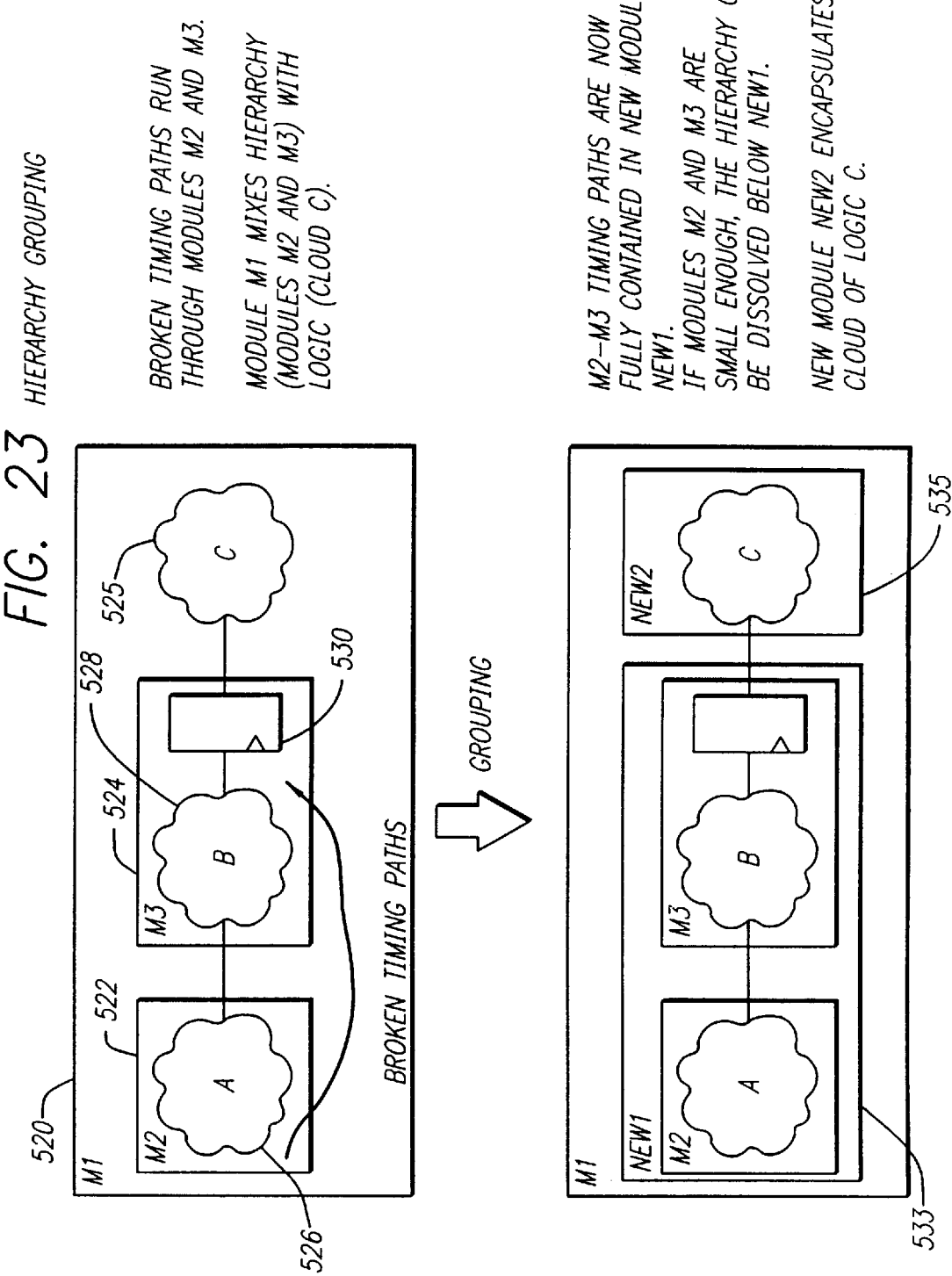
FIG. 23 illustrates how grouping can be used to eliminate broken timing paths due to non-registered module outputs, and to embed clouds of logic mixed with design hierarchy.

FIG. 23 illustrates how grouping can be used to eliminate broken timing paths due to non-registered module outputs, and to embed clouds of logic mixed with design hierarchy. Referring now to FIG. 23, the module M1 520 initially includes modules M2 522 and M3 524 and combinational logic cloud 525. Because module M1 520 includes sub-modules 522 and 524 as well as the combinational and logic cloud 525, module M1 520 is considered a mixed hierarchical module. The timing path between modules M2 522 and M3 524 is broken because the output of module M2 522 is not registered. That is, the outputs are not from a flipflop which are typically used for registers. The module M2 522 contains combinational logic cloud 526. Module M3 524 comprises combinational logic cloud 528 and a registered output from a flipflop 530. In order to eliminate broken timing paths due to nonregistered module outputs, and to make the upper module M1 520 a purely hierarchial module, grouping technique can be used. Modules M2 522 and M3 524 can be grouped into a new module M1 533. Also the combinational logic cloud 525 can be defined as a new module M2 535. After the grouping of modules M2 522 and M3 524, the broken timing path is now fully contained in the new module M1 533. Note that if modules M2 and M3 are small enough, these two modules can be dissolved using the ungrouping technique. New module M2 encapsulating the logic cloud C allows M1 to have only sub-modules, thereby causing M1 to be a hierarchically pure module.

12. Support of Design Hierarchy Re-arrangement

Re-arranging the design hierarchy is a critical step. It directly impacts run times of synthesis tools, together with their ability to meet timing constraints and optimize the gate count. The objectives of hierarchy re-arrangement can be outlined as follows:

Pure hierarchy down to leaf modules

No broken timing paths

Modules with appropriate sizes.

A lot of design information is clearly needed to make right decisions. Looping through synthesis to evaluate decisions is not affordable, because of run times (typically 20 to 40 hours for initial mapping). Therefore, synthesis scripts generation tools have to provide an efficient support for re-arranging the design hierarchy. As discussed above, RTL analysis can be used to obtain the following design information:

Hierarchy purity of modules

Types of pins that drive module outputs (registered, non-registered) In addition to this information, estimates of module sizes are needed to make grouping/ungrouping decisions, and make sure that modules of the re-arranged hierarchy are of appropriate sizes. A range of techniques can be used for gate-count estimation, with increasing levels of accuracy and increasing run times:

Language-based construct inference. This technique consists in recognizing patterns in RTL code, and in associating an estimated gate count with each type of pattern.

RTL code translation. This technique consists in running the first step of logic synthesis, referred to as "translation", that transforms the RTL code to a generic netlist. The structure of the generic netlist mirrors the structure of RTL code.

Synthesis to a generic library. This technique consists in synthesizing the design using a generic library, like the Synopsys GTECH library, that does not include timing information. There are no design rules and no constraints.

Synthesis to the target technology library, with no design rules and no constraints.

Synthesis to the target technology library, with design rules and constraints.

Language-based construct inference runs in minutes, but only provides rough estimates. Synthesis to the target technology library with design rules and constraints provides the most accurate estimates, with a high price to pay in run times (typically 20 to 40 hours). Among all those techniques, synthesizing to a generic library is a good trade off between accuracy and run time. The obtained numbers are accurate enough for the purpose of modifying the design hierarchy, and run times are quite reasonable (typically less than one hour).

Once module size estimates are available for the initial design, there is no real need to re-run estimation every time the design hierarchy is modified. If the hierarchy is ungrouped below a certain module, then the gate count for this module can be estimated as the sum of gate counts of all modules that were ungrouped. If two modules are grouped together, then the gate count of the new module can be estimated as the sum of gate counts of the grouped modules.

This technique will not be fully accurate in all cases. When clouds of logic get merged together, new optimization opportunities can be created, and the resulting gate count can be less than the sum of gate counts of initial clouds. However, in general, this is accurate enough for the purpose of building modules of appropriate sizes for synthesis, which is a loosely defined concept. For example, modules of 5 kGates to 10 kGates are fine for Synopsys Design Compiler.

Similarly, it is not necessary to re-run RTL analysis to determine the hierarchy purity of new modules, and the type of pins that drive the outputs of new modules (registered or non-registered outputs). Based on the initial design information and grouping/ungrouping information, this data can be easily updated.

Figure 24:
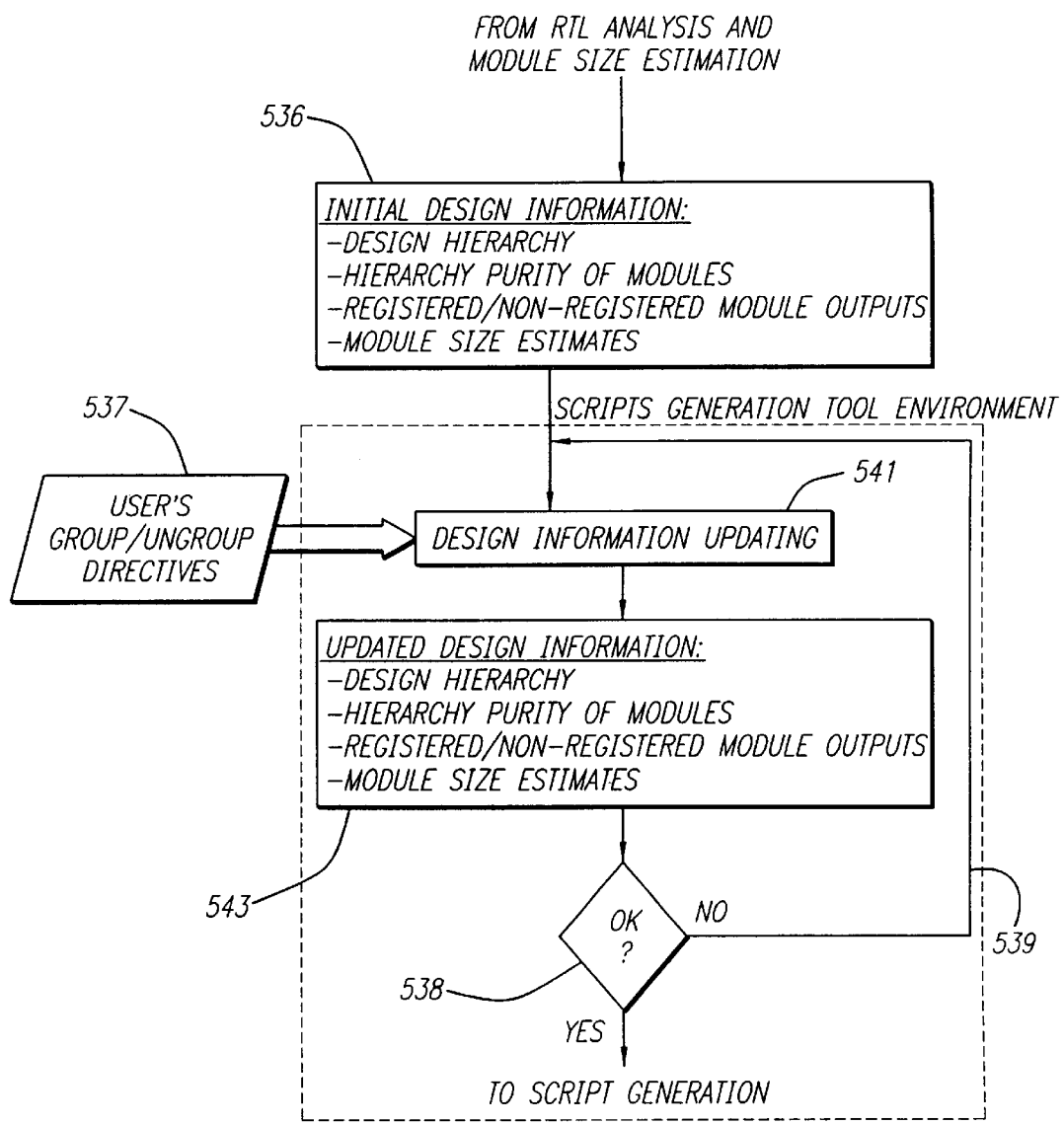
FIG. 24 illustrates support for design hierarchy re-arrangement.

Therefore, hierarchy re-arrangement can be supported in the synthesis scripts generation environment, as represented by FIG. 24. The initial design information 536 is updated 541 based on grouping/ungrouping directives 537 from the user. The updated design information 543 is then presented to the user. If the new hierarchy is satisfactory 538 then the user can proceed to gate generation. Otherwise, grouping/ungrouping directives can be modified and improved as indicated by the loop 539.

An iteration through this loop 539 can be very fast, because the amount of computing involved in updating the design information and presenting it efficiently to the user is quite low.

The updated design information can be presented to users using textual reports. For example, modules can be showed together with their hierarchy purity, numbers of registered/non-registered outputs, and estimated gate count. Reports should be indented based on the depth of modules relatively to top level. Appendix D3a is an example of the report. Graphical hierarchy editors can also be used to support hierarchy re-arrangement using that scheme. They should be similar to file managers available on most platforms today. Information about modules can be displayed together with the icons that represent them. Users should be able to merge icons together, and insert new icons in the hierarchy through clicking and dragging.

Using this scheme, the design hierarchy can be easily re-arranged for synthesis, in a efficient and reliable manner. The high level of support provided to users should help them make right decisions at that stage, that is critical for synthesis both in terms of run times and quality of results.

13. Parallel Synthesis

With current and future design complexities, synthesis run times are an issue. For example, for a 350 kGates design, the following run times can be considered typical with workstations currently available (Sun Ultra II):

Initial mapping 40 hours

Characterization 5 hours

Re-synthesis (with incremental option) 10 hours

Reporting (timing, gate count, violations, etc) 4 hours

If two passes of top-down characterization and bottom-up re-synthesis are used, this makes a total run time of about 75 hours. Therefore, optimizing synthesis run times is a key objective for script generation tools. Note that such short characterization times are obtained when the efficient characterization techniques are used. Using the basic technique, that consists in characterizing one design at a time, typical run times of top-down characterization would be 40 hours.

Some parallelism can easily be introduced in bottom-up synthesis, as follows:

1. All modules that are leaves in the design hierarchy are synthesized in parallel. Every time the synthesis of a module completes, a dont-touch attribute is set on it.

2. When all leaves are synthesized, all modules that are one level up in the design hierarchy are synthesized in parallel.

3. Process continues until the top level design is synthesized.

Applied to the design hierarchy of FIG. 25, this process would work as follows:

1. Modules C 544, E 548, F 550, H 554 and I 556 are synthesized in parallel and dont-touch'ed.
2. Modules D 546 and G 522 are synthesized in parallel and dont-touch'ed.
3. Module B 542 is synthesized and dont-touch'ed.
4. Top-level A 540 is synthesized.

For most designs, the number of leaves that can always be synthesized in parallel is much greater than the number of hierarchical levels. So this process can achieve significant run time improvements. For the example of FIG. 25, ignoring the time consumed in managing parallel processes that run on different workstations and processors and assuming that all modules get synthesized in the same amount of time, the speed improvement factor would be 2.25×.

A key feature that needs to be introduced in parallel synthesis is constraining based on the number of available synthesis tool licenses. Those licenses are very costly, and design teams usually have a limited number of them. For example, if only two licenses are available, the design hierarchy of FIG. 25 can be processed as follows:

1. Modules E 548 and F 550 are synthesized and dont-touch'ed.
2. Modules H 554 and I 556 are synthesized and dont-touch'ed.
3. Modules C 544 and D 546 are synthesized and dont-touch'ed.
4. Modules B 542 and G 552 are synthesized and dont-touch'ed.
5. Top level A 540 is synthesized.

Ignoring again the time consumed in managing parallel processes that run on different workstations and processors, and assuming that all modules get synthesized in the same amount of time, then the speed improvement would be 1.8× for this example.

14. Data Management

The synthesis of complex designs involves a large amount of design data. Many factors contribute to increasing the number of data files:

Several synthesis runs are usually needed before the final netlist is created. For example, there may be one or several exploratory synthesis runs, then several runs needed after functional bugs are discovered and fixed.

Optimization strategies are based on an iterative process, that is described further. Each iteration creates a new set of files that need to be saved and retrieved for further re-use. In particular, each top-down characterization step creates a new file for each module, that contains commands to set attributes on module I/O ports.

With current and further deep submicron processes, delays are dominated by wires, not by transistors. New flows, referred to as "timing closure flows", are getting used in order to meet timing after layout. Those flows are based on feedback of physical information into synthesis, including custom wire loads models, pin loading information, and delay information. Several iterations through synthesis and physical design are usually needed before converging to correct post-layout timing.

It is therefore important that synthesis scripts automatically manage all data files that are created and used by synthesis tools.

G. VEGA AUTOMATIC GENERATION OF SYNOPSYS DESIGN COMPILER SYNTHESIS SCRIPTS

As discussed above, it is preferred that RTL analysis uses the generic netlist created by the target logic synthesis tool as its input description, rather than the RTL code itself. The generic netlist created by "translation" represents the "synthesis view" of the RTL code, and reflects interpretations of the RTL code that may be made by the target synthesis tool. Input files to VEGA are dump files 362 of FIG. 12 created using the dump script 360 of FIG. 12. Dump files 362 are ASCII files that contain a human-readable description of the design compiler's generic netlist.

1. Synthesis Database Structure

VEGA creates synthesis scripts to be used with the directory structure that is illustrated in FIG. 26.

Directory "DB" 600 is used to save Synopsys binary data base files, that contain the design at various stages of the synthesis process.

Directory "scripts" 602 is used to store scripts created by VEGA, and additional scripts created by users if needed.

Directory "reports" 604 is used to save reports the synthesis scripts create when running, like CPU time reports and Design Compiler reports.

Directory "synlib" 606 is used by VEGA to save a local synthesis library, that is created through customizing the target technology library for the design to be synthesized. Users should also place memory models in this area. A sample script to make target technology library is attached as Appendix V.

Directory "VEGA_<top-level-name>" 608 is referred to as "VEGA work area". It is created and used by generated synthesis scripts to save information, in particular characterization files.

All of the above named directories may be a subdirectory under a general synthesis directory 599.

A C-shell script named 'crds' (for CReate Directory Structure) is provided to automatically setup the synthesis environment. The script creates:

The directory structure that has been described above.

The ".synopsys_dc.setup" script that is needed to setup Design Compiler, so that the tool knows where to find all required files.

Setting up an efficient synthesis environment is usually difficult for designers who are not Design Compiler experts. In particular, it is difficult for a non-expert to create an appropriate ".synopsys_dc. setup" file. Some variables that control file finding mechanisms have to be understood and set properly, and many settings can impact the efficiency of synthesis and the quality of results. So the "crds" utility is quite an important feature for users of VEGA.

2. Created Scripts and Script Flow

VEGA supports the synthesis methodology described by the present disclosure based on an initial mapping using default constraints, followed by several passes of top-down characterization and bottom-up re-synthesis based on characterization data.

In order to implement this methodology, VEGA creates the following major scripts: Script "<top-level-name>_make_lib.scr" customizes the target technology library, and creates a local library that is then used to link the design. Customization includes setting "dont_use" attributes on some library cells that for some reasons should not be used by synthesis, adding models for memories used in the design, and defining non-standard operating conditions for the design.

Script "<top-level-name>_ungroup.scr" re-arranges the design hierarchy to make it more suitable for synthesis, based on user's directives. Hierarchy re-arrangement is discussed in details further in this disclosure.

Script "<top-level-name>_inimap.scr" performs initial mapping, which consists in bottom-up synthesis of the design, based on default I/O constraints that will be described later on.

Script "<top-level-name>_charac. scr" performs top-down characterization based on a given implementation of the design in the target technology, and on constraints for the top-level design. Resulting files are saved in the VEGA work area.

Script "<top-level-name>_recomp.scr" performs bottom-up re-synthesis based on characterization data. Characterization files are read from the VEGA work area.

Script "<top-level-name>_report.scr" runs Design Compiler reporting commands on a given implementation of the design to obtain reports on area, used cells, timing and violated design rules and constraints.

Script "<top-level-name>_global.scr" implements the whole process, including initial mapping, several passes of characterization/re-synthesis, and final reporting.

Figure 27:
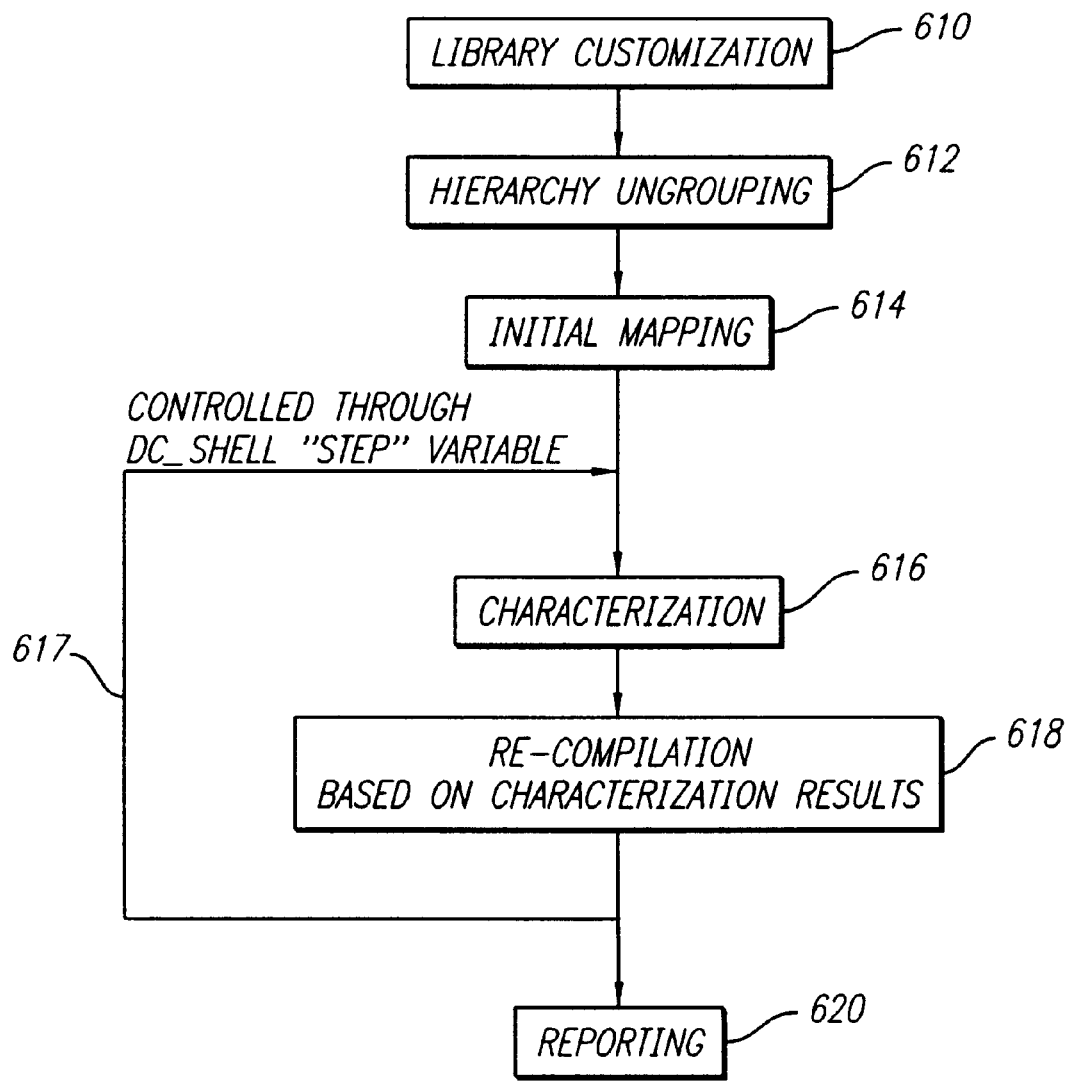
FIG. 27 is a flowchart illustrating the script flow implemented by VEGA.

The synthesis flow implemented by VEGA scripts is represented by FIG. 27. Referring now to FIG. 27, the flow chart illustrating the script flow implemented by VEGA is a illustrated. The script generated by VEGA, first customizes 610 the library to be used for the synthesis of the IC design. Then, module hierarchy of the IC design may be ungrouped 612 for various reasons as discussed. The module is initially mapped, 614, using default contraints as discussed. After the initial mapping 614 of the modules, the modules are characterized 616 and recompiled, or resynthesized, 618 based on the results of characterization 616. The characterization 616 and resynthesis methods have been detailed herein and above. The characterization 616 and the resynthesis 616 steps are repeated until a certain predetermined condition is met 617. A dc_shell variable named "step", that has to be set by the user, is used to control iterations through the characterization/re-synthesis loop. Names of files are based on the value of "step". For example, file DB file created at the second step of re-synthesis. Finally, the results of the execution of the VEGA generated script is reported 620.

3. Automatic Constraints Definition

As discussed, described herein, the following major benefits are associated with the automatic generation of synthesis scripts based on RTL analysis:

Knowledge of the target technology and associated design rules can be embedded in scripts.

Knowledge of the target synthesis tool can be embedded in scripts.

Constraints can be inserted in scripts based on design information extracted from RTL code, in particular the design hierarchy and clock signals.

Those objectives have been addressed in VEGA through a number of features that are described in the following sections.

a. "Dont_use" Cells

For various reasons, VEGA automatically makes some cells of the target technology library unusable for synthesis.

The script that builds the customized library (named "<top-level-name>_make_lib.scr") sets "dont_use" attributes on the following cells:

JK-flipflops, that are often used by Design Compiler to implement registers that can either hold their data or load new data synchronously. Designs that include JK-flipflops can be quite tricky to investigate, for example when debugging gate-level simulations. So JK-flipflops are made unusable, thus forcing Design Compiler to use D-flipflops.

Flipflops that do not have a scan equivalent, when a scan test approach is used. In this case, a scan insertion tool, like Synopsys Test Compiler, is used after synthesis to replace all flipflops with an equivalent "scan flipflop", that includes an additional multiplexer. Although variables are available in Design Compiler to declare the use of a scan test methodology, examples have been found where flipflops with no scan equivalent were used by Design Compiler, causing scan insertion to fail. In order to avoid that, flipflops with no scan equivalent are explicitly made unusable using "dont_use" attributes.

Low-skew flipflops, when a scan test approach is used. Those flipflops have been specially designed to reduce the risk of hold-time violations in scan chains, and should be used for scan insertion only.

Delay cells. Such cells have to be used carefully, for special purposes only. As described above, a typical application is the generation of RAM write enable pulses. Because the "delay" function cannot be declared in technology libraries for Design Compiler, the tool sometimes uses delay cells as buffers. A "dont_touch" attribute is then set on delay cells, so that only designers can make use of those cells, through instantiating them in the RTL code. Experience showed that a "dont_touch" attribute also has to be set on delay cells to avoid undesirable optimizations by Design Compiler.

Weaker buffers, weaker inverters and low-power cells, for the initial mapping only. Based on experience, Design Compiler tends to introduce large buffering trees built with low drive-strength buffers and inverters during the initial mapping, that do not get significantly reduced by further characterization and re-synthesis steps. Therefore, only five high-drive buffers and five high-drive inverters are left usable for initial mapping. All buffers and inverters available in the target library are then made usable again for further passes of re-synthesis based on characterization data.

b. Design Rules

A "max_fanout" design rule is set to 40, every time a design is mapped from RTL to gates, or re-optimized at the gate level. This design rule directs Design Compiler not to include any net that drives more than 40 input pins, and is dictated by characteristics of LSI Logic's technologies and backend tools.

A "max_transition" design rule is set whenever appropriate to a value that depends on the target technology. This design rule controls transition times at the output pins of cells. It has to be set properly to make sure that synthesized netlists do not include a number of ramp time errors that is too large to be fixed by post-layout correction tools, like Synopsys' IPO or LSI Logic's LSIITO. Based on experience, Design Compiler tends to introduce large buffering trees built with low drive-strength buffers and inverters when a "max_transition" design rule is set for the initial mapping, that do not get significantly reduced by further characterization and re-synthesis steps. Therefore, the "max_transition" design rule is set only in the characterization script, so that it is taken into account only we re-optimizing the netlist produced by the initial mapping or a previous step of re-synthesis.

c. Clock Definitions

Clock definitions are among the most important timing constraints, and are used by the logic synthesis tool to structure the logic effectively.

For the initial mapping, all clock signals used or/and created in each module that is synthesized have to be identified and defined. If done "manually", this can be a time-consuming and tricky process, because some designs use complex clocking schemes (for example gated clocks) and because clock signals can change names throughout the design hierarchy. For characterization, all clock sources have to be identified in order to define top-level constraints. Clock sources have to be defined as they are seen from the top-level of the design, using absolute paths from top-level to source pins.

As described above, VEGA extracts all clock sources and nets form RTL code. The tool then uses this knowledge to automatically insert clock definitions in scripts wherever needed. The user only has to define periods and waveforms of the different clock signals, using a script that is prepared by VEGA and named "<top-level-name>_clock_vars.scr". In this script, that is referred to as the "clock variables script", all clock nets are listed using arbitrary numbers allocated by VEGA, and used in RTL analysis reports and scripts. For each clock signal, the user sets the two "dc_shell" variables that will hold the period and the waveform values. Those period and waveform variables are then used by VEGA to insert clock definitions wherever in scripts.

Design compiler provides two commands to handle clock definitions:

The "create_clock" command defines a clock signal, with an associated period and waveform. This is the clock definition command, that generates timing constraints on the logic to be synthesized.

The "set_dont_touch_network" command, when applied to a clock net, prevents its buffering through synthesis. Clock nets are usually buffered after synthesis, using "balanced clock trees" that are inserted by LSI Logic's BCT Compiler.

By default, for each clock that was extracted from the RTL code, VEGA inserts both "create_clock" commands and "set_dont_touch_network" commands in generated scripts. Command lines in the "VEGA_synthesis.setup" file are available to users to modify this default mechanism for any clock signal:

The "ignore_clock" directive suppresses the insertion of "create_clock" commands; and The "buffer_clock" directive suppresses the insertion of "set_dont_touch_network" commands.

Using those directives, the following issues can be addressed:

Low-fanout clocks, that are only local, can be buffered through synthesis. With some attention paid to placement, an appropriate clock skew can be achieved. This saves balanced clock trees, that involve significant additional silicon area and engineering effort.

Timing constraints associated with a clock can be suppressed. In some modules, timing is easily met by synthesis, and constraints only create unnecessary issues and increase CPU time.

An example of clock variable script is given in Appendix F. Values of variables that have to be set by the user are indicated with question marks. Note that the source pin for each clock net is reminded in comments to the user. Detailed information on each clock net is available in clock-related reports created by VEGA. Also note that an "ignore_clock" directive was set on Clock #2 in the "VEGA_synthesis.setup" file. Therefore, as no "create_clock" commands have to be inserted in generated scripts, the period and waveform definitions are not needed for Clock #2.

Some designs include clock signals that are both created by and used inside synthesized logic, and are referred to as "internal clocks". Before running the initial mapping script, sources of internal clocks consist in output pins on generic cells. During initial mapping, Design Compiler replaces the generic cells that create clock sources by technology cells, causing names of cells and pins to change. Then, the new names of clock source pins have to be used for characterization and re-synthesis. In other words, names of clock source pins get modified during initial mapping, and there is no way to "guess" about the new names Design Compiler gives to them. When initial mapping completes, a script that defines "dc_shell" variables holding the new names of clock source pins, as seen from the top-level, is written out in the VEGA work area. This script is then re-loaded by the characterization script.

d. Default I/o Constraints

Default I/O constraints are used to constrain each module that is synthesized during initial mapping. For each module, the following default I/O constraint script (named "<top-level-name>_io_const. scr") that is included by the initial mapping script sets the following constraints:

A default driving cell is set on each module input port. In order to avoid issues associated with flipflop-to-flipflop timing paths that span several modules, all module outputs should be registered. Therefore, VEGA uses a flipflop of the target technology as the default driving cell.

A default load is set on each module output port. VEGA uses 8 input pins of a Nand-2 gate of the target technology as the default load.

Note that VEGA uses its embedded knowledge of the target technology to properly set input driving cells and output loads. An example of default I/O constraints script is given Appendix A9.

A default input delay is also set on each input port, and a default output delay is set on each module output. Those settings are made in the initial mapping script itself, because they are relative to a given clock. VEGA uses the knowledge of clock signals it extracted from the RTL code to perform those setting correctly. The delay values that are used are controllable through the "VEGA_synthesis.setup" file.

4. Structure of Major Scripts

The following sections describe the structure of major scripts created by VEGA, that include the initial mapping script, the characterization script, and the re-synthesis script.

a. Initial Mapping Script

Figure 28:
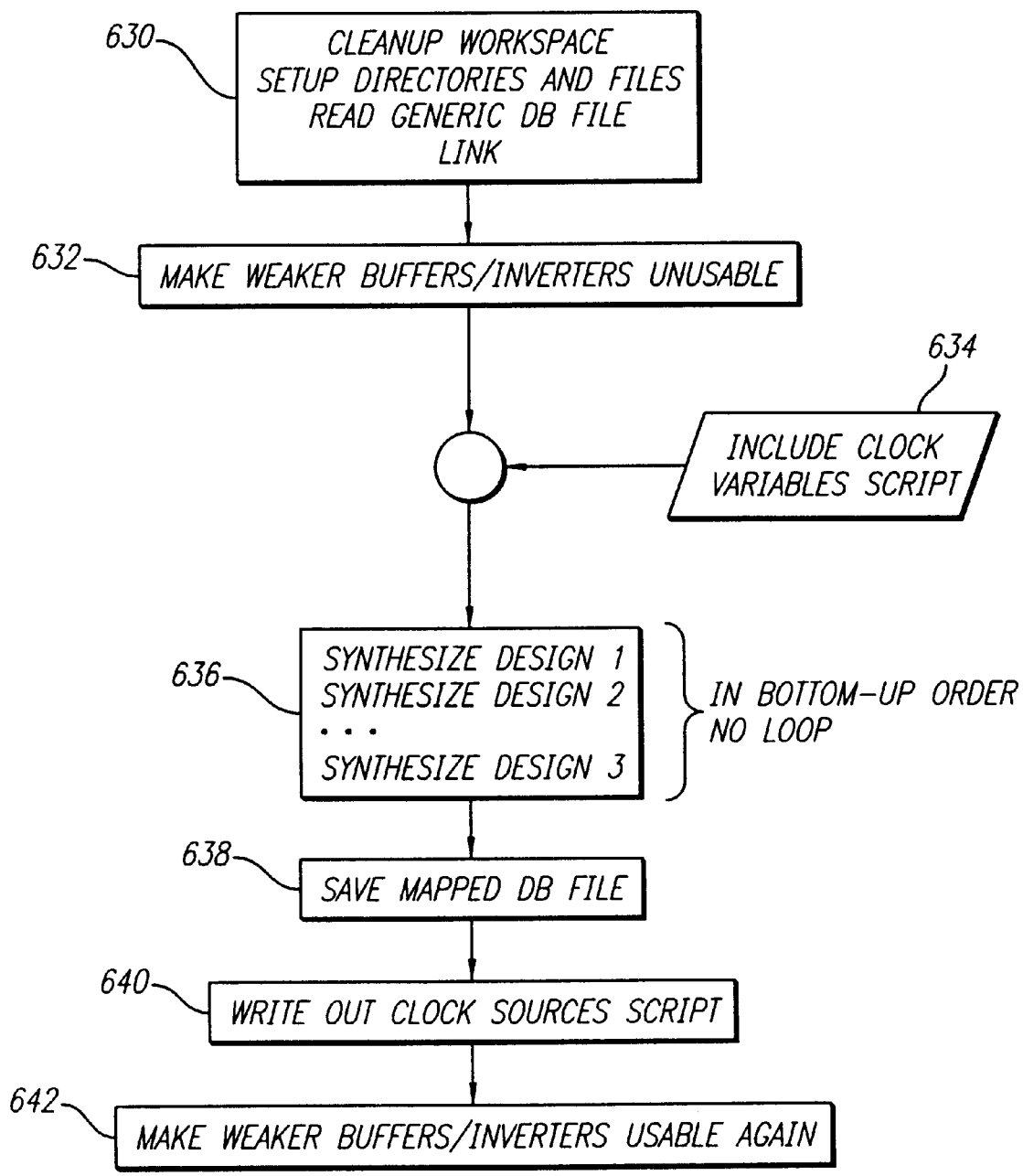
FIG. 28 is a flowchart illustrating the structure of initial mapping script.

The structure of the initial mapping script is represented FIG. 28. Referring now to FIG. 28, the structure of the initial mapping script is illustrated by a flow chart. The first set of scripts, or commands, for the dc shell environment, is a set of commands 630 to prepare for the synthesis. These preliminary scripts include scripts to clean-up work space, to set-up directories and files as described in FIG. 28, to regenerate data base files, and to link libraries. Then, weaker buffers and inverters are designated unusable for the purposes of the synthesis 632. Then, the cloud variable scripts 634 is included. A sample cloud variable script is attached as Appendix F. The initial mapping script synthesizes designs and its modules in bottom-up order 636 as already discussed. The map data base files are then saved 638. The clock sources script is produced 640. Finally, the weaker buffers and inverters are made usable again 642. Note that no loop is used to synthesize all design in bottom-up order, so that users can easily understand the flow and customize the script. A sample initial mapping script is attached as Appendix M2.

Figure 29:
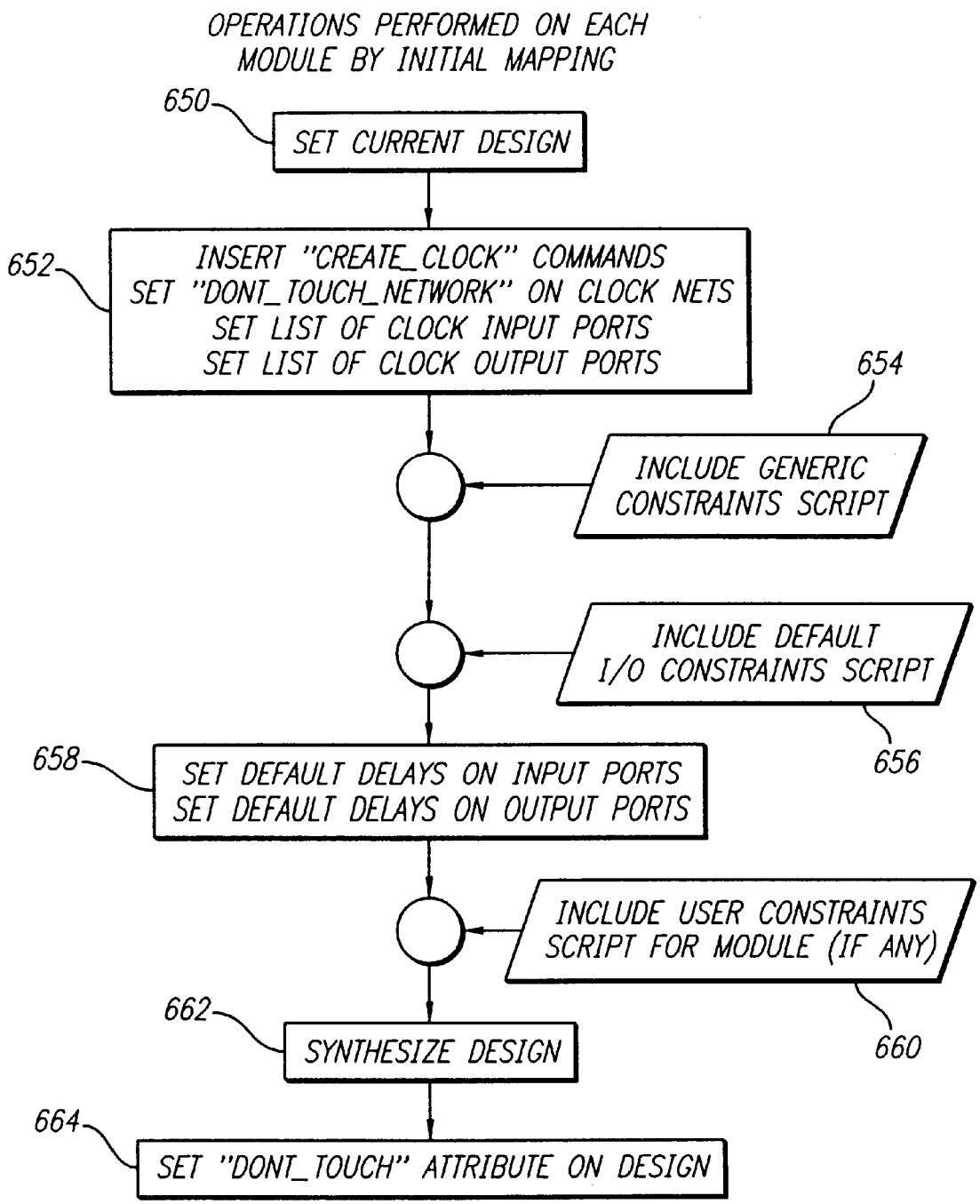
FIG. 29 is a flowchart illustrating operations performed on each module by initial mapping.

Each of the operations that are performed for each module that gets synthesized is represented in FIG. 29 as follows:

After determining 650 the design, or the module, to be mapped, clocks are defined 652 using Design Compiler's "create_clock" command, and a "set_dont_touch_ network" is set on all clock nets 652.

A list of all clock input ports and a list of all clock outputs are set 652. These lists are used later to apply constraints on all input ports that are not clock ports, and on all output ports that are not clock ports.

A script containing generic constraints 654, that have to be applied every time a module is synthesized or re-optimized, is included. This script is created by VEGA, and sets the "max_fanout" design rule, the operating conditions and the test methodology (scan or no-scan).

A script containing default I/O port constraints 656 is included. As described above, this script is created by VEGA, and sets a default driving cell on input ports that are not clock ports, and a default load on output ports that are not clock ports.

Default input delays are set 658 on input ports that are not clock ports, and default output delays are set 658 on output ports that are not clock ports. As described above, each input/output delay constraint must be set relatively to a given clock, and VEGA uses the knowledge of clock signals it extracted from RTL code to set all I/O delay constraints properly.

An optional constraints script 660, created by the user, is included. A "which" command is inserted by VEGA in the initial mapping script to search for a script named "<current-design-name>_user_inimap_const.scr". If the script is found in Design Compiler's search path, it gets included. This allows users to overwrite default constraints on a module basis, and/or add specific constraints on a module basis. This built-in mechanism minimizes the amount of changes a user will have to make to the initial mapping script to customize module constraining.

The design is synthesized 662.

A "dont_touch" attribute is set 664 on the design to prevent its re-synthesis from upper levels (basic principle of bottom-up synthesis).

b. Characterization Script

Figure 30:
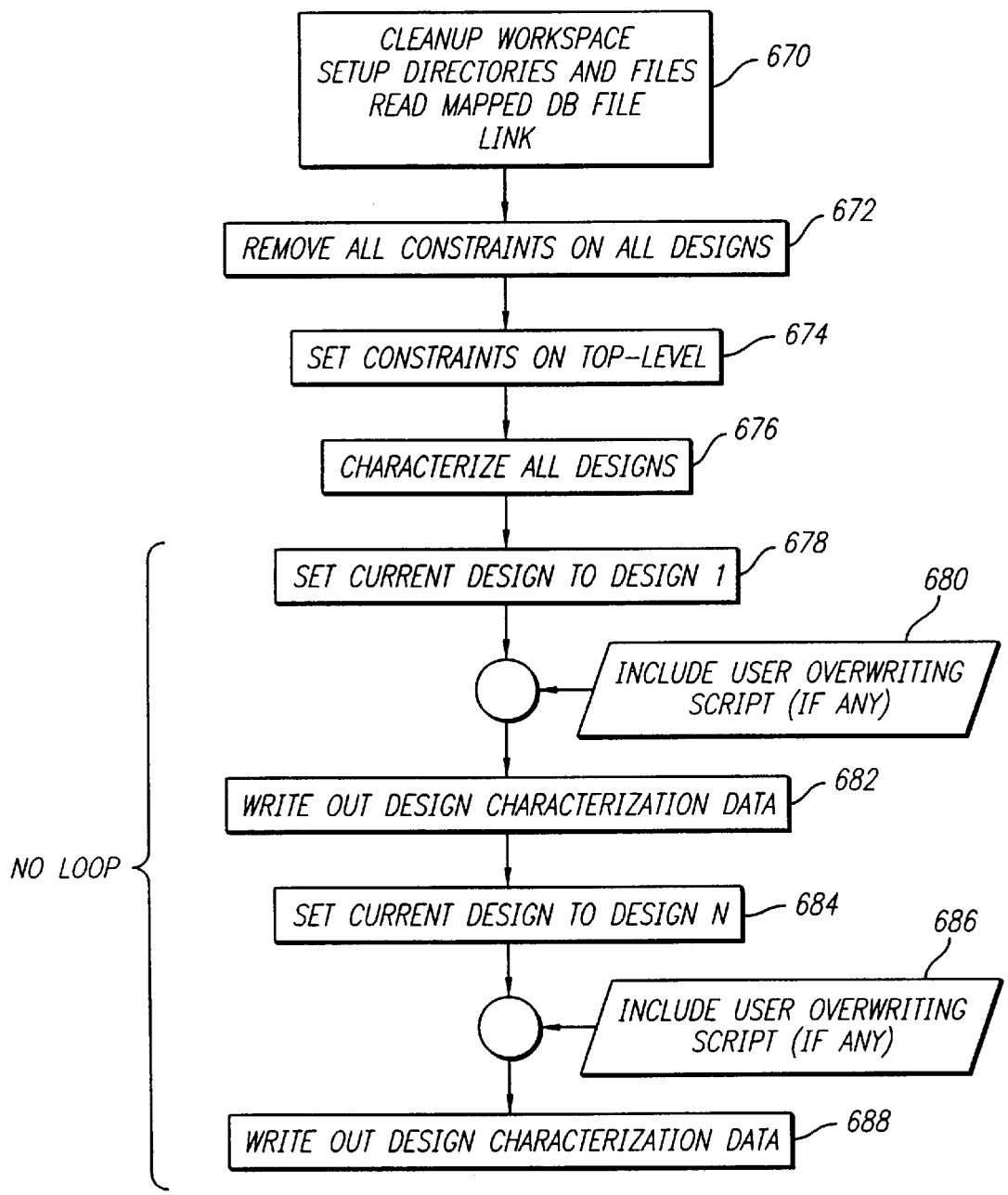
FIG. 30 is a flowchart illustrating the structure of characterization.

The structure of the characterization script is represented FIG. 30. The characterization of all modules, that is represented as a single box 676 in FIG. 30, has been designed so that run times are optimized. When modules are characterized one by one, which is the trivial process, top-down characterization proves to be a CPU-time bottleneck.

Referring again to FIG. 30, the flow chart illustrating the structure of characterization script generated by the VEGA system is shown. As with the preliminaries commands for the script for initial mapping, the preliminary script commands 670 for the characterization script cleans up the work space, set-ups directories and files, reads mapped data base files, and links to libraries. To characterize each of the designs, or modules, all current constraints are removed to 672. Because the characterization process is the topdown process, the constraints on the top level is first set 674. Then all designs are characterized 676. Then for each design 678, a design characterization is written out or noted in the data base 672. Prior to writing out design characterization data, user may override the characterization data by including overwriting scripts 680. The writing of design characterization data is repeated for each of the data as indicated by steps 684, 686, and 688.

No loop is used to write out the characterization data for each module, using the "write_script" command. Before writing out the characterization data for a given module, an optional overwriting script, created by the user, is included. A "which" command is inserted by VEGA in the characterization script to search for a script named "<current-design-name>_overwrite_charac.scr". If the script is found in Design Compiler's search path, it gets included. This allows users to overwrite characterization data on a module basis before it gets written out in characterization files. This built-in mechanism minimizes the amount of changes a user will have to make to the characterization script to customize characterization results.

Figure 31:
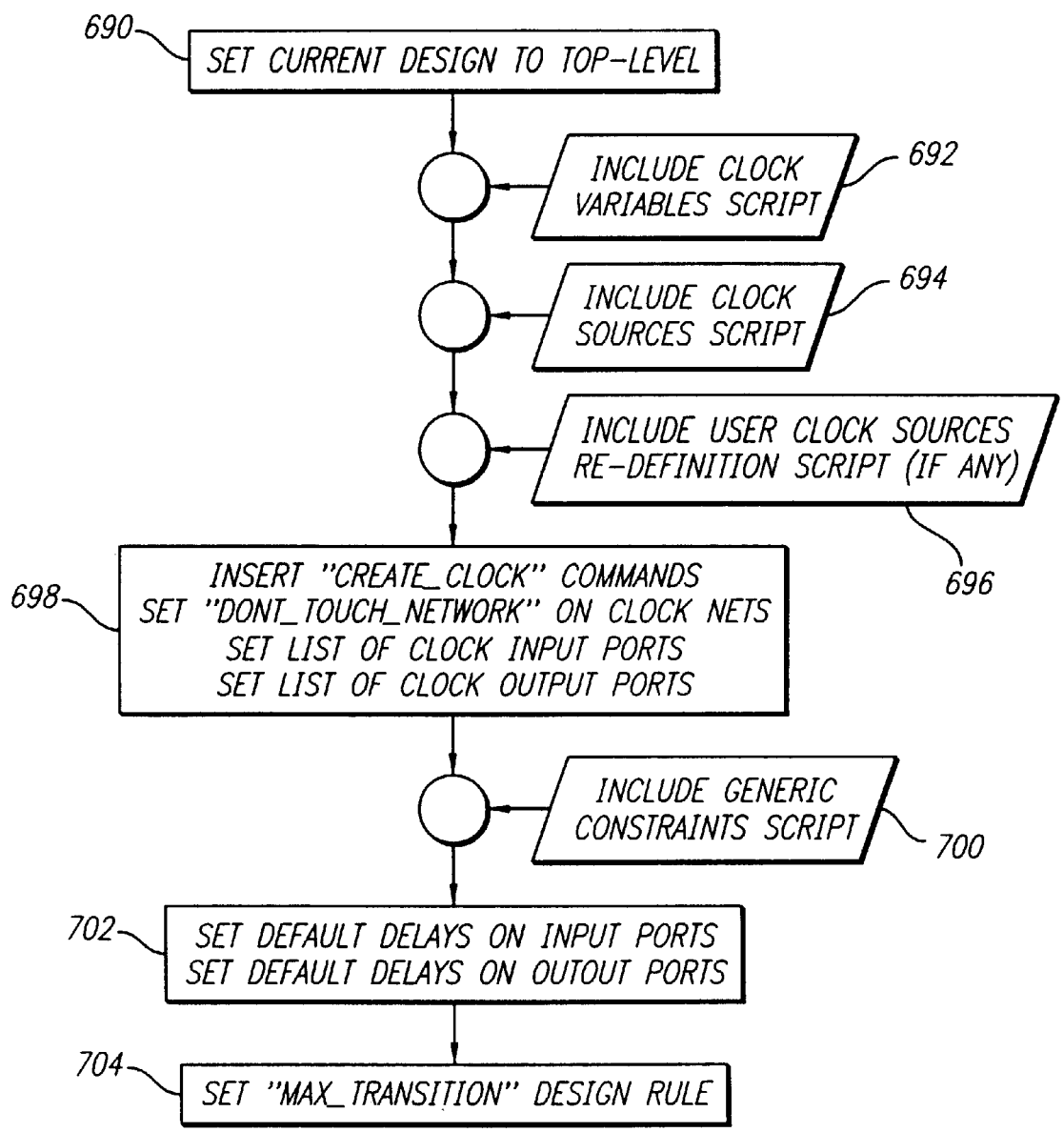
FIG. 31 is a flowchart illustrating the structure of constraints setting on top-level.

FIG. 31 describes how constraints are applied on the top-level design, before performing the characterization of all modules in a top-down 690 manner.

The clock variables script 692 is included first, that sets variables containing the period and the waveform for each clock signal.

The clock sources script 694 is included, that sets variables containing the source pin/port for each clock in the design, as seen from the top-level (absolute paths from top-level to pins). This script is created by the initial mapping, that saves it in the VEGA work area. As described above, this mechanism is needed to handle clock signals that are created by synthesized logic.

An optional clock sources definition script 696, created by the user, is included. A "which" command is inserted by VEGA in the characterization script to search for a script named "<top-level-name>_user_clock_sources.scr". If the script is found in Design Compiler's search path, it gets included. This allows users to overwrite the definition of clock sources created by the initial mapping, in case this is needed.

Clocks are defined using Design Compiler's "create_clock" command 698, and a "set_dont_touch_network" is set 698 on all clock nets.

A list of all top-level clock input ports and a list of all top-level clock output ports are set 698. Those lists are used later to apply constraints on all input ports of the top-level that are not clock ports, and on all output ports of the top-level that are not clock ports.

The script containing generic constraints 700, that have to be applied every time a module is synthesized or re-optimized, is included again, and sets the "max_fanout" design rule, the operating conditions and the test methodology (scan or no-scan).

Default input delays are set 702 on top-level input ports that are not clock ports, and default output delays are set 702 on top-level output ports that are not clock ports. Each input/output delay constraint must be set relatively to a given clock. VEGA uses the knowledge of clock signals it extracted from RTL code to set all top-level I/O delay constraints properly.

The "max_transition" design rule, that is needed to control ramp times, is set 704 on the top. This design rule will be propagated down to leaves of the design, together with the "max_fanout" constraint that is set by the generic constraints script. A sample generic constraints script is attached as Appendix T.

Finally, an optional constraints script, created by the user, is included. A "which" command is inserted by VEGA in the characterization script to search for a script named "<top-level-name>_user_top_const.scr". If the script is found in Design Compiler's search path, it gets included. This allows users to overwrite default constraints set on the top-level, and/or add specific constraints on the top-level. This built-in mechanism minimizes the amount of changes a user will have to make to the characterization script to customize constraining of the top-level.

c. Re-synthesis Script

Figure 32:
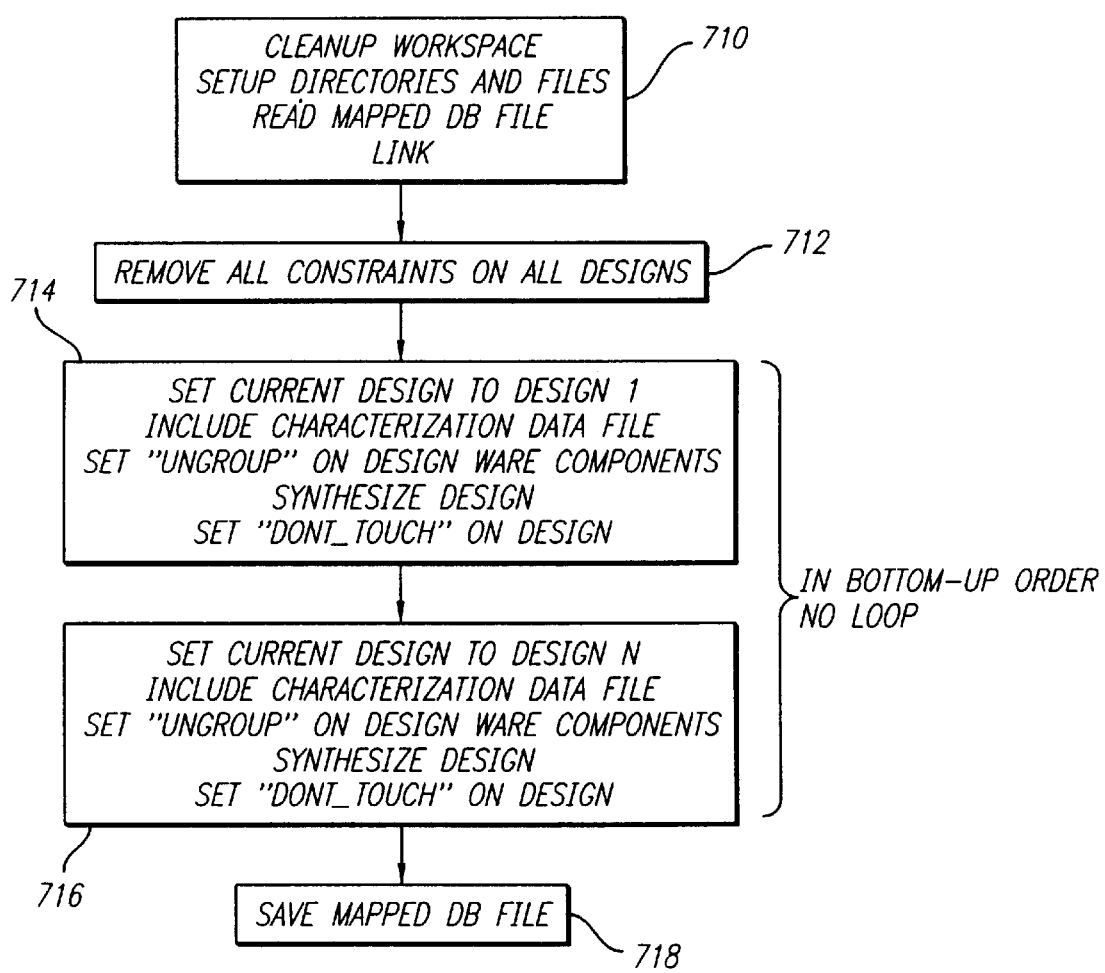
FIG. 32 is a flowchart illustrating the structure of re-synthesis.

The structure of the re-synthesis script is represented in FIG. 32. Modules are re-synthesized in bottom-up order, based on characterization data created by the characterization script.

For each design, the following operations are performed:

Referring to FIG. 32, as with other scripts, the initial set of scripts 710 perform preliminary functions to clean-up work space, set-up directories and files, read mapped data base files, and links to libraries. Then, all prior constraints on all design and modules are removed 712.

The file that contains the characterization data for the module is included 714. Note that there is no mechanism in place to overwrite constraints that are set by the characterization files. This is not needed, because the characterization data generated by Design Compiler can be overwritten by users in the characterization script itself, before it gets written out in a file (see section describing the structure of the characterization script).

If requested by the user, an "ungroup" attribute is set 714 on Designware modules, that were inferred from arithmetic operators in the RTL code, like '+', '−' or '*'. When the design gets synthesized, specific modules created by Design Compiler to embed Designware logic will be collapsed.

The module is synthesized 714. This is actually a re-optimization that takes place, because the design was already mapped to the target technology by the initial mapping script.

A "dont_touch" attribute is set 714 on the module to prevent its re-synthesis from upper levels in the design hierarchy (basic principle of bottom-up synthesis).

Note that no loop is used to re-synthesize all designs in a bottom-up order, so that users can easily understand the flow and customize the script if needed. Instead of using loops, script is created to perform all of the above described functions for each of the modules, or designs, 716. Finally, the mapped data base is saved to file 718.

5. "VEGA_synthesis.setup" File

The "VEGA_synthesis.setup" file allows users to set a number of options and parameters, and also give script generation directives to VEGA. An example of "VEGA_synthesis.setup" file is given in Appendix A3.

The following options and parameters are available:

Script generation can be activated or bypassed.

Suffixes that VEGA adds to the name of the top-level design to create names of script files and synthesis-related report files can be re-defined.

An optional setup script can be included on top of each script created by VEGA. Some users make use of this option to setup Design Compiler through the synthesis scripts themselves, rather than through using the ".synopsys_dc.setup" file.

CPU efforts to be used by Design Compiler for the synthesis of modules in the initial mapping script and the re-synthesis script can be selected. By default, a "medium" effort is used for both initial mapping and re-synthesis.

Design Compiler can be directed to use either incremental synthesis for the re-synthesis of modules (switch "-incremental" in the "compile" command), or full synthesis.

The number of characterization/re-synthesis passes can be set. This controls the generation of the global flow script, that includes initial mapping, iterative improvement using successive passes of characterization/re-synthesis, and final reporting. By default, two passes are used.

Modules created by Design Compiler to embed Designware logic can be removed during a given step of re-synthesis, or preserved. The target technology has to be specified.

The operating conditions have to be specified. Any operating condition name is accepted, so that users can create customized operating conditions, for example when a specific operating temperature must be taken into account.

Scan test methodology can be enabled or disabled. This controls the types of cells that are made unusable for synthesis, so that flipflops that do not have a scan equivalent are not used by synthesis. This also triggers the insertion of commands that declare to Design Compiler that scan testing is going to be used.

The value of input/output delays used to constraint individual modules during the initial mapping can be defined. The default value depends on the target technology.

The value of input/output delays used to constraint the top-level module for the initial mapping and for characterization can be defined. The default value depends on the target technology.

The following directives are available to control script generation:

An "ungroup" directive can be used to collapse some modules prior to synthesis, in order to build a design hierarchy that is more suitable for synthesis. This directive triggers the generation of a VEGA script that re-arranges the design hierarchy, according to directives. The new hierarchy, as it will look like after ungrouping is applied, is taken into account by VEGA when generating the initial mapping script, the characterization script, and the re-synthesis script. So there is no need to get back to Design Compiler, apply ungrouping, and re-run the dump script to prepare new input files to VEGA. Scripts are directly generated for the re-arranged hierarchy.

A "characterize" directive is available to direct VEGA to using a particular instance for characterizing a design that is instantiated multiple times. The instance that has the most severe constraints should be selected (Golden Cell). If the "characterize" directive is not used, VEGA picks an instance arbitrarily.

A "compile" directive allows users to specify that a given hierarchical module has to be synthesized hierarchically by Design Compiler. The module is then synthesized at once retaining its hierarchy (Design Compiler's "compile" command issued on the module), instead of being synthesized using the bottom-up process on its sub-modules.

A "dont_touch_design" directive is available to specify to VEGA that a given module should not be synthesized and characterized. The module is loaded into Design Compiler's workspace though, so that other connected modules can be characterized properly. A typical application is the integration of CoreWare cores (IP cores), that are available as "hard macros", and should not be modified.

An "ignore_clock" directive and a "buffer_clock" directive are available to control clock definitions and clock net buffering (see section on clock constraints).

A "no_buffering" directive can be used on any net to prevent its buffering through synthesis. This can be used when balanced clock trees are needed to distribute some nets that are not clock nets, like asynchronous reset nets and scan enable nets.

Directives can be inserted by users in any order in the "VEGA_synthesis.setup" file. VEGA first sets attributes on design objects according to directives, then checks the consistency of all attributes. For example, a module that has a "dont_touch" attribute cannot also have a "compile" attribute.

6. Synthesis Hierarchy Report

VEGA creates a report referred to as the "synthesis hierarchy" report, that summarizes the synthesis information based on the hierarchy of the design and on user's directives that are inserted in the "VEGA_synthesis.setup" file:

If "ungroup" directives are used to collapse some modules prior to synthesis, the report represents the design hierarchy as it will look like after ungrouping is applied. Gate-count estimates are updated through adding up estimates of all collapsed modules. The hierarchy purity and the numbers of registered and non-registered outputs of modules are also updated.

If "compile" directives are used to synthesize some modules hierarchically instead of bottom-up, the report highlights modules that are synthesized hierarchically, using a "*HC" stamp on the right-hand side.

If "dont_touch_design" directives are used to import modules that are created apart and do not have to be synthesized and characterized, like CoreWare cores, the report uses a '*DT' stamp on the right-hand side to highlight modules that are imported only.

When a design is instantiated several times, the report indicates the total number of instances, showing that a "characterize" directive should be used to direct characterization to a particular instance. If the directive is used, a '*C' stamp is used on the right-hand side of the report to flag the selected instance.

The "level" of modules, that drives the processing order of modules in the bottom-up synthesis process and in the top-characterization process is showed on the right-hand side of the report. Leaves always have level zero, and the top-level always have the maximum level value.

The "depth" of modules, that corresponds to the number of hierarchy levels from the top-level, is also showed on the right-hand side of the report.

An example of synthesis hierarchy report is given in Appendix I.

7. Re-arranging the Design Hierarchy

As discussed above, re-arranging the design hierarchy is a critical step, that directly impacts run times of synthesis tools, and their ability to meet timing constraints and optimize the gate count. Looping through synthesis to evaluate decisions is not affordable, because of run times (typically 20 to 40 hours for initial mapping).

The synthesis hierarchy report created by VEGA shows the effects of "ungroup" directives in the "VEGA_synthesis.setup" file, representing the new hierarchy with updated gate-count estimates, numbers of registered/non-registered outputs, and hierarchy purity. There is no need to get back to Design Compiler, apply ungrouping, and re-run the dump script to prepare new input files to VEGA. So a user can quickly loop in VEGA, inserting new "ungroup" directives and immediately evaluating their effects. Scripts can then be directly created for the re-arranged hierarchy, with again no need to get back to Design Compiler.

The accuracy of module size estimates, that are accumulated by VEGA based on "ungroup" directives, is a limiting factor in that process. If estimates are not accurate enough, then modules can turn out to be much bigger or smaller than expected after synthesis. A good accuracy/CPU-time trade-off to obtain module size estimates consists in synthesizing the design to the Synopsys GTECH library, then run VEGA on the obtained netlist.

Synthesis scripts generated by VEGA create detailed CPU time reports when running. The CPU time needed for the initial mapping of each module in given in this report, and can be used to refine hierarchy re-arrangement. Modules that run very fast through synthesis may be merged with other modules. Modules that were built through merging smaller modules together and that take an excessively long time to run through synthesis should be re-visited. This of course requires that the initial mapping script is run, that will typically run for 40 hours on a Sun/Ultra-II workstation for a 350 kGates design.

An example of CPU time report created by the initial mapping script is given in Appendix J.

H. INTERNAL CLOCK HANDLING IN SYNTHESIS SCRIPTS CREATED BY VEGA FOR SYNOPSYS DESIGN COMPILER

This section details the technique used by the VEGA system to handle clock signals that are created by and used in synthesized logic, and that are referred to as "internal clocks".

1. Issues Associated with Internal Clocks

FIG. 39 represents a design that has three clock signals. Clock "CLK1" 325 is an external clock (created outside of the core logic), that enters the design core through the input port "SRC1" 327 on the top-level. Clock "CLK2" 329 is an internal clock, that is created by some combinational logic circuit 332 of module 330 and used by a register 336 of module 334. Clock "CLK3" 324 is another internal clock, and is created by combinational logic-circuits 340 and used by register 342, all within module 338.

Throughout the synthesis process, the source of clock "CLK1" 325 remains the input port "SRC1" 327 on the top level. So no issues are associated with the definition of this clock. CLKI 325 supplies the clock signal to register 328 of module 326.

Before running the initial mapping script, sources of internal clocks "CLK2" 329 and "CLK3" 324 consist in output pins of generic cells. The names of those pins are extracted by VEGA, that uses the generic netlist created by Design Compiler's "elaborate" command as its input description.

During the initial mapping, Design Compiler replaces the generic cells that create internal clocks by technology cells, thus causing names of cells and pins to change. Names of source pins for clocks "CLK2" 329 and "CLK3" 324 are then needed for characterization and re-synthesis, but are no longer available. In other words, names of source pins of internal clocks get modified during initial mapping, and there is no way to "guess" about the new names Design Compiler gives to them.

Another issue is associated with internal clocks, that relates to Design Compiler's "create_clock" command available to define clocks. Clock definitions are used to derive timing constraints on the logic to be synthesized, and are among the most important synthesis constraints. When a "create_clock" command is applied to an output pin of a generic cell, that can be a gate or a flipflop, then this cell is not mapped to the target technology by synthesis. In other words, the "compile" command, that is Design Compiler's command to synthesize a design, does not map cells that have clock definitions set on their output pins to the target technology.

2. Solution Implemented in VEGA

Internal clock handling in synthesis scripts created by VEGA has been implemented based on a number of principles, that are described in the following sections.

a. Mapping Cells That Create Internal Clocks

As already mentioned, Design Compiler's "compile" command does not map to the target technology generic cells that have clock definitions set on their output pins. The following synthesis process is used by VEGA to address this issue and is illustrated by FIG. 40:

1. The design 720 is mapped 726 to the target technology with internal clocks 727 defined;
2. Definitions of internal clocks 722 are removed 728;
3. The design 720' is synthesized again 730 to map cells that remained generic through the first synthesis pass 726. The "only_design_rule" option is used in the "compile" command 730, so that Design Compiler only maps remaining generic cells 721 and does not re-structure the logic 723'; and
4. Internal clocks 722' are re-defined 732 using new names of clock sources, U2/Z so that the design can be reported correctly after initial mapping.

The design 720' reflects the design 720 after the first compile pass. The design 720" reflects the design 720 after the second compile pass.

b. Accessing New Names of Clock Source Pins

As Design Compiler changes names of internal clock source pins when mapping the cells they belong to, names of other design objects, that remain unchanged through the initial mapping, are used whenever possible to access the new names of the source pins of internal clocks. After the initial mapping of a module completes, the following steps are performed:

If an internal clock is connected to an output port, the port is used to access the new name of the clock source pin. This is done through searching for the pin that drives the net connected to the port as illustrated by FIG. 41A. Referring to FIG. 41A, the design module 740, having a register 744 and combinational logic gate 742 has clock source at 745. Clock source 745, in design 740, is connected to an output port 746. Then, the output 746 can be used to access the new name of the clock source pen 745.

The same principle is used when the clock source pin is connected to the clock pin of a synchronous RAM as illustrated by FIG. 41B. Referring now to FIG. 41B, a design module 750 having synchronous RAM 754 and combinational logic circuit 752 with clock source 756 as illustrated. Because the clock source 756 is connected to RAM, the RAM can be used to access the new name of the clock source pen 756.

If the source pin is not connected to any output port or clock input pin of a RAM, a "dont_touch" attribute is set on the net that is connected to the clock source pin, and the name of the net is saved in a "dc_shell" variable. After initial mapping completes, the clock source pin is accessed through searching for the pin that drives the clock net as illustrated by FIG. 41C. Referring to FIG. 41C, a design 760 having a register 764 in combinational logic 762 is illustrated as having clock source 766. Because the clock source 766 is not connected to any output port or a RAM, a don't touch attribute is set on the net that is connected to the clock source 766, and the name on the net is saved in a dc_shell variable. Only after the initial mapping process, the clock source 766 is accessed through a search for the pen that drives the clock net.

An example of initial mapping script for a module that includes an internal clock is given in Appendix M1. Note that Appendix M1 includes only an excerpt that performs the initial mapping of a single module. A detailed description of the initial mapping script created by VEGA and other related scripts can be found elsewhere in the present invention disclosure.

In the example of Appendix M, the module is named "mp_if", and includes an internal clock that was arbitrarily named "clock #3" by VEGA. This clock is connected to the output port "ibus_we_en" of module "mp_if", that is used to retrieve the new name of the clock source pin after the initial mapping completes. Also, in the example script of Appendix M, note the following:

The list of pins/ports connected to port "ibus_we_ne" is obtained using the "all_connected" command (line 30–33).

The list of pin/ports connected to port "ibus_we_ne" is filtered to retain only output pins/ports. Output ports, if any, are then eliminated to retain only one output pin. This is the clock source pin for clock #3, that is stored in a dc_shell variable named "clock_pin" (line 34–42).

"clock #3" is defined, using the "clock_pin" variable (line 43). Note the use of variables "clock_period_3" and "clock_waveform_3" to define the period and waveform of "clock #3", that were set in the clock variable script by the user.

A "set_dont_touch_network" attribute is set on all clocks to prevent their buffering through synthesis (line 47–49).

Port "ibus_we_ne" is inserted on the list of clock output ports of the module (line 56). A list of data output ports, that are not clock output ports, is then defined (line 60) and used in the default I/O constraint script to set default output loads on output ports of the module that are not clock ports (line 64).

Module "mp_if" is synthesized (line 75).

Definition of "clock #3" is removed (line 78).

Module "mp_if" is re-synthesized with "-only_design_rule" option to avoid re-structuring of the logic (line 81).

The new source pin for "clock #3" is retrieved as already done before initial mapping of "mp_if", using connection of the clock net to output port "ibus_we_ne" (line 84–96).

clock #3" is re-defined, and a "dont_touch_network" attribute is set on it again (line 99–100). And, The new source pin for "clock #3" is saved, as seen from the top-level, in global variable "clock_source_3" (line 103). This variable will be use at the end of the initial mapping script to write out the clock sources script, that the characterization script uses to set constraints on the top-level.

c. Clock Sources Script

The names of source pins of internal clocks get modified during the initial mapping, and new names of clock source pins are needed for top-down characterization to set constraints on the top-level module.

The initial mapping script created by VEGA writes out a script after all modules are mapped to the target technology, that contains the new names of clock source pins. This script just consists in variable settings, each variable being set to the path from the top-level to a clock source pin. It is saved in the "VEGA work area" created and used by synthesis scripts, and is named "<top-level-name>_clock_sources.scr ". It is then re-loaded to set constraints on the top-level module in the characterization script. An example of clock sources script created by the initial mapping script is shown below:

clock_source_1=CKMP
clock_source_2=CK_38_SA
clock_source_3=CK_38_SB
clock_source_4=CK_TST2
clock_source_6=BUFCK/CK_19_S
clock_source_7=SUFCK/CK_1MS
clock_source_8=BUFCK/CK_38_S clock_source_9=BUFRM/CK_38N_RAM256
clock_source_10=BUFRM/CK_38N_RAM64

Note that clocks 1 to 4 are ports on the top-level (no hierarchical path), clocks 6 to 8 are created in module "BUFCK", and clocks 9 to 10 are created in module "BUFRM".

d. Accessing Clock Source Pins in Generic Netlists

As discussed, Design Compiler's "elaborate" command avoids creating new names for objects of generic netlists that it generates, and uses names of objects in the RTL code whenever possible. Names of flipflops in generic netlists are always built from the names of the RTL code signals that they generate, but names of gates sometimes have to be created arbitrarily by Design Compiler.

Therefore, when an internal clock is created by a gate in the generic netlist, both the gate and its pins may have been named arbitrarily by Design Compiler. VEGA extracts those names, and can issue correct clock defmitions in the initial mapping script based on those names. However, experience shows that even small changes in the RTL code can trigger a completely different naming of objects that cannot use RTL code names. If names of cells and pins in generic netlists were used for the definition of internal clocks that are created by gates, then small changes in the RTL could make the initial mapping script obsolete.

The initial mapping script can of course be re-created using VEGA to take into account name changes. Built-in mechanisms are in place to allow customization of initial mapping, through including user's constraints scripts on a module basis. However, if the initial mapping script has to be modified for some reasons, then the customization work would have to be done again if the initial mapping script is re-created.

Therefore, VEGA uses the following mechanisms to avoid defining clocks based on names that are created arbitrarily by Design Compiler. When performing the initial mapping of a module the following procedures are followed:

If an internal clock is connected to an output port, it is used to access the name of the clock source pin, through searching for the output pin that drives the net connected to the port.

If an internal clock is connected to a clock input pin of a synchronous RAM, it is used to access the name of the clock source pin, through searching for the output pin that drives the net connected to the RAM clock pin.

If an internal clock is connected to a clock input pin of a flipflop, it is used to access the name of the clock source pin, through searching for the output pin that drives the net connected to the flipflop pin.

This is obviously similar to the mechanisms that are used to retrieve names of source pins of internal clocks after initial mapping, that are illustrated by FIGS. 41a, 41b, and 41c.

3. Limitations and Workaround

As already described, the new names of source pins of internal clocks have to be retrieved after the initial mapping, and are needed to set constraints on the top-level for top-down characterization. Connections of clock nets to output ports and to clock input pins of synchronous RAMs are used whenever possible to retrieve the new names of clock source pins as illustrated by FIGS. 41A and 41B. When an internal clock net 766 of FIG. 41C has no connection to an output port or to a clock input pin of a synchronous RAM, the following process is used:

The name of the clock net 766 is saved in a "dc_shell" variable before the initial mapping begins, and a "dont_touch" attribute is set on it.

After the initial mapping completes, the new name of the clock source pin is retrieved through searching for the output pin that drives the clock net.

Experience shows that this process succeeds in a very large majority of cases. However, Design Compiler does not guarantee that a "dont_touch" attribute set on a net of a generic netlist will preserve it through synthesis, when running the "compile" command. A warning is actually issued when setting a "dont_touch" attribute on a net of a generic netlist.

Some optimizations performed by Design Compiler, that are referred to as "structuring", can actually cause internal clocks extracted from the generic netlist to be altered through initial mapping. FIG. 42 shows an example of design that has two internal clocks before the initial mapping, that are merged together when the design gets synthesized. In such a case, the initial mapping script will not be able to retrieve the initial clock nets, and will not be able to write out clock sources in the clock sources script. Design Compiler errors will occur when running the initial mapping script, and when running the characterization script. Referring to FIG. 42, design 770 has two internal clocks, UN/W 771 and UT/W 772 driving two synchronous RAM circuits 773 and 774. The results of the design 770 is shown in design 770' and having one internal clock U3/Z 775 driving to synchronous RAMs 773 and 774.

Such examples are extremely rare in practice. However, VEGA provides several mechanisms that can be used to deal with clocks that get altered during the initial mapping. First, internal clocks can be ignored using the "ignore_clock" directive in the "VEGA_synthesis.setup" file. This solution is appropriate when there are no tight timing constraints associated with a clock. It can also be used when there are no real opportunities for optimizing the logic, which is typically the case for the design of FIG. 42.

Also, internal clock sources written out by the initial mapping script can be overwritten by users of VEGA, using a script named "<top-level-name>_clock_sources.scr" that gets included by the characterization script.

An other possibility to avoid such problems consists in using Design Compiler's "set_structure" command to turn off "structuring", that introduces shared sub-expressions within the logic, if it does not significantly increase the amount of logic. Applied to the design of FIG. 42, the two multiplexers would then remain in place.

4. Handling Clock Generators

Whenever possible, LSI Logic recommends that all the internal clocks of a design are generated in a single module, that is referred to as "clock generator". If this is the case, then the "blackbox_design" directive can be used in the "VEGA_extract.setup" file to make the clock generator a blackbox. All design contents are discarded by VEGA, and only I/O ports are retained.

The directive will cause all clock sources to be defined as output ports of the clock generator, that is considered "empty" as shown in FIG. 43. Then, there is no need to deal with clock sources that are generated by synthesized logic, and the initial mapping script gets simplified tremendously. The clock generator can be synthesized apart from the rest of the logic, and is then re-imported into the design. Referring to FIG. 43, diagrams illustrating handling clock generators with a black box design is illustrated. Design module 780 serves as the clock source for module 782. Module 780 comprises combinational logic circuits 784, and in and output 786. Module 782 comprises a register 788. For the purposes of generating synthesis scripts, VEGA uses the black box designation in the VEGA extract set-up file to treat module 780 as a black box 780' for the purposes of generated synthesis scripts. Then, mapping scripts is greatly simplified.

I. EFFICIENT TOP-DOWN CHARACTERIZATION USING SYNOPSYS DESIGN COMPILER

The concept and the implementation of the module characterization process of the VEGA system has already been discussed. The simplest process to perform top-down characterization consists in characterizing one design at a time, starting from the root of the design and moving downwards to leaves. Over time, the number of gates of an IC design as increased with typical designs reaching or exceeding 300 kGates. With a large number of gates to synthesize, it became clear that the run times of top-down characterization had turned into a major bottleneck in the overall turn-around-time of synthesis. The VEGA system uses techniques to improve the speed of the top-down characterization step of the synthesis process. This section herein discusses the new top-down characterization technique and provide typical run-time improvement figures.

1. Synthesis Methodology Review

Characterization is used after a design has been mapped to the target technology. It consists in calculating the I/O conditions of a module based on surrounding modules, including driving strength of pins that are connected to inputs, arrival time of signals on inputs relatively to clocks, loads driven by outputs, time consumed in modules connected to outputs relatively to clocks, etc.

Top-down characterization consists in calculating all I/O conditions and constraints of modules in a hierarchical design. Constraints are first set on the top-level, then modules that are located one level down in the design hierarchy are characterized. The process continues until leaves of the design are reached. Using this process, constraints that were set on the top level, like operating conditions and clock definitions, are derived down to leaf modules. A "snapshot" of the design is thus obtained, with constraints set on the I/O ports of modules that both reflect the current implementation of the design and synthesis goals.

In order to fix violations in the netlist created by the initial mapping and optimize it properly, the following iterative improvement process is used:

Top-down characterization is used to capture actual constraints on I/O ports of modules, based on both the netlist that was created by the initial mapping and synthesis constraints; and Bottom-up re-synthesis based on constraints derived by characterization is used to re-optimize the design; and The above two steps are iterated until all violations get fixed, and the gate count get stable.

2. Module Levels

Throughout the synthesis process, modules in the design hierarchy have to be processed in the following order:

Bottom-up order for the initial mapping;

Top-down order for characterization; and

Bottom-up order for re-synthesis based on characterization results.

In a methodology note entitled "dc_shell scripts for synthesis" and dated August 1992, Synopsys described an algorithm that sets a "level" value on each module. All leaf modules receive level zero, and the top-level module receives the maximum level value. Modules can then be visited based on level values to implement the required the following processing order:

Increasing level values for bottom-up processing, starting from zero; and

Decreasing level values for top-down processing, starting from the level value of the top-level module.

VEGA also makes use of module levels to implement bottom-up processing and top-down processing. The algorithm described by Synopsys to compute levels has been extended to handle "compile" and "dont_touch_design" directives, that users can insert in the "VEGA_synthesis.setup" file. In particular, modules that have a "compile" directive set on them are synthesized at once, as single units. Their sub-modules are neither synthesized nor characterized individually. Therefore, modules with "compile" directives are always considered as leaves and receive a zero level value. Levels of their sub-modules are left unset (−1 value).

And, modules that have a "dont_touch_design" directive set on them are only imported in the design. They are neither synthesized nor characterized, so their level value is left unset (−1 value). The same applies to all their sub-modules.

Algorithm 1, attached as Appendix N, outlines the level computation algorithm that has been implemented in VEGA. The level information is then used by VEGA to create an initial mapping script that processes all modules in bottom-up order, a characterization script that processes all modules in top-down order, and a re-synthesis script that processes all modules in bottom-up order. The level value of modules computed by VEGA appears in synthesis hierarchy reports, and in all synthesis scripts as comments.

3. Trivial Process for Top-down Characterization

An obvious process to implement top-down characterization, that is referred to as "Trivial Process" in this disclosure, has also been published by Synopsys in the methodology note entitled "dc_shell scripts for synthesis" and dated August 1992.

Based on module level information, it consists in looping on level values, starting form the level value of the top-level minus 1, down to zero. At each iteration step, all modules that have a level equal to the current level value are characterized one at a time. This algorithm, Algorithm 2, is attached as Appendix O.

In Algorithm 2, all modules are characterized in the top-level context, i.e. Design Compiler's "current_design" is set to the top-level module. The top-level module itself is not characterized, but receives constraints that are propagated down to leaves through top-down characterization. So the algorithm starts from the maximum level value minus 1, that corresponds to the level value of modules that are located right under the top-level in the design hierarchy.

The Trivial Process described above could be implemented to create top-down characterization scripts. However, with the sizes of designs constantly increasing, the relative run-times of topdown characterization has progressively increased. With typical designs reaching or exceeding 300 kGates, top-down characterization can turn into a bottleneck in the overall turn-around-time of synthesis.

Table 2 presents results obtained for a design that includes 340 kGates plus RAMs, with 5 levels of hierarchy having 57 modules, a complexity that is considered today as medium size, using a Sun/Ultra-Il workstation. Each characterization run took about 40 hours, versus 35 hours for the initial mapping, and 11 to 16 hours for re-synthesis based on characterization data. Characterization was run 3 times, taking a total time of about 119 hours out of 185 hours for the overall process (about 65%).

TABLE 2

Example of run times using the Trivial Process for top-down characterization.

| STEP | CPU-TIME (HOURS) for Sun-Ultra-II |
|---|---|
| Initial Mapping | 35:34 |
| Characterization of initial mapping | 39:14 |
| Re-synthesis step #1 | 15:51 |
| Characterization of re-synthesis #1 | 40:37 |
| Re-synthesis step #2 | 11:07 |
| Characterization of re-synthesis #2 | 39:02 |
| Reporting | 3:43 |
| TOTAL | 185:08 |

4. Fast Process for Top-down Characterization

The run time needed to characterize a list of instances is much shorter that the time needed to characterize all the instances on the list one by one. In other words, a single "characterize" command that processes N instances at once is much faster than N "characterize" commands that characterize one instance at a time.

This characteristics of the "characterize" command is not documented in Design Compiler's Reference Manual. It is likely that the "characterize" command requires some preparation work, that involves a significant computing effort, before actually calculating attributes that are set on I/O ports of the characterized module. Therefore, when several instances are characterized at once, the preparation work is done only once for all the instances, and the average characterization time of each instance gets reduced.

An attempt to find mentions of this behavior of the "characterize" command in Synopsys' documentation, including Design Compiler's Reference Manual and User Manual, Methodology Notes, and Synthesis Guidelines was unfruitful.

As for run times differences, no documentation was found on potential differences in terms of characterization results. Here again, experiments were used, and showed that characterizing N instances one by one in a given order produces the same characterization results as using a single "characterize" command applied to a list that includes the same instances in the same order.

In order to take advantage of faster run times of "characterize" when applied to a list of instances, the following technique is developed and implemented in VEGA for top-down characterization: Instances to be used for the characterization of all modules, except the top-level, are inserted on a single list. Instances of modules with a level equal to the maximum level value minus 1 are inserted first, in any order. Then instances of modules with a level equal to the maximum level value minus 2 are appended to the end of the list, etc. The list that is finally obtained contains instances for all the modules to be characterized, except the top-level, that are sorted in top-down order based on level values.

A single "characterize" command is used, that processes the list of all module instances sorted in top-down order.

The characterization data, that has been set as attributes on I/O ports of modules that were characterized, is written out.

Algorithm 3, attached as Appendix P, outlines this process, that is referred to as "Fast Process" further in this disclosure. In the implementation of this algorithm that has been made in VEGA, the loop that writes out scripts containing the characterization data for each module has been unrolled, so that customization of the top-down characterization script is facilitated. As already discussed, before writing out the characterization data for a module, the top-down characterization script searches for a script named "<design-name>_overwrite_charac.scr". If such a script is found in Design Compiler's search path, it gets included. This mechanism is available to users to customize characterization, through overwriting the data that is written out on a module basis. A complete example of top-down characterization script is available in Appendix Q1. Another example of a characterization script is attached as Appendix Q2.

5. Run Times of Fast Process vs. Trivial Process

Experiments run on a number of designs with complexities ranging from 50 kGates to 350 kGates showed a 8x to 15x improvement factor in run times of top-down characterization when using the Fast Process that is based on a single "characterize" command, instead of the Trivial Process that characterizes one module at a time. Table 3, below, shows comparative run times of the Trivial Process and Fast Process for three designs, that can be considered as typical. All times were obtained on a Sun/Ultra-II workstation.

TABLE 3

Compared run times of Trivial Process and Fast Process

| DESIGN | TRIVIAL PROCESS CPU-Time (Hours) | FAST PROCESS CPU-Time (Hours) | IMPROVEMENT FACTOR |
|---|---|---|---|
| 340 kGATES + RAMs 3 levels of hierarchy 57 modules | 39:14 | 4:31 | 8.7x |
| 147 kGATES + RAMS 5 levels of hierarchy 43 modules | 37:58 | 2:58 | 12.8x |
| 90 kGATES + RAMs 3 levels of hierarchy 18 modules | 11:50 | 0:48 | 14.8x |

Table 4, below, gives run-times obtained with the Fast Process for the same design and the same synthesis steps as in Table 2 with the same IC design on the same Sun Ultra-II computer. Compared to results of Table 1 obtained with the Trivial Process, the three characterization steps now take about 14 hours out of 80 hours for the overall synthesis process (about 17% vs. 65% with the Trivial Process). Clearly, top-down characterization as now implemented in VEGA using the Fast Process is no longer a run-time bottleneck.

TABLE 4

Example of run times using the Fast Process for top-down characterization (same design as Table 2).

| STEP | CPU-TIME (HOURS) |
|---|---|
| Initial Mapping | 35:34 |
| Characterization of initial mapping | 4:31 |
| Re-synthesis step #1 | 15:51 |
| Characterization of re-synthesis #1 | 4:45 |
| Re-synthesis step #2 | 11:07 |
| Characterization of re-synthesis #2 | 4:16 |
| Reporting | 3:43 |
| TOTAL | 79:47 |

The benefits of the technique that has been described to optimize the run times of top-down characterization are quite obvious. The overall turn-around-time of synthesis is reduced. More characterization/re-synthesis passes can be run in the same amount of time, thus increasing the level of optimization of designs. The overall synthesis methodology, based on an initial mapping and several passes of characterization/re-synthesis, is more easily accepted by users, including both LSI Logic designers and customers.

Characterization is used to feedback physical data into synthesis, and re-synthesize or re-optimize the design so that the physical implementation is taken into account. Therefore, the availability of efficient techniques for top-down characterization is particularly important with regards to the acceptance of the flow by customers and the overall turn-around-time to meet timing.

J. HANDLING DESIGNWARE COMPONENTS IN SYNTHESIS SCRIPT FOR SYNOPSYS DESIGN COMPILER

In the Synopsys terminology, DesignWare Components are pieces of "structured logic", like adders, comparators and multipliers, that are synthesized using pre-defined structures rather than general-purpose techniques. For example, adders can be implemented using a Ripple-Carry structure to achieve a low gate count, or a Carry-Look-Ahead structure to achieve a high performance. This section of the present invention disclosure details the techniques used by the VEGA system for handling of the DesignWare Components in synthesis scripts creation.

1. Synthesis Methodology and Script Flow

As discussed in detail, the synthesis methodology that is implemented in scripts created by VEGA is based on the following steps:

The RTL code is first mapped to the target technology. Modules are synthesized in bottom-order, using default constraints that are set on their I/O ports. Once a module is synthesized, a "dont_touch" attribute is set on it, so that it gets handled as a non-modifiable cell at upper levels. This first step is referred to as the "initial mapping".

Following the initial mapping, characterization is used to capture actual constraints on I/O ports of modules, based on the netlist that was created by the initial mapping. Synthesis constraints are set on the top-level module, and derived down to leaves through characterizing all modules in top-down order.

Modules are re-synthesized using the module I/O constraints derived by top-down characterization. As for the initial mapping, modules are synthesized in bottom-up order, and a "dont_touch" attribute is set on each module after it is synthesized.

The above steps, characterization/re-synthesis process, are iterated until all constraints are met, and the gate count is stable.

These steps in the synthesis methodology are illustrated by a flowchart of FIG. 27. VEGA creates the following scripts to implement this synthesis methodology:

Script "<top-level-name>_inimap.scr" performs the initial mapping.

Script "<top-level-name>_charac.scr" performs top-down characterization based on a given implementation of the design in the target technology, and on constraints set on the top-level module.

Script "<top-level-name>_recomp.scr" performs bottom-up re-synthesis based on characterization data.

Script "<top-level-name>_report.scr" runs Design Compiler reporting commands on a given implementation of the design to obtain reports on area, used cells, timing and violated design rules and constraints.

Script "<top-level-name>_global.scr" implements the entire process, including initial mapping, several passes of characterization and re-synthesis, and reporting.

A "dc_shell" variable named "step", that has to be set by the user before calling scripts that make use of it, is used to control iterations through the characterization and re-synthesis loop. Names of files are based on the value of "step", so that scripts can save and retrieve them properly. For example, file "<top-level-name>_comp2.db" is the Synopsys DB file (database binary format) created at the second step of re-synthesis.

2. Definition of DesignWare Components

When implementing RTL code to a target technology, some operators translate to specific hardware, that is usually referred to as "structured logic". For example, when using Verilog-HDL:

'+' operators translate to adders.

'−' operators translate to subtractors.

'*' operators translate to multipliers.

'—' and '!=' operators translate to equality comparators.

'==', '>', '<=' and '>=' operators translate to magnitude comparators.

General-purpose algorithms, like 2-level minimization and factorization, are not appropriate for synthesizing structured logic. Specific structures, that are also referred to as "micro-architectures", like the Ripple-Carry structure and the Carry-Look-Ahead structure for adders, are much more efficient. Therefore, logic synthesis tools use knowledge of efficient structures to implement structured logic, and only use general-purpose algorithms to implement random logic like state machines.

Synopsys refers to structured logic units as "DesignWare Components". Design Compiler uses libraries that are referred to as "Synthetic Libraries" to store knowledge of efficient structures to be used to implement DesignWare Components. Trial runs are used by Design Compiler to evaluate the area and speed performance of structures in the target technology, and are saved for further re-use under a directory that is referred to as "Synopsys Cache".

Note that DesignWare Components are not limited to arithmetic logic, like adders, substractors and multipliers. Design Compiler also handles other types of modules like DesignWare Components, in particular multiplexer trees and structures developed by users using the GTECH library. Also, DesignWare Components can either be inferred from operators in the RTL code, or explicitly instantiated in the RTL code.

3. Initial Mapping of DesignWare Components

During the initial mapping, Design Compiler uses the following two-step process to implement RTL code to a target technology:

1. The "elaborate" command translates the RTL code to a generic netlist, i.e. a netlist that instantiates abstract cells that do not belong to any particular technology library.
2. The "compile" command optimizes the generic netlist using resource sharing and boolean/algebraic optimization, then maps it to the target technology library based on constraints and design rules that are specified by the user.

When translating the RTL code to a generic netlist, Design Compiler represents DesignWare Components as generic cells, like adders, substractors and multipliers. Only the type of components and the width of inputs/outputs are decided at that stage. For example, Design Compiler represents an unsigned adder with 8-bit and 12-bit operands and a 12-bit result as an instance of a generic component named "ADD_UNS_8_12_12".

When optimizing and mapping the generic netlist, Design Compiler performs the following operations on DesignWare Components:

Resource sharing algorithms are used to share DesignWare Components and minimize the amount of logic as much as possible, based on timing constraints. For example, an adder and a subtractor can get merged together into a single adder/subtractor.

New modules, that do not appear in the RTL code, are created to encapsulate the logic that implements DesignWare Components. Generic cells that represent DesignWare Components in the generic netlist are transformed to instances of new modules, that contain DesignWare logic.

The structure used to implement each DesignWare Component is selected, based on timing constraints. For example, for an adder, a Ripple-Carry structure or a Carry-Look-Ahead structure will be selected. Design Compiler makes use of trial runs, that are saved in the "Synopsys Cache" disk area, to select the most appropriate structure.

Note that some DesignWare Components are not encapsulated into a new module, but are directly translated to gates that are merged with surrounding logic. In particular, this is the case when there is a unique structure that is always the most efficient one, from both the area and timing standpoints of view. For example, equality comparators. Also, this is the case when the amount of logic involved is very low. For example, adders that have less than 4 bits.

4. Revision of DesignWare Components Structures

As described above, when RTL code is mapped to a target technology, DesignWare logic is encapsulated into new modules that are created by Design Compiler. A structure is also selected to implement each DesignWare Component, based on user's constraints and design rules. If the netlist obtained after mapping the RTL code to a target technology is re-loaded into Design Compiler and re-synthesized, and if constraints have evolved or were not met, Design Compiler is capable of revising the structure that was selected to implement DesignWare Components.

This is a particularly important feature in the context of the synthesis methodology implemented in VEGA, that is based on an initial mapping followed by several passes of characterization and re-synthesis. The initial mapping relies on default constraints, that are set on I/O ports of modules. Characterization is then used to capture actual constraints on I/O ports of modules, based on the netlist created by the initial mapping. So constraints that were defined for the initial mapping get refined through the first step of characterization, and are used for the first pass of re-synthesis. At the second step of characterization, constraints get refmed again based on the netlist created by the first re-synthesis step, and are applied for the second step of re-synthesis, etc.

Thus, constraints evolve throughout the synthesis process. In particular, if default constraints set for the initial mapping are not appropriate, some significant constraint changes can occur. Therefore, the ability of Design Compiler to revise the structures of DesignWare Components selected during the initial mapping is a very important feature, that is potentially key in meeting timing constraints and minimizing the final gate count.

5. Ungrouping DesignWare Components

In a large number of cases, the amount of logic contained in new modules created by Design Compiler to encapsulate DesignWare Components is relatively low compared to the average size of modules that are used as "synthesis units", i.e. that are synthesized at once. Typically, synthesis units of 5,000 to 10,000 gates are used, while the complexity of DesignWare Components ranges from less than 100 Gates to 1,000 gates (a 32-bit Carry-Look-Ahead adder is about 900 Gates).

DesignWare modules also often have unused I/O ports, that are needed only for more general applications. For example, if an adder is modeled in RTL with no Carry-In and no Carry-Out, Design Compiler encapsulates the adder logic in a module that has a "CI" input port and a "CO" output port. At the level where the adder module is instantiated, the "CI" port is tied to zero, and the "CO" port is left unconnected. Inside the adder module, both ports are left unconnected.

Therefore, designers often prefer to dissolve DesignWare modules created by Design Compiler so that they no longer appear in the final netlist. The logic encapsulated in DesignWare modules gets merged with surrounding logic, and unused I/O ports disappear. Design Compiler's "ungroup" command is available to users to dissolve DesignWare modules, like any other hierarchical cells.

It is essential to observe that the structure of a DesignWare Component can no longer be revised by Design Compiler as soon as the module that was created to encapsulate its logic is ungrouped. Following the ungrouping, the "boundaries" of the DesignWare logic are lost, and Design Compiler cannot identify the DesignWare Component any more.

6. Strategy for DesignWare Components Handling

In the context of a synthesis methodology based on an initial mapping followed by several passes of characterization and re-synthesis, a strategy to handle DesignWare Components has to fulfill the following requirements:

DesignWare Components should be left encapsulated in their own modules created by Design Compiler as long as there is a potential need for revising their structures. As described above, structures are first selected during the initial mapping, based on default constraints that are set on I/O ports of modules. Constraints then get refined and re-applied throughout successive characterization and re-synthesis passes. Following constraints evolution, Design Compiler is capable of revising the structures of Design-Ware Components, provided they are still encapsulated in their own modules.

DesignWare Components should be "ungroupable" when there is no more need to revise their structures, so that new modules that were created by Design Compiler to encapsulate DesignWare logic can be removed from the final netlist.

After DesignWare Components are ungrouped, it should be possible to optimize the netlist through a re-synthesis pass. When ungrouping a DesignWare Component, the logic that was previously contained in the DesignWare module is brought one level up. This can create new optimization opportunities, that can be exploited through an additional pass of synthesis.

In order to meet those requirements, synthesis scripts created by VEGA handle DesignWare Components as follows:

DesignWare Components can be ungrouped during re-synthesis only. New modules created by Design Compiler to encapsulate DesignWare logic are always retained by the initial mapping script.

The ungrouping of DesignWare Components in the re-compilation script is controlled by a "dc_shell" boolean variable named "ungroup_designware", that has to be set by the user before calling the re-synthesis script (similar to the "step" variable). When the variable is set to "true", Design-Ware components are ungrouped, and the modules that contain them no longer appear in the netlist obtained after running the re-synthesis script. So the ungrouping of DesignWare Components is fully under the control of users of VEGA scripts.

The ungrouping of DesignWare components is performed in the re-synthesis script through using the "ungroup" attribute that is provided by Design Compiler. Before re-synthesizing a module, an "ungroup" attribute is set on all the DesignWare Components that are instantiated in this module. Then, when the "compile" command is issued on the module, Design Compiler first ungroups the DesignWare Components, then re-synthesizes the netlist. The advantage of this technique is that the DesignWare Components are ungrouped and the netlist is re-optimized in a single re-synthesis run. New optimization opportunities that can be created when freeing up the DesignWare logic are immediately exploited. A sample ungroup script is attached as Appendix W.

7. Calling the Re-synthesis Script

As an example, assume that a user of VEGA scripts wants to ungroup DesignWare Components when running the second re-synthesis step of a design named "core", and also assume that characterization has already been run. Then the user will call the re-synthesis script as follows:

dc_shell
dc_shell> step 2
Warning: Defining new variable 'step'
dc_shell> ungroup_designware="true"
Warning: Defining new variable 'ungroup_designware'
dc_shell> include core_recomp.scr
. . . etc . . .

If the variable "ungroup_designware" is not set when the user calls the re-synthesis script, an error message is issued, and the script terminates immediately.

8. Ungrouping DesignWare Components in the Re-synthesis Script

DesignWare Components are ungrouped on a module basis in the re-synthesis script. For each module to be re-synthesized, an "ungroup" attribute is set on all Design-Ware Components that are instantiated in the module, if any, before issuing the "compile" command that re-synthesizes the module. This solution was preferred to a single loop on all modules in order to facilitate customization of the re-synthesis script by users.

VEGA uses the design knowledge it extracts from RTL code to insert DesignWare ungrouping commands only in modules that do contain DesignWare Components. As described above, some DesignWare Components are not encapsulated in a new module by Design Compiler, for example because their complexity is low or because there is a unique structure that is always the most efficient implementation. So when a module includes DesignWare Components, the re-synthesis script created by VEGA always checks that DesignWare modules are actually found before setting an "ungroup" attribute on them.

Re-synthesis scripts created by VEGA use Design Compiler's naming conventions to retrieve DesignWare modules. For example, the names of DesignWare modules that are instantiated in a module named "controller" and that use structures of the Synthetic Library "DW01" are all prefixed with the string "controller_DW01_". In general, Synopsys Synthetic Libraries are named "DW01", "DW02", "DW03", etc. So the re-synthesis script searches for modules named "controller_DW*" to find DesignWare Components.

The following "dc_shell" script excerpt sets an "ungroup" attribute on all DesignWare Components that are instantiated in a module named "controller":

```
/* Set ungroup attribute on DesignWare Components */
if (ungroup_DesignWare == "true") {
    suppress_errors = suppress_errors + {UID-95}
    find (reference, "controller_DW*")
    reference_list = dc_shell_status
    if (reference_list != {}) {
        set_ungroup reference_list
    }
    suppress_errors = suppress_errors - {UID-95}
}
```

The "suppress_error" command is used to avoid Design Compiler errors when searching for DesignWare modules with the "find" command, in case the DesignWare Components used in the module were not encapsulated in new modules.

Note that Design Compiler sets a pre-defined attribute named "is_nmodule" on each module that it creates to encapsulate DesignWare logic. Synopsys recommends the use of this attribute to find DesignWare modules (Solvit database). Experience shows that the "is_nmodule" attribute is actually saved when writing out a Design Compiler design as a DB file, which is the Synopsys binary format. But it is lost when writing out a design as a netlist, for example a Verilog-HDL netlist. Therefore naming rules were preferred to find DesignWare Components, because there are no such limitations.

A complete example of re-synthesis script is given in Appendix A. Note the setting of the "ungroup" attribute on DesignWare Components in modules "sorter", "accum", "sub_score", "rbrams", "rbramd", "controller", and "pix_buff". Other modules do not include any DesignWare Component.

9. Global Flow Script and "VEGA_synthesis.setup" File

The global flow script created by VEGA runs the entire synthesis process, including the initial mapping, several passes of characterization and re-synthesis, and reporting.

The global script calls the initial mapping script, the characterization script, the re-synthesis script, and the reporting script. It properly sets the "dc_shell" variables that are required:

The "step" variable used by the characterization script, the re-synthesis script, and the reporting script.

The "ungroup_designware" variable used by the re-synthesis script.

Examples of global flow scripts are given in Appendices S1 and S2. Note that DesignWare Components are ungrouped at the second and last re-synthesis step. An example of reporting script is given in Appendix U.

The creation of the global flow script is controlled through the "VEGA_synthesis.setup" file that is available to users to direct the generation of synthesis scripts. The following line controls the number of characterization and re-synthesis passes that have to be performed by the global flow script:

/* Number of characterization/recompilation steps */number_of_recompilation_steps=2

The following lines control whether DesignWare Components have to be ungrouped, and if yes, at which re-synthesis step:

/* Handling of DesignWare Components */ungroup_DesignWare="true" ungroup_DesignWare_at_recompilation step=2

A complete example of "VEGA_synthesis.setup" file can be found in Appendix H. A sample recompilation script is attached as Appendix X.

In summary, the correctly handling of the DesignWare components in the VEGA synthesis script generation process are as follows:

The structures used to implement DesignWare Components can be revised throughout the optimization process that consists in successive passes of characterization and re-synthesis, following the evolution of constraints on I/O ports of modules.

New modules created by Design Compiler to encapsulate DesignWare Components can be removed from the final netlist, and unused ports of DesignWare modules can be "cleaned up"; and Optimization opportunities created when freeing up the logic contained in DesignWare modules can be exploited by Design Compiler.

K. BUFFERING TREE ANALYSIS USING VEGA TECHNIQUE

After designs are mapped to a target technology, nets that have high fanout must be buffered properly. For this purpose, the present invention incorporates the use of "buffering trees". An example of a buffering tree is included in the design represented FIG. 44. The root of the tree is the input port CLK 790, which is referred to as the "source pin". Leaves of the tree are the clock input pins of flipflops Q0 792*a* to Q5 792*f*, which are referred to as the "terminal pins". The tree is built using buffers B0 794 and B1 796 and inverters I0 798 and I1 800.

Buffering trees are generally constructed in such a way that technology constraints, referred to as "design rules", are met. Such design rules include, for example, the following:

1. A rule that no buffer and inverter in a buffering tree can drive a load that is greater than a certain value, referred to as "maximum capacitance". The maximum capacitance depends on the type of buffer or inverter utilized.

2. A rule that no buffer and inverter in a buffering tree can drive more input pins than a certain value, referred to as "maximum fanout".

Therefore, at each stage of a buffering tree, input pins that have to be driven are partitioned and buffers/inverters must be selected in such a way that maximum capacitance and maximum fanout constraints are satisfied.

Heavily loaded nets in a design typically include clock nets, reset nets, scan enable nets, and some functional nets. For clock nets, buffering trees have to be designed in such a way that the values of signal skew at terminal pins are within a given range. Such buffering trees are referred to as "balanced clock trees", and are generally created using specific tools like LSI Logic's BCT Compiler. Like any other buffering trees, balanced clock trees generally must meet design rules.

Other types of nets are usually buffered through logic synthesis. Design rules are supported by logic synthesis tools that give them a higher priority than timing constraints like clock periods. In some cases and for various reasons, balanced clock trees can be used for other nets than clock nets.

The present invention includes methods for effectively extracting and reporting information related to nets in designs that are mapped to a technology, either entirely or partially. Algorithms for the analysis of logic that includes buffering trees are included therein.

Consider again FIG. 44. CLK 790 is connected to the clock input pins of flipflops Q0 792*a* to Q5 792*f*, through a buffering tree built with inverters I0 798, I1 800 and buffers B0 794 and B1 796. From the functional prospective, CLK 790 is a clock port that controls flipflops Q0 792*a* to Q5 792*f*.

Assume that the clock pins of flipflops Q0 792*a* to Q5 792*f* are all active on the rising edge. Starting from CLK 790, Q0, Q1 and Q2 are reached through two inverters and one buffer. Therefore, Q0 792*a*, Q1 792*b* and Q2 792*e* are clocked on active edges of the signal applied to port CLK 790. Q3 792*d* and Q4 792*e* are reached through one inverter and one buffer, and Q5 792*f* is reached through one inverter. Therefore, Q3 792*d*, Q4 792*e* and Q5 792*f* are clocked on falling edges of the signal applied to CLK 790.

As discussed above, a clock net can be defined as a net that connects to one of several "clock input pins" that can be clock input pins of flipflops, enable pins of latches, and clock input pins of synchronous RAMs. This definition works well in generic designs that do not include any buffer and use inverters only for functional modeling. But when applied to the mapped design of FIG. 44, the following clock sources are obtained:

1. Output pin Z0 of buffer B0 794, connected to clock input pins of flipflops Q0 792*a*, Q1 792*b* and Q2 792*c*.

2. Output pin Z1 of buffer B1 796, connected to clock input pins of flipflops Q3 792*d* and Q4 792*e*.

3. Output pin Z2 of inverter I0 798, connected to the clock input pin of flipflop Q5 792*f*.

For a circuit designer, those clock sources are not necessarily relevant. The important pieces of information to the designer include the following:

1. The design has only one clock signal, that is the input port 'CLK' 790.
2. Flipflops Q0 792*a*, Q1 792*b* and Q2 /792*c* are clocked on the rising edge.
3. Flipflops Q3 792*d*, Q4 792*e* and Q5 792*f* are clocked on the falling edge.
4. The fanout of port CLK 790, in terms of controlled flipflops, is equal to 6.

This view of the clock signal of FIG. 44, which can be referred to as the "functional view",is easily accessed in a generic design. However, in a mapped design, it becomes "hidden" by buffering trees. This issue is typically encountered when analyzing clock nets and asynchronous reset nets in mapped designs, or in mapped pieces of generic designs.

Let us consider the design of FIG. 45. The input pins of flipflops Q0 810*a* to Q5 810*f* are driven by buffers B1 806 and B2 808. Said buffers have been connected "in parallel"; that is their outputs are shorted together. This technique is used sometimes, in particular to distribute clock signals, in order to increase the driving strength of available buffers. Net N 812 is driven by both the output pin Z1 of buffer B1 806 and the output pin Z2 of buffer B2 808. Therefore, Net N is a multiply-driven net.

Connecting cell outputs together is not allowed by LSI Logic's design rules, unless tristate buffers are used, but parallel buffers can be admitted under some circumstances. Therefore, identifying such logic constructs is an important piece of information. Analyzing the structure of buffering trees can be referred to as the "implementation view" of nets in mapped designs, or mapped pieces of generic designs.

From the functional stand point, multiply-driven nets and parallel buffers in buffering trees are obviously not relevant. For the example of FIG. 45, the functional information is that CLK 802 is a clock port, that clocks on flipflops Q0 810*a* to Q5 810*f* on the rising edge. The design examples that have been described above clearly illustrate that the analysis of mapped designs, either fully or partially, can involve different approaches. These include a function approach.

In a functional approach, only the source pin and the terminal pins of buffering trees are of interest, together with the polarity relationship at each terminal pin relative to the source pin (non-inverting or inverting), and the fanout of the source pin in terms of controlled terminal pins.

In an implementation approach, the internal structure of buffering trees is the main interest. In particular, parallel buffers should be captured.

Also, algorithms can be utilized for the analysis of buffering trees. Algorithm 4, attached as Appendix Y1, outlines an algorithm for extracting the source of a net in a design that is mapped to a target technology, either fully or partially. The algorithm starts from the net connected to a terminal pin, like a clock input pin of a flipflop when extracting clock sources, and is controlled by the "functional_view" boolean variable. If "functional view" is not set, the algorithm just returns the terminal pin that drives the net locally. This is the "implementation view" of the net. If "functional_view" is set, the algorithm traverses mapped buffers and inverters recursively. If the current net is driven by the output pin of a mapped buffer or inverter, the search continues from the net that is connected to the input pin of the buffer or inverter, until an input port on the top level is reached, or a net that is not driven by a mapped buffer or inverter is reached. This is the "functional view" of the net.

Algorithm 5, attached as Appendix Y2, outlines an algorithm that computes the fanout of a given pin or port. Similarly to Algorithm 4, it traverses mapped buffers and inverters recursively when variable "functional_view" is set, and compute the functional fanout, that is the number of controlled terminal pins. When "functional_view" is not set, it just computes the implementation fanout, that is the number of connected input pins.

Algorithm 6, attached as Appendix Y3, can be used to determine active edges for clock signals, and active levels for latch enable signals, asynchronous reset signals and RAM write enable signals. When "functional_view" is set, it determines the polarity of a terminal pin (non-inverting or inverting) relatively to the source pin that controls it from the functional standpoint. Similarly to Algorithm 4 and Algorithm 5, it traverses mapped buffers and inverters recursively. When variable "functional_view" is not set, it just returns the polarity of the terminal pin itself.

Note that all those algorithms work correctly for generic designs, fully mapped designs, and partially mapped designs.

L. DESIGN SYSTEM ENVIRONMENT

Generally, the methods described herein with respect to IC design and analysis will be practiced with a general purpose computer, either with a single processor or multiple processors. Generally, RTL code will be supplied. The particular analysis and extraction employed will then be performed by a general purpose computer. Then the RTL code maintained on said general purpose computer may be changed by the designer in accordance with the output of the RTL level analysis performed in accordance with the present invention.

Figure 46:
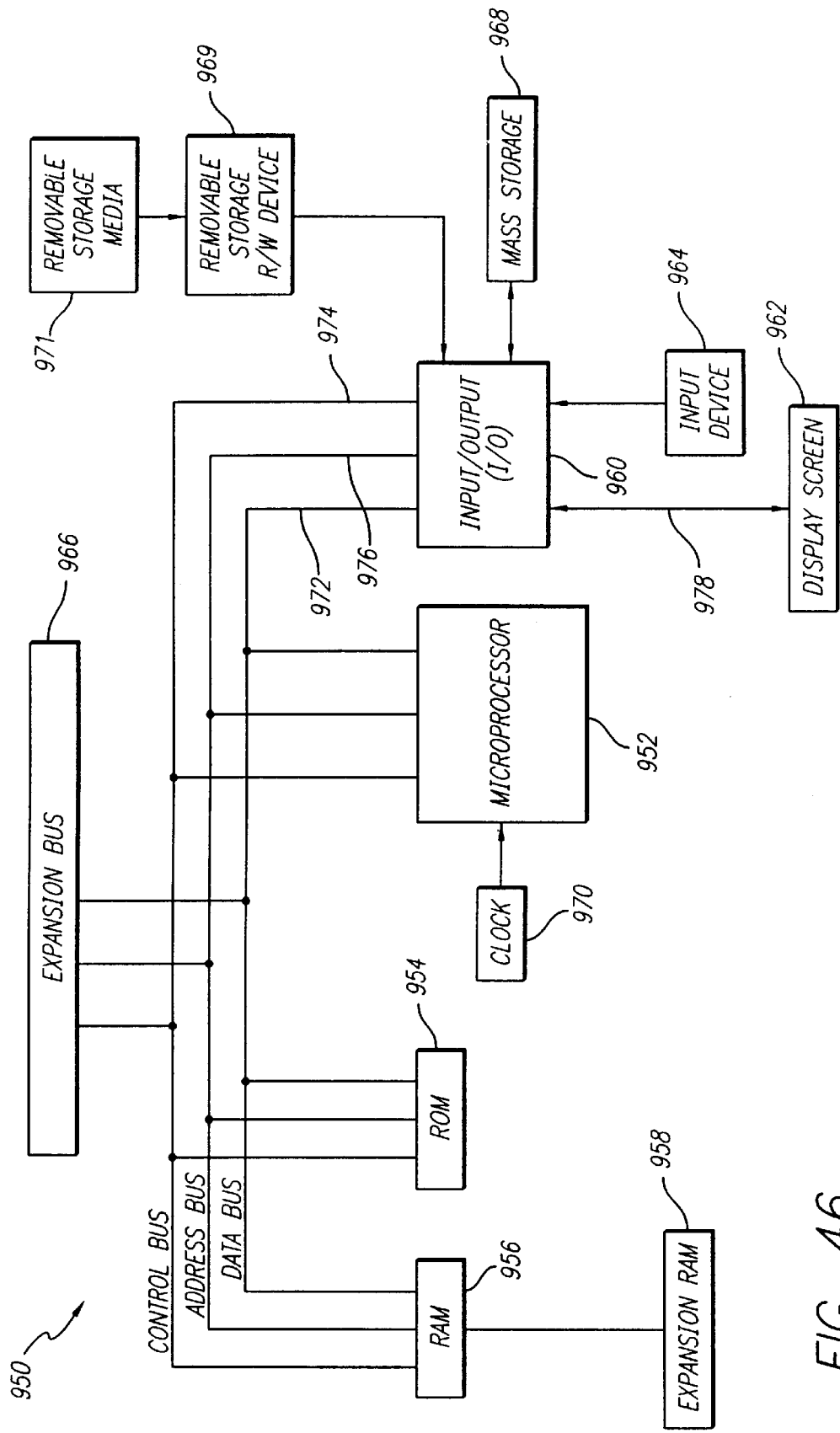
FIG. 46 illustrates the environment in which the present invention generally is operated and practiced.

FIG. 46 is an illustration of a general purpose computer system, representing one of many suitable computer platforms for implementing the inventive RTL level extraction and analysis methods described above. FIG. 46 shows a general purpose computer system 950 in accordance with the present invention includes a central processing unit (CPU) 952, read only memory (ROM) 954, random access memory (RAM) 956, expansion RAM 958, input/output (I/O) circuitry 960, display assembly 962, input device 964, and expansion bus 966. Computer system 950 may also optionally include a mass storage unit 968 such as a disk drive unit or nonvolatile memory such as flash memory and a real-time clock 970.

CPU 952 is coupled to ROM 954 by a data bus 972, control bus 974, and address bus 976. ROM 954 contains the basic operating system for the computer system 950. CPU 952 is also connected to RAM 956 by busses 972, 974, and 976. Expansion RAM 958 is optionally coupled to RAM 956 for use by CPU 952. CPU 952 is also coupled to the I/O circuitry 960 by data bus 972, control bus 974, and address bus 976 to permit data transfers with peripheral devices.

I/O circuitry 960 typically includes a number of latches, registers and direct memory access (DMA) controllers. The purpose of I/O circuitry 960 is to provide an interface between CPU 952 and such peripheral devices as display assembly 962, input device 964, and mass storage 968.

Display assembly 962 of computer system 950 is an output device coupled to I/O circuitry 960 by a data bus 978. Display assembly 962 receives data from I/O circuitry 960 via bus 978 and displays that data on a suitable screen.

The screen for display assembly 962 can be a device that uses a cathode-ray tube (CRT), liquid crystal display (LCD), or the like, of the types commercially available from a variety of manufacturers. Input device 964 can be a keyboard, a mouse, a stylus working in cooperation with a position-sensing display, or the like. The aforementioned input devices are available from a variety of vendors and are well known in the art.

Some type of mass storage 968 is generally considered desirable. However, mass storage 968 can be eliminated by providing a sufficient mount of RAM 956 and expansion RAM 958 to store user application programs and data. In that case, RAMs 956 and 958 can optionally be provided with a backup battery to prevent the loss of data even when computer system 950 is turned off. However, it is generally desirable to have some type of long term mass storage 968 such as a commercially available hard disk drive, nonvolatile memory such as flash memory, battery backed RAM, PC-data cards, or the like.

A removable storage read/write device 969 may be coupled to I/O circuitry 960 to read from and to write to a removable storage media 971. Removable storage media 971 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 950 by typing on a keyboard, manipulating a mouse or trackball, or "writing" on a tablet or on position-sensing screen of display assembly 962. CPU 952 then processes the data under control of an operating system and an application program stored in ROM 954 and/or RAM 956. CPU 952 then typically produces data which is outputted to the display assembly 962 to produce appropriate images on its screen.

Expansion bus 966 is coupled to data bus 972, control bus 974, and address bus 976. Expansion bus 966 provides extra ports to couple devices such as network interface circuits, modems, display switches, microphones, speakers, etc. to CPU 952. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

M. FABRICATION

After the initial circuit description is synthesized as discussed above, additional steps must be taken to complete the manufacture of the IC. These additional steps are very well known by thosed skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

An exemplary integrated circuit chip is illustrated in FIG. 47 and generally designated by the reference numeral 826. The circuit 826 includes a semiconductor substrate 826A on which are formed a number of functional circuit blocks that can have different sizes and shapes. Some are relatively large, such as a central processing unit (CPU) 827, a read-only memory (ROM) 828, a clock/timing unit 829, one or more random access memories (RAM) 830 and an input/output (I/O) interface unit 831. These blocks, commonly known as macroblocks, can be considered as modules for use in various circuit designs, and are represented as standard designs in circuit libraries.

The integrated circuit 826 further comprises a large number, which can be tens of thousands, hundreds of thousands or even millions or more of small cells 832. Each cell 832 represents a single logic element, such as a gate, or several logic elements interconnected in a standardized manner to perform a specific function. Cells that consist of two or more interconnected gates or logic elements are also available as standard modules in circuit libraries.

The cells 832 and the other elements of the circuit 826 described above are interconnected or routed in accordance with the logical design of the circuit to provide the desired functionality. Although not visible in the drawing, the various elements of the circuit 826 are interconnected by electrically conductive lines or traces that are routed, for example, through vertical channels 833 and horizontal channels 834 that run between the cells 832.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing. The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A method of designing an integrated circuit chip (IC), said method comprising the steps of:

obtaining a definition of the IC in RTL code;

translating said RTL code into a generic netlist description;

generating a logic synthesis tool script based on said generic netlist description;

executing said logic synthesis tool script to synthesize the RTL code.

2. The method according to claim 1 wherein said step of generating a logic synthesis tool script comprises the steps of:

identifying hardware elements and structure of the IC;

determining interrelationships between said identified hardware elements and structure; and generating the logic synthesis tool script to synthesize said identified hardware elements to netlists as a function of said hardware elements and said interrelationships.

3. The method according to claim 2 wherein said generated logic synthesis tool script comprises logic synthesis tool commands to perform following operations:

library customization;

hierarchy ungrouping of modules included within an IC design;

initial mapping of the IC design;

characterization of each module included within the IC design; and re-synthesis of the IC design.

4. The method according to claim 3 wherein said generated logic synthesis tool script further comprises a command to synthesize each module included within the IC design.

5. The method according to claim 2 further comprising analysis and detection of predetermined configurations of hardware.

6. A method of generating instructions for a logic synthesis tool to synthesize an integrated circuit chip (IC) design to a gate-level description of the IC design, said method comprising the steps of:

identifying hardware elements and structure of the IC design;

determining interrelationships between said identified hardware elements and structure; and generating a logic synthesis tool script as a function of said hardware elements and said interrelationships.

7. An apparatus for designing an integrated circuit chip (IC), said apparatus comprising:

means for obtaining a definition of the IC in RTL code;

means for translating said RTL code into a generic netlist description;

means for generating logic synthesis tool scripts based on said generic netlist description;

means for executing said logic synthesis tool scripts to synthesize the RTL code.

8. An apparatus for generating instructions for a logic synthesis tool to synthesize an integrated circuit chip (IC) design to a gate-level description of the IC design, said apparatus comprising:

means for identifying hardware elements and structure of the IC design;

means for determining interrelationships between said identified hardware elements and structure; and means for generating a logic synthesis tool script as a function of said hardware elements and said interrelationships.

9. A computer storage medium having encoded thereon instructions for a computer processor, comprising:

a computer encoded instruction for obtaining a definition of the IC in RTL code;

a computer encoded instruction for translating said RTL code into a generic netlist description;

a computer encoded instruction for generating logic synthesis tool scripts based on said generic netlist description;

a computer encoded instruction for executing said logic synthesis tool scripts to synthesize the RTL code.

10. A computer storage medium of claim 9 wherein said computer storage medium is selected from a group consisting of magnetic device, optical device, magneto-optical device, floppy diskette, CD-ROM, magnetic tape, computer hard drive, and memory card.

11. A computer storage medium having instructions thereon for generating instructions for a logic synthesis tool to synthesize an integrated circuit chip (IC) design to a gate-level description of the IC design, said computer storage device comprising:

a computer encoded instruction for identifying hardware elements and structure of the IC design;

a computer encoded instruction for determining interrelationships between said identified hardware elements and structure; and a computer encoded instruction for generating a logic synthesis tool script as a function of said hardware elements and said interrelationships.

12. A computer storage medium of claim 11 wherein said computer storage medium is selected from a group consisting of magnetic device, optical device, magneto-optical device, floppy diskette, CD-ROM, magnetic tape, computer hard drive, and memory card.

* * * * *